(12) United States Patent
Casto et al.

(10) Patent No.: US 7,406,388 B2
(45) Date of Patent: Jul. 29, 2008

(54) CALIBRATION PROCESS MANAGEMENT SYSTEM AND DATA STRUCTURE

(75) Inventors: Curtis V. Casto, Huntington Beach, CA (US); Kevin C. Sullivan, Anaheim, CA (US); Laurence E. Nielsen, Escondido, CA (US)

(73) Assignee: Southern California Edison, Rosemead, CA (US)

( * ) Notice: Subject to any disclaimer, the term of this patent is extended or adjusted under 35 U.S.C. 154(b) by 241 days.

(21) Appl. No.: 10/527,627

(22) PCT Filed: Sep. 11, 2003

(86) PCT No.: PCT/US03/28749

§ 371 (c)(1),
(2), (4) Date: Mar. 10, 2005

(87) PCT Pub. No.: WO2004/025415

PCT Pub. Date: Mar. 25, 2004

(65) Prior Publication Data

US 2006/0167643 A1    Jul. 27, 2006

Related U.S. Application Data

(60) Provisional application No. 60/410,678, filed on Sep. 13, 2002.

(51) Int. Cl.
*G01M 19/00* (2006.01)

(52) U.S. Cl. .......................................................... 702/85

(58) Field of Classification Search ..................... 702/85
See application file for complete search history.

(56) References Cited

U.S. PATENT DOCUMENTS

| | | | |
|---|---|---|---|
| 5,068,852 A | 11/1991 | Locke | |
| RE34,070 E | 9/1992 | Regimand | |
| 5,333,183 A | 7/1994 | Herbert | |
| 5,426,585 A | 6/1995 | Stepper et al. | |
| 5,434,971 A | 7/1995 | Lysakowski, Jr. | |
| 5,548,538 A | 8/1996 | Grace et al. | |
| 5,918,191 A * | 6/1999 | Patel | 702/84 |
| 6,064,948 A | 5/2000 | West et al. | |
| 6,230,106 B1 | 5/2001 | Metzger | |
| 6,397,378 B1 | 5/2002 | Grey et al. | |
| 2003/0193863 A1 * | 10/2003 | Su et al. | 369/47.51 |

\* cited by examiner

*Primary Examiner*—John E Barlow, Jr.
*Assistant Examiner*—Jonathan Moffat
(74) *Attorney, Agent, or Firm*—Robert J. Rose; Sheldon Mak Rose & Anderson PC

(57) ABSTRACT

A method for calibration process management of a calibration testing unit and a plurality of units under test, comprising configuring a user interface in communication with a calibration process management software system, configuring a communications link in communication with the software system, the software system capable of communicating with the calibration testing unit and the plurality of units under test, wherein the software system manages the user interface and the communications link in a manner permitting an operator to calibrate the plurality of units under test. Tracking of the calibrated units under test uses a permanent unique identifier and a dynamic unique identifier.

7 Claims, 40 Drawing Sheets

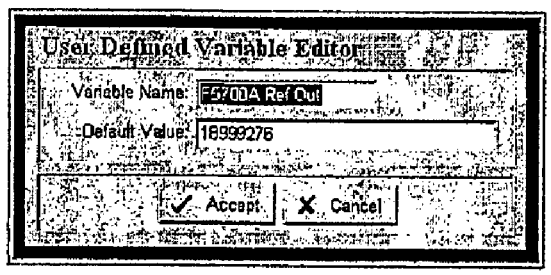
Figure 53
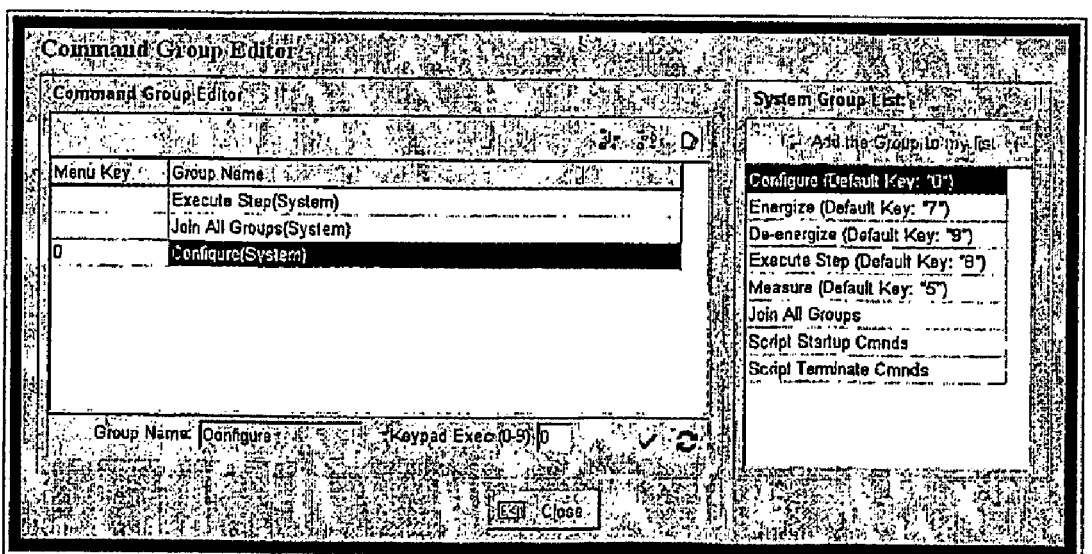
Figure 54
Figure 55

Calibration Report
Fluke 787 Process Meter

Test Number 372896
ID No. 8031008

Page 2 of 4

| STEP NUM | FUNCTION TESTED | NOMINAL VALUE | AS FOUND | AS LEFT | Out of Tol | CALIBRATION TOLERANCE |
|---|---|---|---|---|---|---|
| | DC Voltage 400.0 mV Range | 0.0 mV | 0.0 | | | -0.1 to 0.1 mV |
| | DC Voltage 400.0 mV Range | 390.0 mV | 390.0 | | | 389.6 to 390.4 mV |
| | 4.000 V Range | 1.000 V | 1.000 | | | 0.998 to 1.002 V |
| | | 2.000 V | 2.000 | | | 1.997 to 2.003 V |
| | | 3.000 V | 3.000 | | | 2.996 to 3.004 V |
| | | 3.900 V | 3.900 | | | 3.896 to 3.904 V |
| | 40.00 V Range | 39.00 V | 39.00 | | | 38.96 to 39.04 V |
| | 400.0 V Range | 390.0 V | 390.0 | | | 389.6 to 390.4 V |
| | 1000 V Range | 900 V | 900 | | | 899 to 901 V |
| | AC Voltage 400.0 mV Range 45 Hz | 380.0 mV | 378.4 | | | 375.1 to 384.9 mV |
| | AC Voltage 400.0 mV Range 60 Hz | 380.0 mV | 379.7 | | | 377.0 to 383.0 mV |
| | 500 Hz | 380.0 mV | 369.7 | | | 353.0 to 407.0 mV |
| | 4.000 V Range 45 Hz | 3.800 V | 3.784 | | | 3.751 to 3.849 V |
| | 60 Hz | 3.800 V | 3.794 | | | 3.770 to 3.830 V |
| | 500 Hz | 3.800 V | 3.692 | | | 3.530 to 4.070 V |
| | 40.00 V Range 45 Hz | 38.00 V | 37.84 | | | 37.51 to 38.49 V |

Remarks: Source document M007398.
1 year 18° to 28°C specifications.

ATTACHMENT 1
Page 1 of 3

*Fig. 83*

# US 7,406,388 B2

CALIBRATION PROCESS MANAGEMENT SYSTEM AND DATA STRUCTURE

RELATED APPLICATION

This application claims priority from International Application Number PCT/US03/28749, titled "Calibration Process Management System and Data Structure," filed 11 Sep. 2003, and also claims the benefit of U.S. Provisional Application Ser. No. 60/410,678, title "Calibration Process Management System and Data Structure" filed Sep. 13, 2002.

COPYRIGHT STATEMENT

A portion of the disclosure of this patent document, namely, the screen captures, contain material which is subject to copyright protection under applicable conventions and national law. The copyright owner has no objection to the facsimile reproduction by anyone of the patent document or the patent disclosure, as it appears in official patent office records, but otherwise reserves all copyrights whatsoever.

APPENDIX DATA

Appendix A is a list of abbreviations used in this specification and drawings.

Appendix B is a list of the menu options that are available in the Calibration Process Manager application's main page for one version.

Appendix C describes each of the commands available in the Calibration Process Manager and their parameters.

Appendix D describes the interface features of the Calibration Process Manager main page (data sheet designer mode).

Appendix E contains tables listing interface features.

BACKGROUND OF INVENTION

As business grows more reliant on high-technology, the need for accurate and precise calibration and measurement becomes more imperative than ever. It is desirable to have standards and measurements that are directly traceable to NIST, and to have calibration and test program meet the highest standards of government and industry. Metrology laboratories may also be accredited by such programs as the National Voluntary Laboratory Accreditation Program (NV-LAP).

A metrology laboratory might offer acceptance testing, calibration and repairs for instrumentation and standards in a wide array of discipline. Preferably, the metrology laboratory will issue certificates of calibration which can, when required, include as-found/as-left value and measurement uncertainties. A metrology laboratory may be able to calibrate equipment for measurement of temperature, humidity, mass, dimensional, pressure and vacuum, gas flow, force, torque, vibration, electrical, and time/frequency.

A metrology laboratory may also seek to provide complete calibration program management, including recall notification, interval management, reverse trace ability, procedure development, and records management.

A typical process for calibrating a unit under test ("UUT") for a specific calibration function, is to connect it to a known pre-calibrated source having greater accuracy than the UUT, and then lead a putative measurement on the UUT. At the option of the metrologist, the UUT may then be left as is, merely recording the as-found measurement against the reference output, or optionally adjusted so that the measurement on the UUT matches within appropriate limits the reference. It is possible to independently measure each range of a UUT against a standard, and record the as-found/as-left measurement.

The heart of the metrology laboratory calibration process is the calibration report, generally referred to a data sheet, of a UUT. Typically a data sheet resembles a spreadsheet, with rows containing range data, and columns representing fields. Data sheets may be constructed for specific manufacturer's equipment, for example a Flukes 787 process meter, which contain one row for every function of the UUT to be tested. Functions might include, for example, testing in different voltage ranges corresponding to different dial or switch settings on the UUT. Once a data sheet is determined for that particular make and model, e.g. the appropriate functions are identified and fixed, the data sheet may be saved as a template and can be reused for all UUTs of identical make and model.

In the prior art, a data sheet of calibration data for a particular UUT would typically be saved on an array data structure basis, with one or more identifier such as UUT serial number, ID number, test number, etc., serving as a database index field for the entire test of that UUT. This can be implemented in simple spreadsheet format that can be done by hand, or by using computerized spreadsheet programs such as Microsoft Excel®, or other available programs as will be known to those skilled in the art.

Data saved in an array structure, however, is difficult to maintain, and no easy solution exists for the identification of particular functions (e.g., individual rows in a data sheet) that may need re-calibration or different calibration intervals. Further, no easy solution exists for setting calibration intervals based upon drift analysis rather than failure based tolerance. Also, current data sheet based testing makes it difficult to tie standards to test points and calculate accuracy ratios for individual functions.

What is needed is a way to identify individual functions of a UUT, cross-link standards with these functions, and identify test points that may be problematic. Preferably, such a solution would optionally allow for simultaneous testing of like UUTs, and additionally optionally provide a comprehensive software tool that can augment a current system in place in an existing metrology laboratory, which simplifies and speeds up actual calibration process. Preferably this software tool would optionally perform multiple calibrations, reduce turn-around time, maintain a datasheet library, automate calibrations, calculate tolerances and analyze uncertainties.

SUMMARY OF INVENTION

The present invention meets this need by providing a way to identify individual functions of a UUT, cross-link standards with these functions, and identify test points that may be problematic. A method is disclosed for simultaneous testing of like UUTs, and a comprehensive software tool is described that can augment a current system in place in an existing metrology laboratory, which simplifies and speeds up actual calibration process. This software tool can perform multiple calibrations, reduce turnaround time, maintain a datasheet library, automate calibrations, calculate tolerances and analyze uncertainties.

A method for calibration process management of a calibration testing unit and a plurality of units under test is disclosed comprising configuring a user interface in communication with a calibration process management software system; configuring a communications link in communication with the software system, the software system capable of communicating with the calibration testing unit and the plurality of units under test; and wherein the software system manages the user interface and the communications link in a manner permitting an operator to calibrate the plurality of units under test.

Tracking of the calibrated units under test uses a permanent unique identifier and a dynamic unique identifier. Each permanent unique identifier is assigned when an object is created or altered in a manner that would make it unlinkable to its past usage, and each dynamic unique identifier is assigned any time the object is modified or saved.

A system for calibration process management of one or more than one unit under test (UUT), each UUT being an instance of a UUT equipment type is disclosed comprising a first computer readable medium 541 for storing one or more first data objects representing calibration data from the one or more than one UUT; a second computer readable medium 542 for storing a first globally unique identifier in an association relationship to one of the one or more first data objects; a third computer readable medium 543 for storing one or more second data objects representing a reference standard for the UUT equipment class; a fourth computer readable medium 544 for storing a second globally unique identifier in an association relationship to one of the one or more second data objects; a calibration management control program embodied on a fifth computer-readable medium 545 for calibration of the one or more than one UUT, the calibration management control program in communication with the first data objects, second data objects, first globally unique identifier and second globally unique identifier, and an application program interface embodied on a sixth computer-readable medium 546 for execution on a computer in conjunction with the calibration management control program.

The calibration management control program further optionally permits contemporaneous calibration of more than one UUT, and the application program interface is configured for contemporaneous calibration of more than one UUT, each UUT being an instance of the same UUT equipment type.

The application program interface can be configured to receive identification of the UUT equipment type, and a value as found for a specific calibration function, and display tolerance limits for the UUT based upon the UUT equipment type.

A method for calibrating a UUT for a specific calibration function is described comprising the steps of receiving a first identification attribute associated with a UUT; receiving a second identification attribute associated with a reference measuring unit; receiving a specific calibration function to be tested; maintaining in a first memory a reference database of one or more than one second identification attribute in holding relationship to one or more than one reference identification address, each reference identification address being associated with a single calibration function; looking up in the reference database, the reference identification address being held by the second identification attribute, and associated with the specific calibration function; selecting a unique record identification address; receiving a value as found for the specific calibration function for the UUT; storing in a second memory the value as found in a being-held relationship to the record identification address; and storing in a third memory the record identification address in a being-held relationship to the reference identification address. Further, either the first identification attribute or the second identification attribute, or both the first identification attribute and the second identification attribute, may be an asset number.

Optionally, the steps of receiving a value as left for the specific calibration function for the UUT and storing in the second memory the value as left in a being-held relationship to the record identification address may be added. A test accuracy ratio may be returned. An estimated measurement uncertainty may be returned. The step of automatically converting the units of the received value as found may be added.

Further, steps may be added of maintaining in a fourth memory an equipment database correlating for individual make and model of equipment, a nominal value to calibration function; receiving make and model of equipment attributes for the UUT; looking up in the equipment database, the nominal value for the specific calibration function for the received make and model of equipment; returning the nominal value; and calculating a calibration tolerance and returning the limits. Still further steps are receiving a value as left for the specific calibration function for the UUT and storing in a fifth memory the value as left in a being-held relationship to the record identification address. The value as found or the value as left is within the limits of the calibration tolerance may be indicated.

BRIEF DESCRIPTION OF DRAWINGS

These and other features, aspects and advantages of the present invention will become better understood with reference to the following description, appended claims, and accompanying drawings where:

FIG. 83 is a sample data sheet generated by the calibration process management system of FIG. 80.

DETAILED DESCRIPTION

Using the calibration process management system ("CPMS") of the present invention, it is possible to create, manage and automate data sheets for the calibration of measuring and test equipment. The system has multiple tools to facilitate the translation of equipment specifications into electronic data sheets. These electronic data sheets can then be used to collect and store calibration data for a plurality of instruments simultaneously. Automation scripting can be added to these data sheets to configure instruments, capture data, perform mathematical operations, communicate with external software, and create instrument test points dynamically. While instruments are being tested, the invention can indicate the degree to which an instrument is in or out of tolerance.

A system using the present invention can be developed to satisfy ISO-17025, ANSI/NCSL 2-540-1, 10 CFR 50 Appendix B, ISO-9002, GMP, and other stringent quality requirements for calibration data collection.

In one preferred embodiment, the following assumptions are made regarding the system implementation and operation: (a) the software will run in a Windows 95 or higher environment, and (b) connection to a database server running Microsoft SQL Server version 7 or greater. Alternative environments and database servers are possible, as will be evident to those skilled in the art. To run automation scripts that use GPIB communications, a National Instruments GPIB controller card, or equivalent, may be required.

The CPMS of the present invention creates, manages, and automates data sheets, and analyses collected data. The system has multiple tools to facilitate the translation of equipment specifications into electronic data sheets. These electronic data sheets can then be used to collect and store calibration data for multiple instruments simultaneously. In one preferred embodiment, eight instruments can be calibrated simultaneously.

Optionally, automation scripting can be added to these data sheets to configure instruments, capture data, perform mathematical operations, communicate with external software, and even create instrument test points dynamically. While test point data is being collected, in a further embodiment, the CPMS according to the present invention will indicate the degree to which an instrument is in or out of tolerance.

System Description

Figure 80:
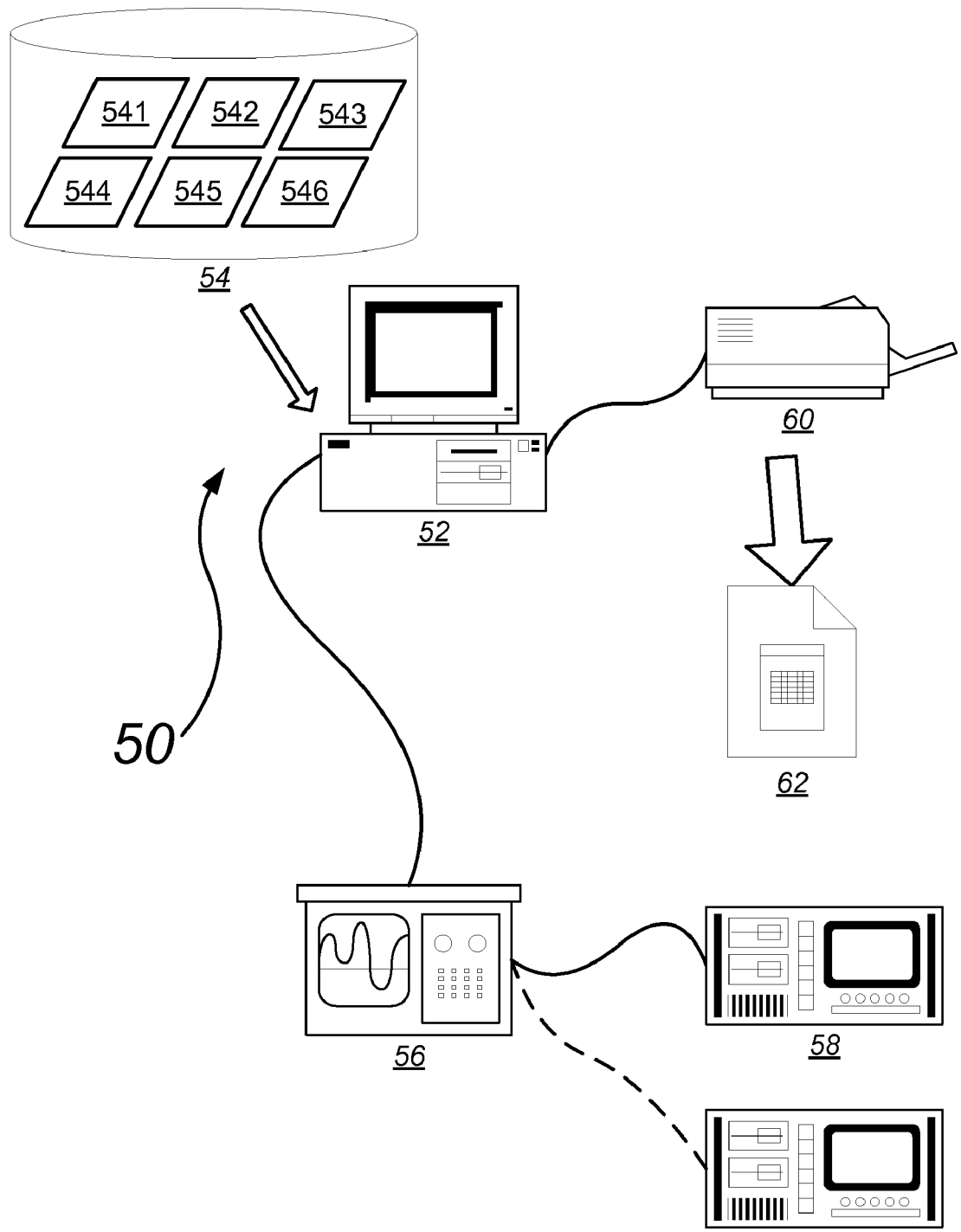
FIG. 80 is system diagram showing the calibration process management system of the present invention.

One embodiment of the CPMS of the present invention will now be described. It will be understood by those skilled in the art that variations in the described embodiment are possible, and that specific aspects of this embodiment are not limitations on the claimed invention. This CPMS, with reference to FIGS. 80 and 82, comprises a calibration process management program 10 (one embodiment being the "Calibration Process Manager") which is stored on a hard drive memory 54 of a computer 52 which is connected to a calibration testing unit 56, and one or more units under test (UUT) 58. It is possible to have multiple UUTs 58 connected and tested using the present invention. Optional printer 60 permits printing of data sheets 62. An appropriate user interface on computer 52 is needed for operator interaction with the calibration process management program 10. As described herein, an appropriate communications link is established between the calibration process management program 10, the calibration testing unit 56, and the one or more units under test (UUT) 58. A series of pages and prompts as will now be described will appear on the user interface on computer 52, guiding an operator to calibration of the one or more units under test.

Figure 1:
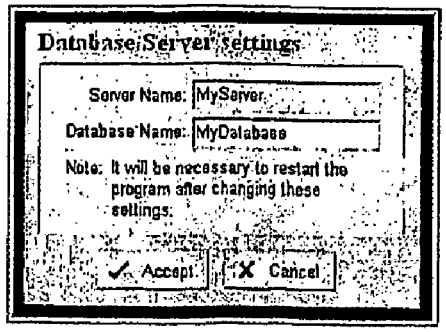
FIGS. 1 to 79, 13A and 17A depict screen captures of exemplary pages and prompts displayed on a display device of a user interface of the present invention embodiments.

The first time the Calibration Process Manager is run, a Database Server Page as shown in FIG. 1 will appear to prompt the user for information that it will use to connect to the database server. The database server page can also be accessed by using the Administration, System Configuration, Database Server menu option. Changing database server settings requires the Calibration Process Manger to shut itself down. Calibration Process Manger will connect using the new settings the next time it is started. This page contains the interface features in Table 1.

Figure 2:
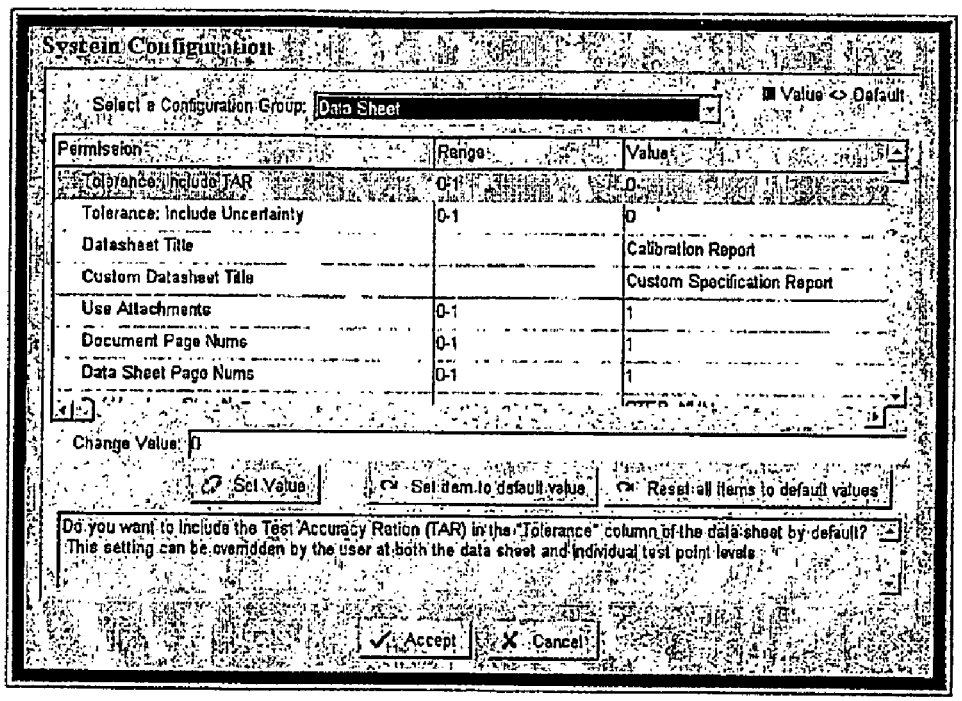

FIG. 2 is a representation of a Master System Configuration Page for the CALIBRATION PROCESS MANAGER The Master System Configuration page is accessed by using the Administration, System Configuration, Master Setup menu option. This page contains the interface features shown in Table 2.

Figure 3:
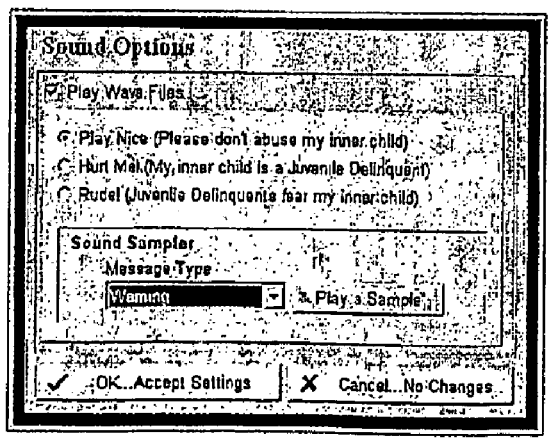

In a further embodiment a sound configuration page allows the user to set up sound clip options that are used with the Calibration Process Manager application. FIG. 3 is a representation of what a sound configuration screen looks like.

Figures 4, 5, 6:
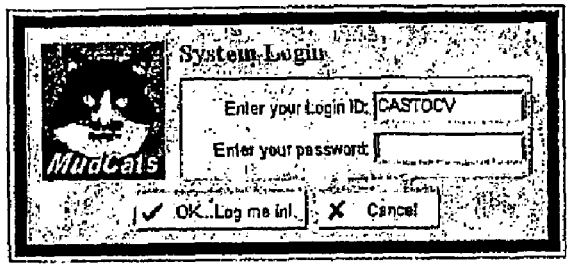

The Calibration Process Manager provides a secure environment along with an audit trail to track changes to the system parameters as well as archiving of records. The security setup procedures of the Calibration Process Manager are performed by a user with System Administrator privileges. When the system database is initially installed a single user exists in the system, SysAdmin. The System Administrator performs the initial setup for the Calibration Process Manager, will login as SysAdmin and proceed to configure the system in preparation for use throughout the organization. System users must be setup prior to using the Calibration Process Manager. These users will be given the default set of permissions, once they are created. The System Administrator will adjust the user's permissions as required. FIG. 4 is a representation of what the System Login Page looks like.

The System Login page is displayed when the Calibration Process Manager application is run. If the user fails to login, the application will terminate. This page contains the interface features shown in Table 3.

FIG. 5 is a representation of what the User Manager Page looks like. The User Manager page is accessed by using the Administration, User Manager menu option. System Administrator privileges are required to access the User Manager page. The User Manager page displays the master list of users for the Metrology suite of applications. All of the applications share a common user database. This page is the starting point for viewing, editing, and creating user accounts. The page also provides the gateway to user permissions, changing a user's password, and setting up the system's default login rules. This page contains the interface features in Table 4.

FIG. 6 is a representation of what the User Login Rules page looks like. The User Login Rules page is accessed by the Set Default Login Rules button on the User Manager page. This page is used to setup the system's basic security rules including user login rules. This page contains the interface features in Table 5.

Figure 7:
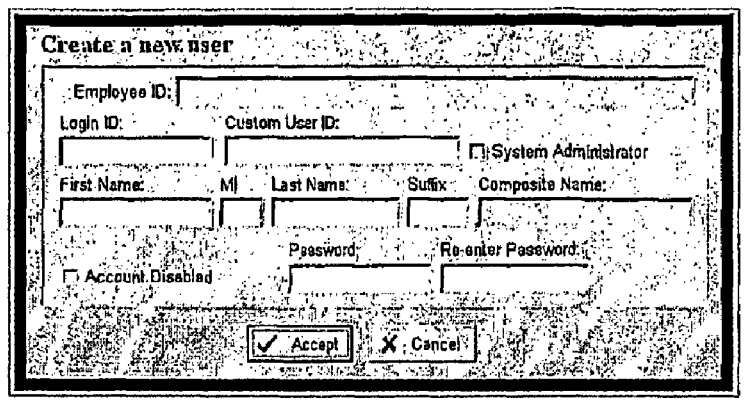

FIG. 7 is a representation of what the Create a New User Page looks like. The Create a New User page is accessed by clicking the New User button on the User Manager page. The page is used to setup a new user account. This page contains the interface features in Table 6.

Figure 8:
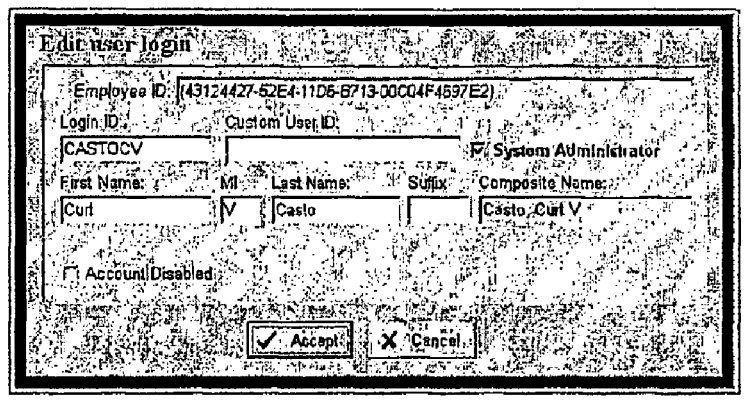

FIG. 8 is a representation of what the Edit User Login Page looks like. The Edit User Login page is accessed by clicking the Properties button on the User Manager page. The Edit User Login page displays and permits editing of the basic account information for the currently selected user.

Figure 9:
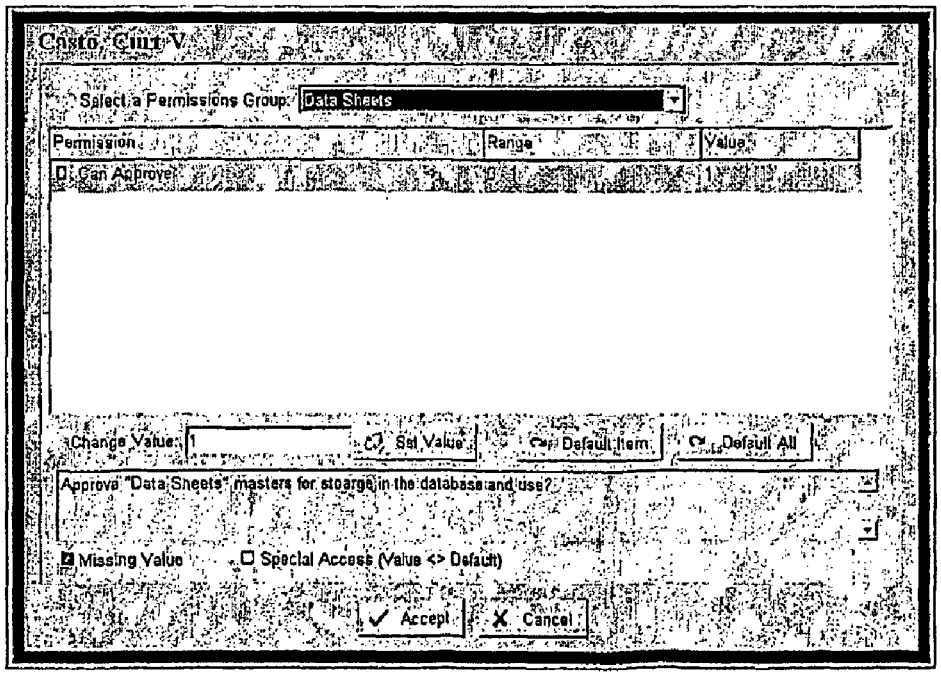

FIG. 9 is a representation of what the User Permissions Page looks like. The User Permissions page is accessed by the permissions button on the user manager page. The User Permissions page is used to manage a user's privileges within the Calibration Process Manger. This page contains the interface features in Table 7.

Figure 10:
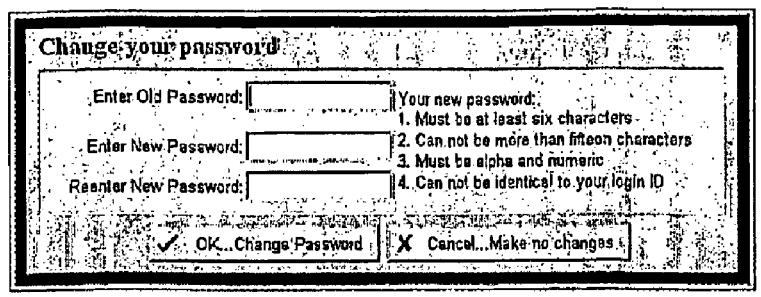

FIG. 10 is a representation of what the Change Password Page looks like. The change password page can be accessed by two methods. The first is with the Options, Change Password menu option. The second is with the Change password button found in the User Manager page. However, with the Options, Change Password menu option, the user will have to input the current password. The Change Password Page contains the interface features in Table. Passwords cannot be less than six characters in length, or more than fourteen characters in length. They must be alphanumeric, and cannot match the login ID for the user.

Figure 11:
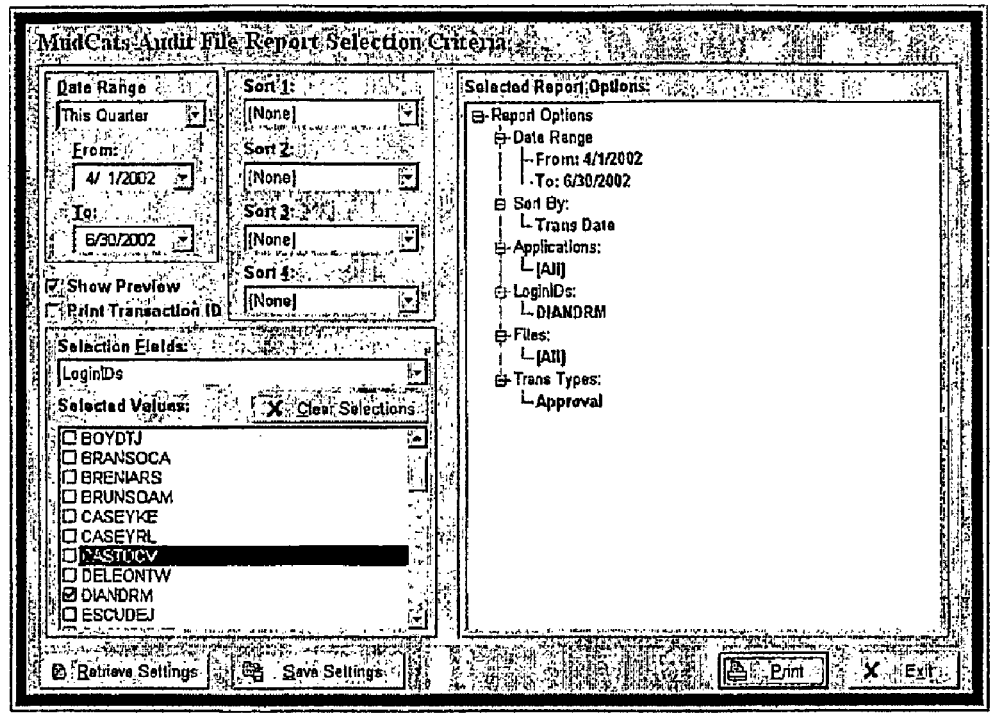

FIG. 11 is a representation of what the Audit Report Page looks like. The Audit Report page is accessed by the main form's Administration, Audit Report menu option. The Audit Report page is used to setup, save, load, and execute Audit Report configurations. This page contains the interface features in Table 8.

Figure 12:
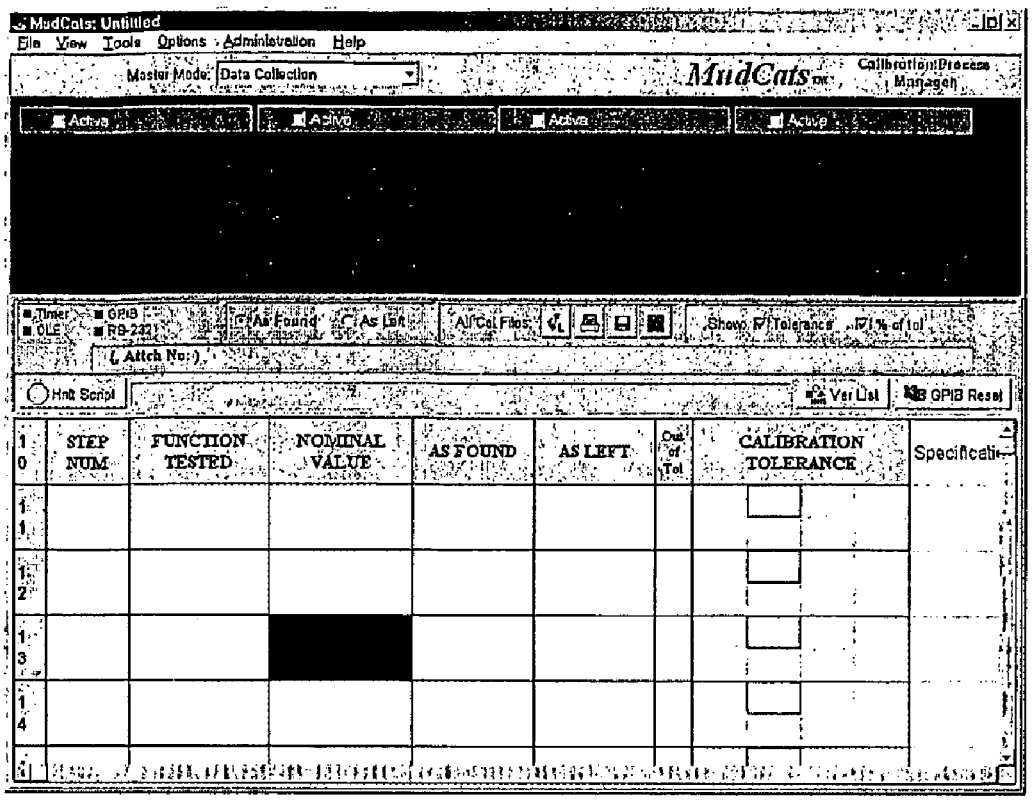

FIG. 12 is a representation of what the main screen of the Calibration Process Manager application looks like. The main page is the screen that the Calibration Process Manager application opens to. The common thread of the Calibration Process Manager application is that it graphically represents, and is navigated as, a data sheet. It will display information as it is collected and auto format the test result columns to ensure each data sheet maintains a uniform look.

The main page has three master modes of operation: Data Sheet Designer, Data Collection, and statistics. When the application opens, the Master Mode is set to Data Collection. This page contains the interface features in Table 9.

Appendix B is a list of the menu options that are available in the Calibration Process Manager application's main page for one version.

A Master Mode selection drop down list allows the user to select what the current functionality of the application is to be. The choices are in Table 10.

Figure 13:
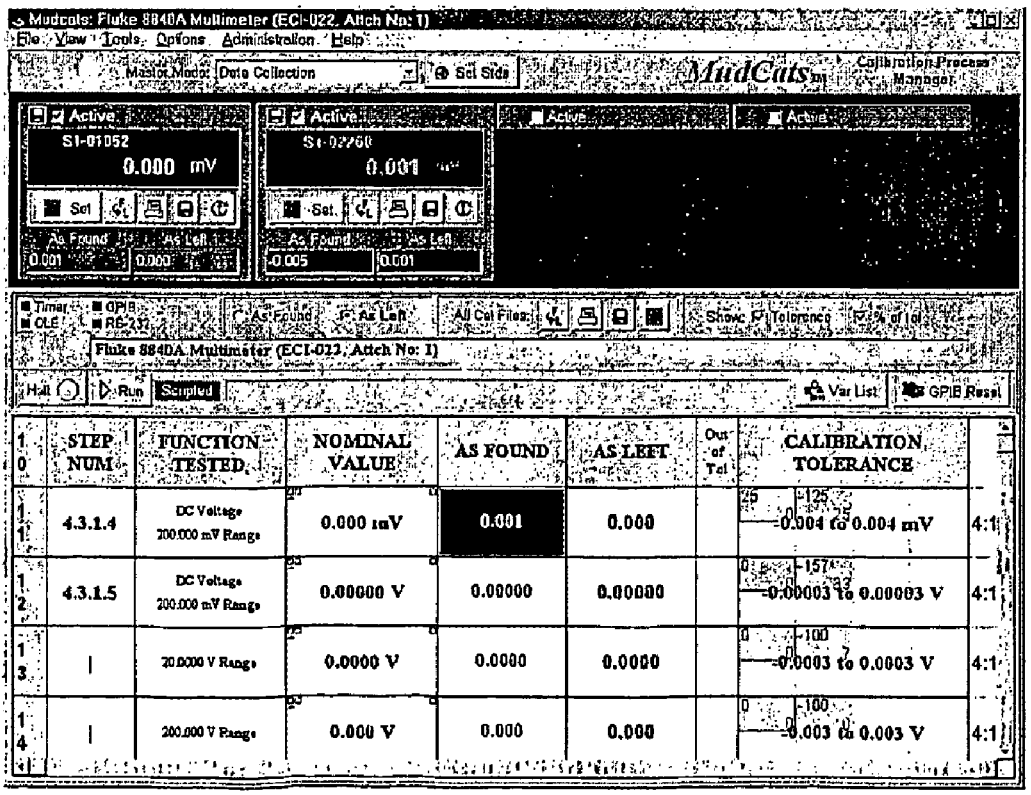

FIG. 13 is a representation of what the Calibration Process Manger main page (Data Collection mode) looks like. The primary purpose of the Data Collection section is to facilitate the collection of measurement data and the design and execution of automation scripts.

Calibration Process Manager allows for the collection of data for more than one instrument simultaneously. This can be done, providing the instruments use the same data sheet. In one embodiment, up to eight sets of measurement data can be collected. As is evident, a system could be constructed for more or fewer sets. Each instrument under test is a "channel" and will display the "As Found", "As Left", and "Out of Tolerance" data. All eight channels can be displayed and edited simultaneously. These channels are activated and configured independently.

Figures 13A, 15:
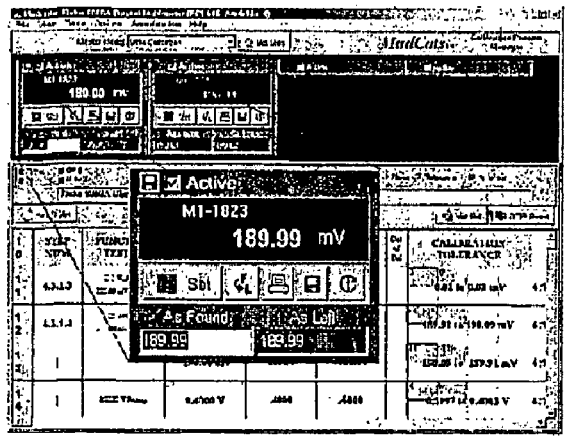

FIG. 13A is a representation of what a Calibration Process Manger Data Collection Channel looks like. A channel is container object that represents one of the units under test. When a channel is selected, its display is highlighted and measurement data is recorded into that channel. The channels display measurement data collected for the currently selected row of the data sheet grid. "As found", "As left", and "Out of Tolerance" information is displayed in relevant columns of the data sheet grid for the channel that is currently selected. These data sheet columns are not visible when editing automation script commands to preserve space. The script command list grid occupies part of the space normally reserved for the data sheet grid. The Tolerance column of the data sheet grid will display graphical status information for each of the active channels, as shown in FIG. 13A.

The active tabs displayed at the top of the main page indicate which channels are designated for instruments and which are currently active for testing. When the active check box is selected, the UUT Boilerplate Setup page is displayed. The UUT Boilerplate Setup page is where the unit under test information is configured for the selected channel.

A data sheet must be loaded prior to activating a channel. The Calibration Process Manager uses the data sheet as a template for data collection. All determinations of the nominal test point definition, in tolerance status, and Specification Tracking standards used are derived from the active data sheet. The measurement data collected for each of the channels is stored separately in memory and is not stored in the active data sheet. When a calibration is saved, exported to a file, or printed, The Calibration Process Manager merges the channel and data sheet data into a single calibration file. If a calibration is to be reopened or imported for further data collection, the applicable data sheet must first be loaded. If the active data sheet is not the same data sheet or same version of the data sheet used to create the calibration file, a warning message will be displayed.

When a calibration is reopened into a channel, all measurement data is reevaluated, using the data sheet's information. If the data sheet's nominal test point definitions or tolerances have been modified, the calibration's in tolerance status will be adjusted accordingly. For this reason, historical calibration records should not be viewed or reprinted from within a channel. To view, reprint or export historical calibration files, set the Calibration Process Manager's Master Mode to Data Sheet Designer or Statistics, then use the File, Open, . . . menu options to load the calibration. These modes do not interpret the measurement data, they merely display it.

An active data collection channel contains the interface features in Table 11.

In one embodiment, when a channel is active the Show Standards button will be visible at the top of the main page. If no standards have been assigned to the data sheet the circle will flash red. Once standards have been assigned to the data sheet, the light will show green. When the button is clicked into the depressed position, the standards fields will be displayed at the bottom of the screen. However, the data collection channels will not be displayed again until the Show Standards button is de-selected (returned to the up position).

Figure 14:
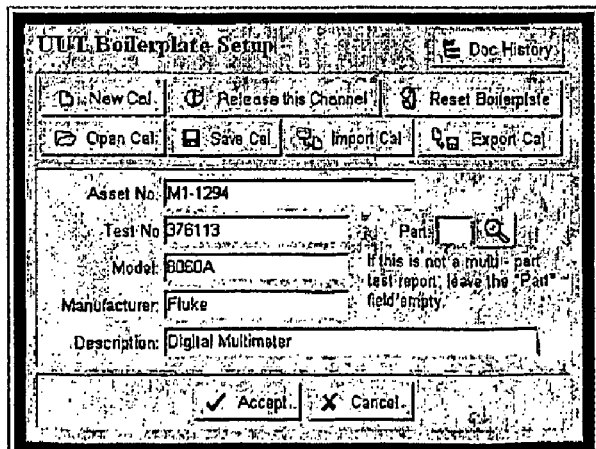

FIG. 14 is a representation of what the UUT Boilerplate Setup page looks like. If the channel in which the active check box is selected has not previously been configured, then the UUT Boilerplate Setup page will be opened. The UUT Boilerplate Setup page allows the user to designate asset numbers, test numbers, and other information to units under test for each channel. The UUT Boilerplate Setup page contains the interface features in Table 12.

The Function Field contains four indicators. The first is the Timer indicator. This will display a numeric value of a delay period specified by a script command. It will count down until the delay is completed. The remaining three indicators, GPIB, OLE, and RS-232 will show one of four colors: gray for not is use, green for reading data, yellow for writing data, and red for error. These colors will be visible during the corresponding command execution. Warnings and errors will cause a Calibration Process Manager Warning window to be displayed indicating the possible cause of the error or warning. The script will be halted, When the user has corrected the error, testing can resume.

The Measured Value Radio Selection field contains two radio buttons. The options are for "As Found" or "As Left" data collection. This selection represents the master data collection mode. Only one radio button can be selected at a time they will activate the corresponding field on the channel display.

The All Cal Files section has the following four buttons: to copy "as found" data to "as left", print, view the master boilerplate data, and save calibrations. The copy "as found" to "as left" function will copy the numeric value from one field to the other within the channel display. These buttons will cause their action to propagate to all open channels. The operation of these buttons is identical to their operation when selected on the individual channel boxes, with the exception of the view boilerplate data button.

The "Show:" Selection panel contains two check boxes. The tolerance check box indicates if the tolerance value will be displayed in the "tolerance" column of the data sheet. The percentage of tolerance box indicates whether or not the percentage of tolerance consumed will be displayed in the "tolerance" column of the data sheet. These options only affect how data is displayed, not stored or printed.

The Data Sheet Master Grid contains the per line information for unit tests. The Tolerance field is updated as the tests are executed giving a real time indication of the test values. These results will not be user editable.

When a measured value is recorded for an instrument channel, the system will compare the value to the instrument's Tolerance as set in the data sheet, indicate the "out of tolerance" status, then display the percentage of the tolerance consumed. This operation is only performed on test points that contain calculable data in the Nominal Value and Tolerance cells.

Data can also be collected by use of the automated scripting system. This allows data collection from a GPIB, RS-232, Custom User Prompts, or the result of scripted mathematical operations. The user can design and execute automation scripting for the current data sheet. The Data Collection page contains commands for executing, halting, and when the Script Commands are visible, editing automation commands.

The script is executed by pressing the Command Menu key on the QuickData Keypad, clicking on the run button, or pressing the F12 key on the system keyboard. When a interface command group (command menu item) is selected from the pop-up Command Menu, the application will attempt to run the scripted commands, sequentially, for the interface command group being executed. The system will, as necessary, open other command based forms to assist the user in executing the test properly.

The Calibration Process Manager main page (Data Sheet Designer mode) option gives the user the means by which they may create data sheets. These data sheets may then be used as a template for automation scripting and the collection of calibration data. A data sheet is the starting point for all operations within the Calibration Process Manager application. This section describes the tools available to assist in the data sheet creation process.

FIG. 15 is a representation of what the Main Form's Data Sheet Designer mode looks like. The Calibration Process Manger main page (Data sheet designer mode) contains the interface features shown in Appendix D.

Figure 16:
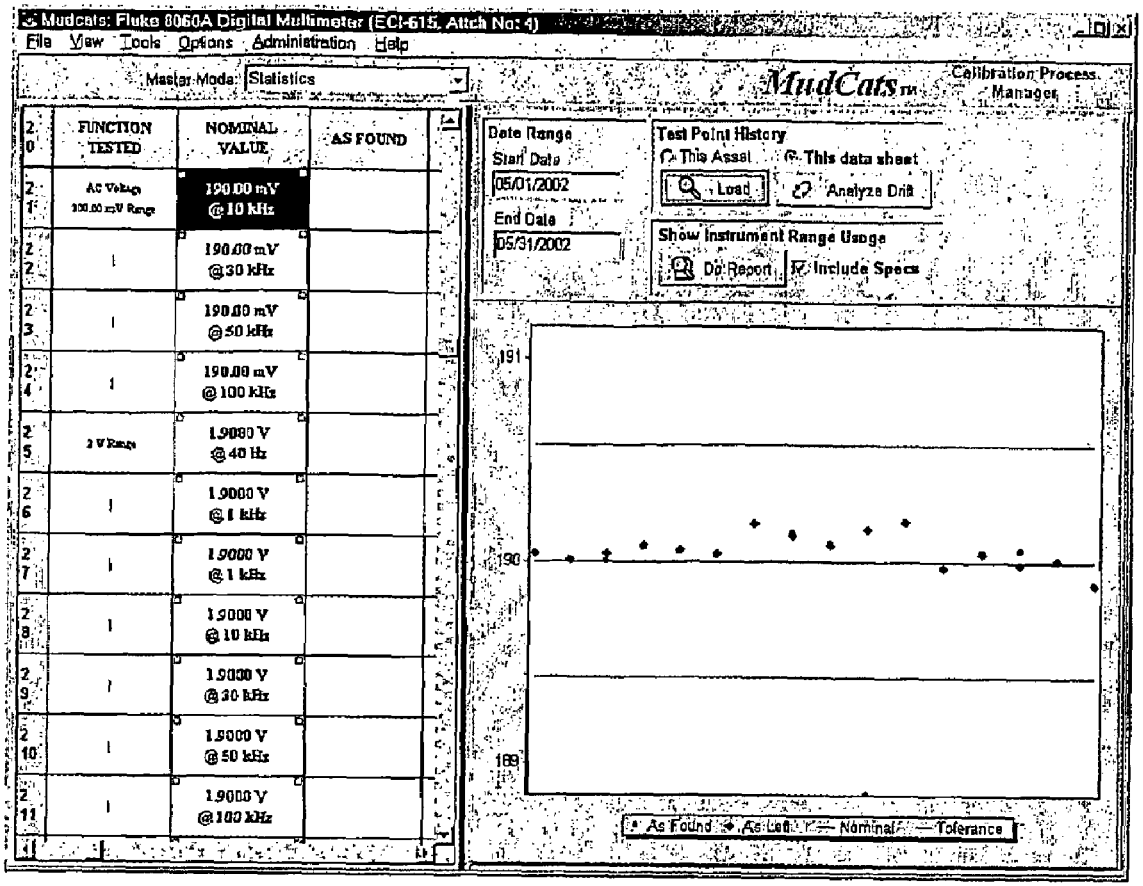

FIG. 16 is a representation of what the Calibration Process Manger main page (Statistics mode) looks like. The Statistics page allows the user to easily view past test results for a particular data sheet. The results can be displayed for variable date ranges, and can be specific to the data sheet or the asset. The statistics page contains the interface features in Table 13. The test point history is displayed as: As Found—Blue Diamonds; As Left—Red Diamonds; Nominal Value—Black Lines; Tolerance Value—Red Lines.

Figure 17:
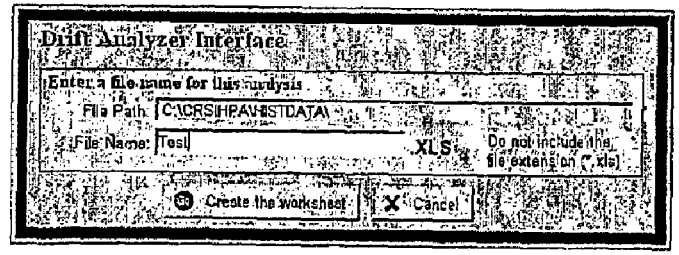

FIG. 17 is a representation of what the Drift Analyzer Interface page looks like. The Drift Analyzer Interface page is accessed by clicking on the Analyze Drift button, when the Calibration Process Manager's main form is in the Statistics mode. This page requires that an instrument history performance analysis (IHPA) application be installed on the computer. A suitable IHPA application is currently marketed by CRS Engineering Inc. The drift analyzer interface page allows the user to save drift analysis data as a spreadsheet file, such as such as Microsoft Excel format, for use with the IHPA application. Typically, the IHPA is a spreadsheet application. Once the file is created the IHPA spreadsheet application is executed.

The Drift Analyzer Interface page contains the interface features in Table 14.

Drift analysis predicts new values based on previously collected data using a least-squares linear regression of a range of the known data or known x-arrays and y-arrays. For example, given corporate earnings for each of the previous six quarters, a drift analysis function returns earnings expected for the next two quarters. This is the same methodology used in "forecasting" techniques.

Figure 17A:
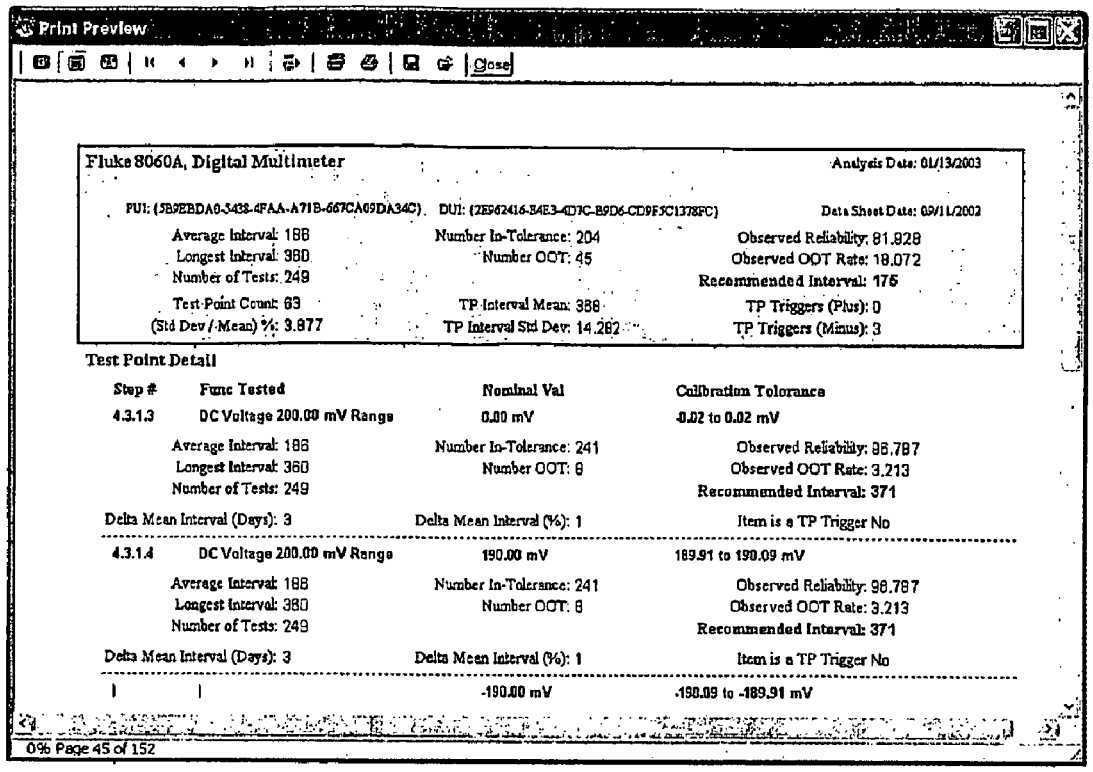

FIG. 17A is a representation of an interval analysis report. For calibration interval analysis, the term reliability refers to the probability that an item or parameter of measuring or test equipment (MTE) is in-tolerance. When items are periodically tested or calibrated, the observed reliability is the fraction of items observed to be in-tolerance at the end of the test or calibration interval. This is a binomial test, i.e., the item or parameter either passes or fails.

Testing the observed reliability $R_{obs}$ involves comparing it against some established minimum acceptable in-tolerance confidence level, referred to as the reliability target $R_{targ}$. With one method, the A3 Interval Method, the observed reliability is computed by simply dividing the Number of Tests into the Number In-Tolerance. For example, if the Number of Tests n for a grouping is 25 and the Number In-Tolerance x is 20, the observed reliability is 80%.

This test methodology works by comparing $R_{obs}$ to $R_{targ}$ to see if there is a significant difference between the two tests within the interval. The magnitude of the difference and the Test Confidence Level determine whether or not the difference is significant. If it is, then the interval corresponding to $R_{obs}$ is said to have failed the test and a recommendation with respect to present interval is suggested (i.e., the interval will either be lengthened or shortened).

The algorithm used to test the interval evaluates whether upper and lower confidence limits for $R_{obs}$ contain the reliability target. If so, then the interval passes the test. A preferred method for determining the confidence limits for $R_{obs}$ uses a binomial distribution function. Given a Number of Tests n and a Number In-Tolerance x, the upper and lower confidence limits are obtained by solving a binomial confidence interval equation. If $R_{targ}$ is within these limits, then the interval passes the test. If the interval is rejected, a new recommended interval is computed using a simple algorithm. The process takes place in two stages. In the first stage, the interval is adjusted to a trial value. In the second stage, the trial value is refined to ensure its feasibility.

Calibration Process Manager has two primary document types: data sheets and calibrations. A data sheet is essentially a template for a calibration. A calibration is a data sheet with actual measurement data recorded. Data sheets are actually much more than a simple template, as they may also contain complete automation scripting and detailed information regarding UUT and standard instrument specifications and uncertainties.

A data sheet is a pre-engineered template used to execute and record calibration data. Data sheets may also contain complete automation scripting and detailed information regarding UUT and standard instrument specifications and uncertainties.

Figure 18:
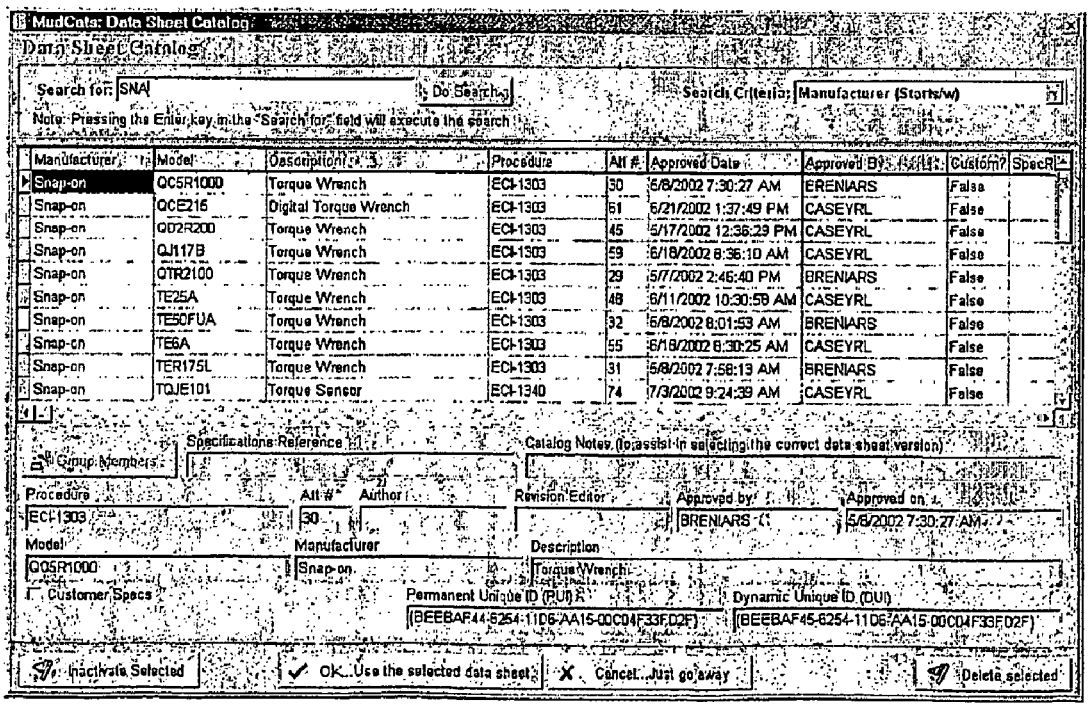

FIG. 18 is a representation of what the Data Sheet Catalog Page looks like. The Data Sheet Catalog Page allows the user to locate and load a data sheet. The Data Sheet Catalog Page is displayed by selecting the File, Data Sheet, Open menu option. The catalog displays both data sheets and data sheet groups. A Data sheet group is a collection of data sheets established using the Data Sheet Group Wizard.

In one embodiment, the Calibration Process Manager does not have a database, consequentially it does not have a data sheet catalog. In that embodiment, it is therefore recommended that a shared network directory be used store and share data sheet files. Some degree of document control can be achieved by managing access rights to this directory. By default, the Calibration Process Manager will look for data sheets in the "DataSheets" directory of the path from which the application was run. If the application is stored in a "Read Only" directory on the local area network, the system administrator can create a "DataSheets" subdirectory. It is also recommended that a structured sub directory system be created inside the " . . . \DataSheets\" directory to assist users in locating the appropriate data sheet.

The Data Sheet Catalog Page contains the interface features in Table 15.

An external data sheet file can be loaded into the Calibration Process Manager by selecting the File, Import, Data Sheet File menu option. The standard windows file location dialog is used to locate a file. Once loaded the data sheet is ready for editing, approval, or use in data collection.

Figures 19, 20:
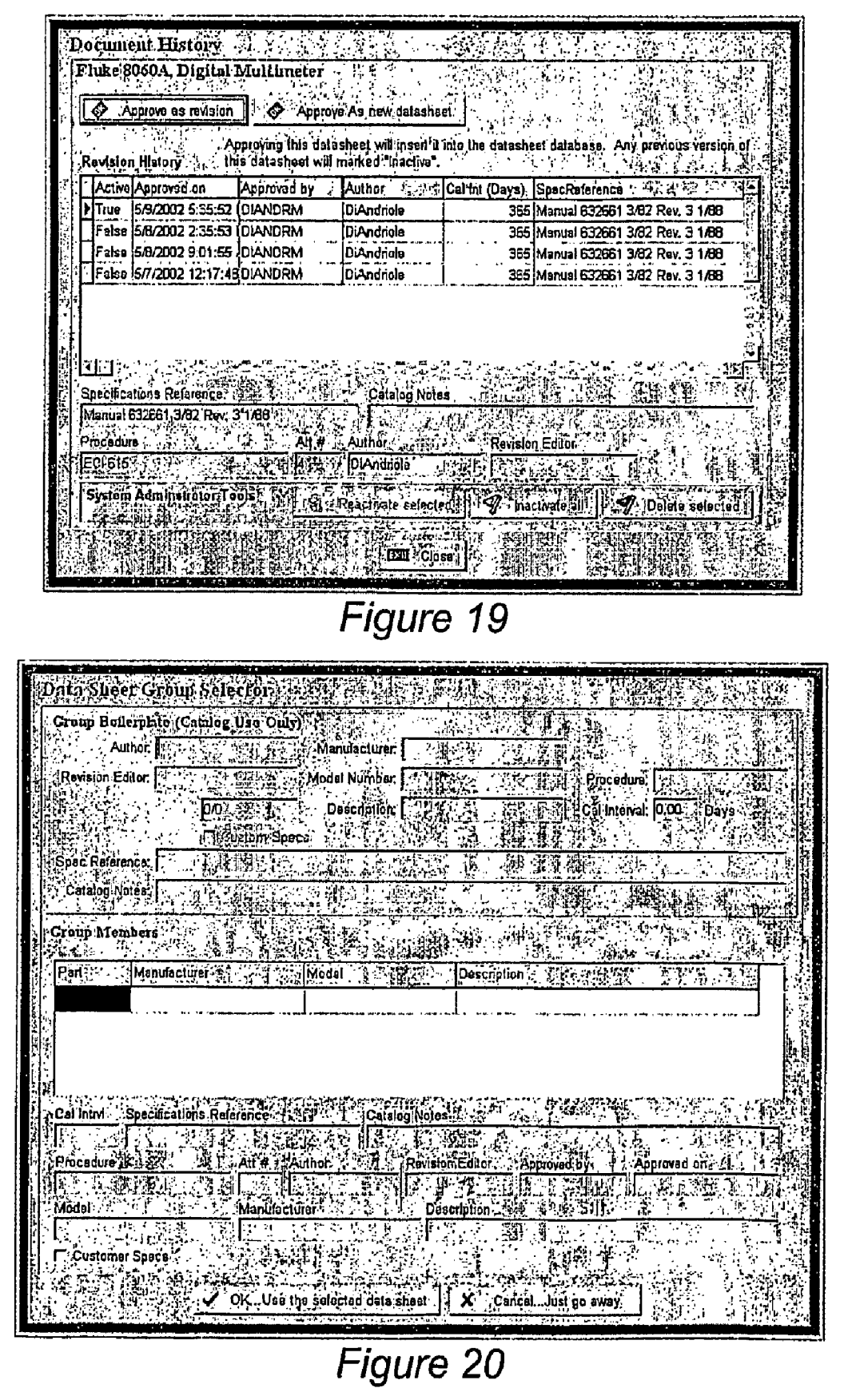

FIG. 19 is a representation of what the Data Sheet Approval Page looks like. The Data Sheet Approval Page allows the user to approve a data sheet and enter it into The Calibration Process Manager's data sheet database. The Data Sheet Catalog Page is displayed by selecting the File, Data Sheet, Approve menu option.

The Data Sheet Approval Page also allows for other administrative functions including: Reactivating a previously inactivated data sheet, inactivating a data sheet, and deleting a data sheet. All of these administrative functions require the user to have System Administrator privileges. The data sheet must first be loaded into the Calibration Process Manger prior to activating the Data Sheet Approval Page. All of the actions taken on this page will require a special login of a user with data sheet approval or system administrator privileges.

The Data Sheet Approval Page contains the interface features in Table 16.

A Calibration Process Manager data sheet can be exported to an external data sheet file by selecting the File, Export, Data Sheet File menu option or the File, Data Sheet, (Save or Save As) menu option. The Standard windows file save dialog is used to set the file name and location. Working with files is the preferred method of saving a data sheet while it is being designed or edited. It should not be returned to the data base until it is ready for use in calibrations.

A Data sheet group is a collection of data sheets established using the Data Sheet Group Wizard. Data sheet groups are used to bind together a set of data sheets that are needed to calibrate an asset that may be comprised of two or more instruments. Once created, data sheet groups appear in the Data Sheet Catalog. Data sheet groups can be located in the Data Sheet Catalog using the same methods that would apply to a single data sheet. Once a data sheet group is selected using the Data Sheet Catalog, the user will be prompted to select a member data sheet using the Data Sheet Group Selector page.

FIG. 20 is a representation of what the Data Sheet Group Selector page looks like. The Data Sheet Group Selector page allows the user to select a data sheet from a data sheet group. The page is accessed from the Data Sheet Catalog Page. The Group Members button of the Data Sheet Catalog Page is enabled when a data sheet group is selected in the Data Sheet Catalog Page's data sheet grid. Click on this button to view the Data Sheet Group Selector page.

The Data Sheet Group Selector page contains the interface features in Table 17.

Figures 21, 22:
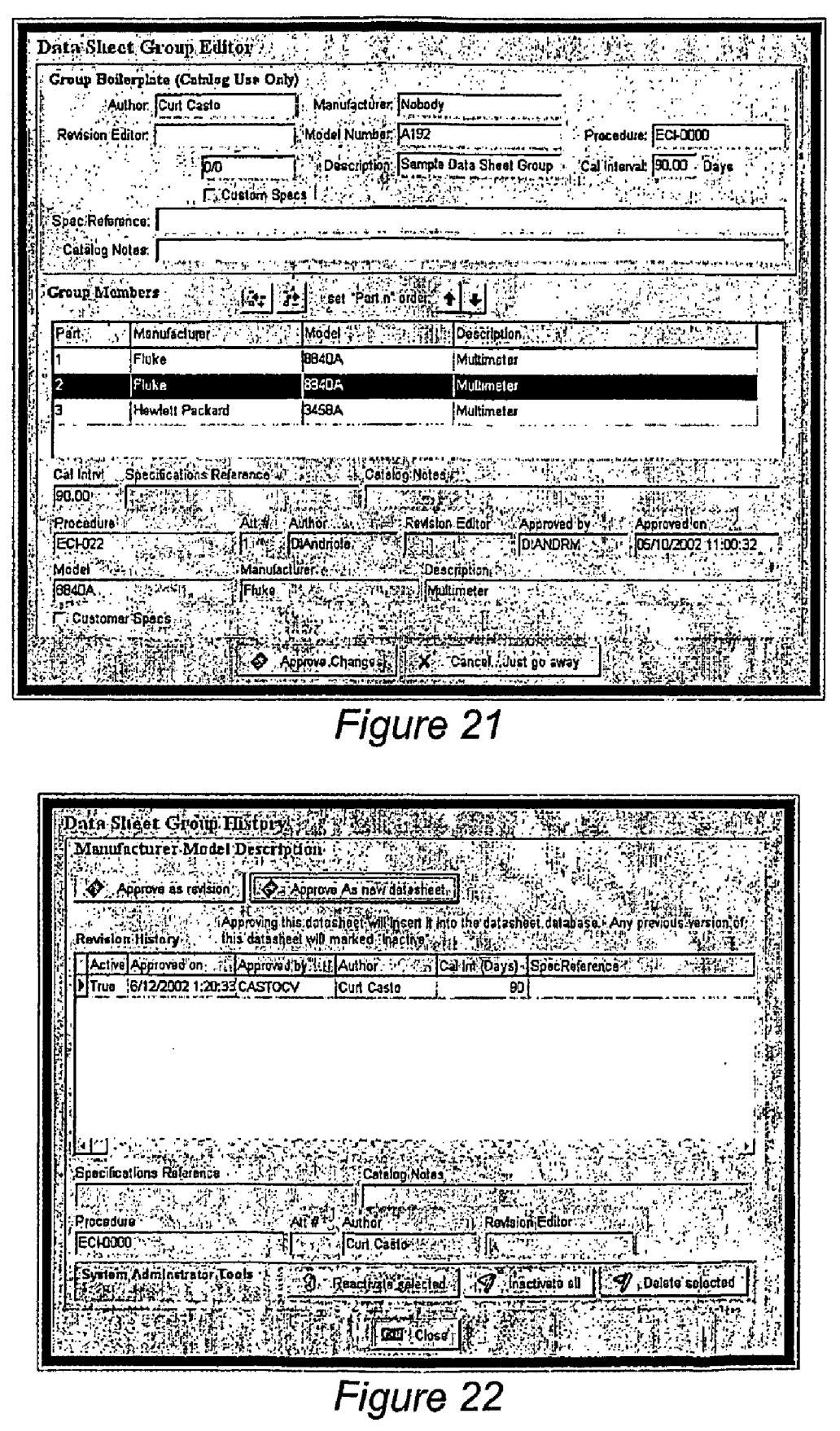

FIG. 21 is a representation of what the Data Sheet Group Wizard page looks like.

The Data Sheet Group Wizard page allows the user to create and edit data sheet groups. The page is accessed via the Tools, Wizards, Data Sheet Groups, New Group menu option to create a new group or the Tools, Wizards, Data Sheet Groups, Edit Existing Group menu option to edit an existing group. The features are in Table 18.

FIG. 22 is a representation of what the Data Sheet Group Approval page looks like. The Data Sheet Group Approval page allows the user to approve data sheet groups created or edited with the Data Sheet Group Wizard. The page is accessed by clicking on the Data Sheet Group Wizard page's Ok button upon completion of the data sheet group edit process. Features are in Table 19.

A calibration file is originated from a data sheet file for a unit who's measurement data has already been collected or is currently being collected. It retains and displays the measurement results and Specification Tracking standards used. This allows the user to save calibration information for units under test and cross-examine the results. The calibration file does not retain the automation or Specification Tracking default standard information of the data sheet. Calibrations can be stored in the system database for long term history or exported as a file for short term storage and transfer. In a more basic embodiment, calibration files do not contain any Specification Tracking data.

Figures 23, 24:
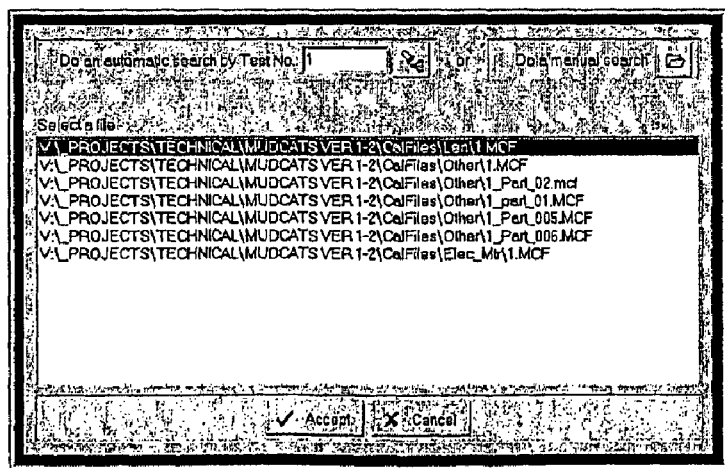

FIG. 23 is a representation of what the Calibration History Catalog Page looks like. The Calibration History Catalog Page allows the user to locate and load a Calibration. When in the Data Sheet Designer mode, the Calibration History Catalog Page is displayed by selecting the File, Calibration, Open menu option. When in the Data Collection mode, the Calibration History Catalog Page is displayed by clicking on the Open Cal button of the UUT Boilerplate Setup page. The UUT Boilerplate Setup page is accessed by clicking on the Set UUT Boilerplate button of one of the active UUT Channels. The data sheet used to create the calibration should be loaded into the Calibration Process Manager before loading a calibration. The data collection system uses the data sheet as a reference and the user will be warned if the applicable data sheet is not loaded first.

A basic embodiment of the Calibration Process Manager does not have a database, consequentially it does not have a calibration history catalog. It is therefore recommended that a shared network directory be used store and share calibration files. All users must have "Write" access to this directory. By default, the Calibration Process Manager will store calibration files in the subdirectories of the "Calibrations" directory of the path from which the application was run. If the application is stored in a directory on the local area network, the system administrator can create a "Calibrations" subdirectory. The Calibration History Catalog Page contains the interface features in Table 20.

An external calibration file can be loaded into the Calibration Process Manager. When in the Data Sheet Designer mode, the standard windows file locator dialog is displayed by selecting the File, Import, Calibration File menu option. Calibration files loaded in the Data Sheet Designer mode can not be stored in the database. The file must be imported in the Data Collection mode to be stored in the database.

When in the Data Collection mode, the standard windows file locator dialog is displayed by clicking on the Import Cal button of the UUT Boilerplate Setup page. The UUT Boilerplate Setup page is accessed by clicking on the Set UUT Boilerplate button of one of the active UUT Channels. The data sheet used to create the calibration should be loaded into the Calibration Process Manager before loading a calibration. The data collection system uses the data sheet as a reference and the user will be warned if the applicable data sheet is not loaded first. Once loaded the calibration is ready for editing or approval.

FIG. 24 is a representation of what the Search for File page looks like. This allows the user to look on the local system for a previously exported calibration file. This page will contain the information in Table 21.

Figure 25:

FIG. 25 is a representation of what the Sign Calibration Page looks like. Calibrations can only be signed into the database when in the Data Collection mode and the calibration is in an active channel. When in the Data Collection mode, the Sign Calibration Page allows the user to sign a calibration and enter it into the Calibration Process Manager's calibration database. The user must have the calibration signature privilege assigned on the user permissions page. The Sign Calibration Page is displayed by clicking on the Save Cal button of the UUT Boilerplate Setup page. The UUT Boilerplate Setup page is accessed by clicking on the Set UUT Boilerplate button of one of the active UUT Channels. The Sign Calibration Page contains the interface features in Table 22.

A Calibration Process Manager Calibration and be exported to an external calibration file. When in the Data Sheet Designer mode, the standard windows file save dialog is displayed by selecting the File, Export, Calibration File menu option. When in the Data Collection mode, the standard windows file save dialog is displayed by clicking on the Export Cal button of the UUT Boilerplate Setup page. The UUT Boilerplate Setup page is accessed by clicking on the Set UUT Boilerplate button of one of the active UUT Channels.

Figure 26:
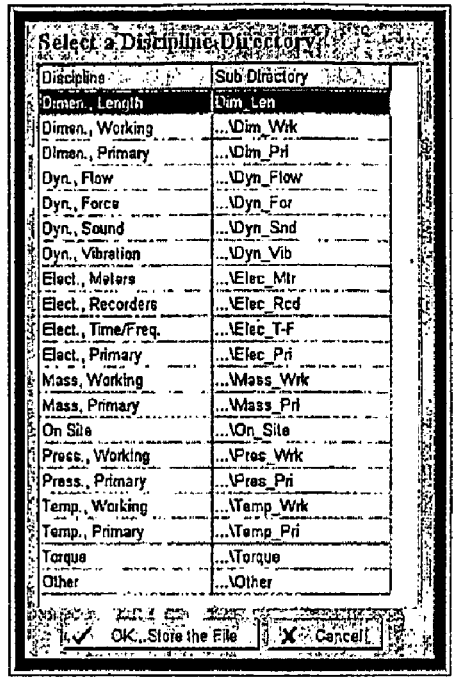

FIG. 26 is a representation of what the Select Discipline Directory page looks like. The Select Discipline Directory page allows the user to export calibration files to a set of fixed discipline directories.

Figure 27:
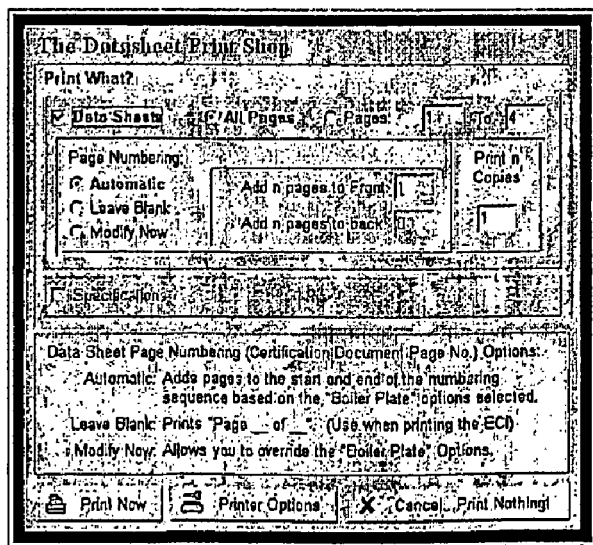

FIG. 27 is a representation of what the Data Sheet Print Shop page looks like. The Data Sheet Print Shop page allows the user to print data sheets or calibrations, and configure printers and page settings. The print button, in the Data Sheet Designer page accesses this page. The page can also be accessed by clicking on one of the Print buttons of an active calibration channel. The Data Sheet Print Shop page has the interface features in Table 23.

Figures 28, 29:
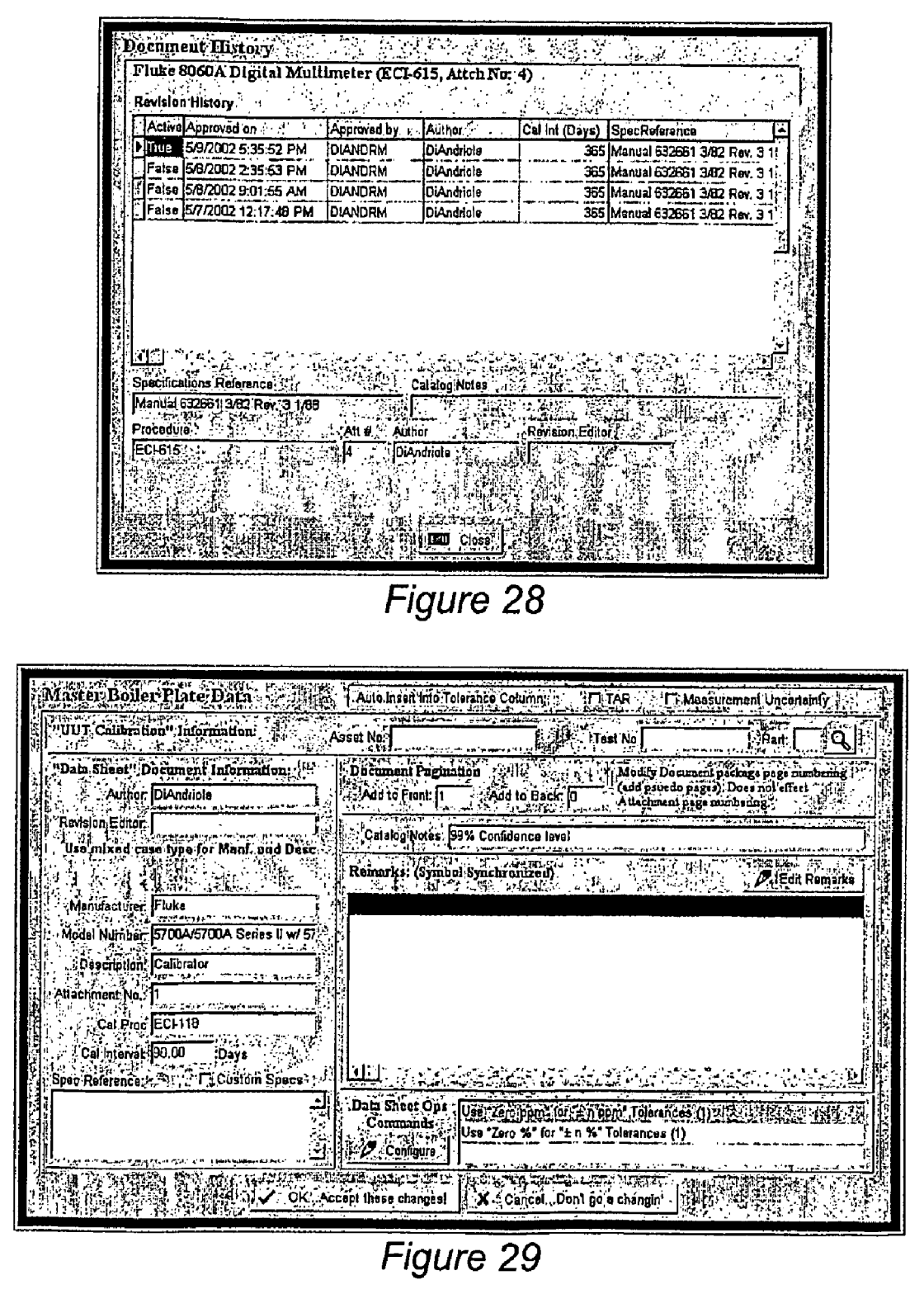

FIG. 28 is a representation of what the Document History Page looks like. The Document History Page allows the user to view the version history of data sheets and calibrations. To display the history of the document currently displayed in the Calibration Process Manager's primary data sheet display grid, select the Administration, Document History menu option. To display the history of a calibration currently displayed in one of the Calibration Process Manager's data collection channels, click on the Doc History button of the applicable UUT Boilerplate Setup page. The Document History Page contains the interface features in Table 24.

Data sheet design is performed when the Calibration Process Manager's main form is set to the Data Sheet Design mode. The electronic data sheets will be used to collect and store instrument calibration information. These data sheets will report the measurement data for instruments under test. Once approved for use, data sheets are stored in the system database. Data sheets can be saved as a flat file, with a .MDD extension, while in development or for transfer purposes. In one embodiment, a single data sheet will be able to collect and store calibration information for up to eight instruments simultaneously. It is possible to create a system for more or less units. The data sheets can be scripted to collect data from GPIB, RS-232, or custom user prompts.

The Calibration Process Manager application has different ways to create a data sheet, including manual entry (typing), the tolerance calculator, test point wizards, and data sheet generation wizards.

All Data Sheets will be automatically formatted to maintain a uniform look and feel from sheet to sheet. Calibration Process Manager will determine the necessary font size, spacing, and line splitting for each data column as entered. Each data sheet column has its own rules for formatting its content. The header row of each page also has formatting rules that differ from the data rows. Header rows are indicated in two ways: There cells are gray, and they are always on line number zero. The page and line numbers are displayed on the left edge of the data sheet grid. It is recommended that data sheet headers be inserted into data sheet last. As new rows are inserted into the data sheet, the rows containing the header information will be moved down. Once editing is completed, you will have to adjust your header rows. It is easiest to just delete header rows that are out of position and re-add add them to the first row of each page. The headers are inserted using the "Insert Headers" button. The "Insert Headers" button will insert the headers in the selected row and push the rest of the data sheet down one row. The "Insert Headers" function copies the header information from the first page of the data sheet. If you plan to use non-standard headers, change the first set of headers before using the function. While other data temporarily occupies the header rows, the text formatting will use the header row's formatting rules, but once the headers are inserted, the data will be pushed into normal data rows and assume proper formatting.

The Calibration Process Manager uses only ANSI standard characters within a data sheet. The main reason for this is universal data compatibility. Whether stored in the system database or exported to files, the information contained can be read and used by any application, on any operating system. Exported files are stored in a straight forward, tab delimited, text format so they may be used by other applications. If you decide to use something other than the Calibration Process Manager in the future, you can take your data with you.

There are only two special character flags used with the Calibration Process Manager's data sheet editor and they have the following meaning. The flag "~" is a Forced Line Break This character forces a line break wherever it appears. This overrides the internal automatic formatting of the data sheet editor. This is useful when it enhances readability of the data sheet. The character is not printed on data sheets or displayed in the data sheet grid.

The flag "~@" is a Parametric Divider. These characters inform the Nominal Value decoder that what follows is another parametric value., i.e.: 190 mV~@20 kHz~@ 1 mA. When displayed the item will appear as:190 mV@20 kHz@ 1 mA.

The decoder will interpret this as having three parametric values. The first parameter is used by to indicate the test point's nominal value. The Professional and Pro Remote versions will use all three parameters for the parametric matching of Specification Tracking Instrument Ranges. The "~" character also serves its primary function of causing a forced line break. The decoder requires that each parameter have a numeric value followed by the units of measure. The decoder can resolve the parameters with or without spaces, but inserting the space between the value and unit of measure is easier for humans to read. There can be no space between the and @ characters. If the ~ character appears by itself in the Nominal Value cell, it instructs the decoder to disregard it and anything that follows it. For printing and display purposes it will still serve its primary purpose of forcing a line break. Using the ~ character by itself allows you to add additional text to the Nominal Value cell without confusing the decoder. i.e.: 190 mV~@100 Hz~(Slow Mode). When displayed the item will appear as: 190 mV@100 Hz(Slow Mode). The two parameters are recognized and the rest ignored.

FIG. 29 is a representation of what the Master Boiler Plate Data page looks like. The Calibration Process Manager Master Boiler Plate Data page allows the user to set header type information for the data sheet. This page also allows the user to configure system behaviors that apply when the data sheet is activated. The Master Boiler Plate Data page is activated by clicking the View/Edit Boilerplate button on the application's main page. The Boiler Plate Data page contains the interface features in Table 25.

Figure 30:
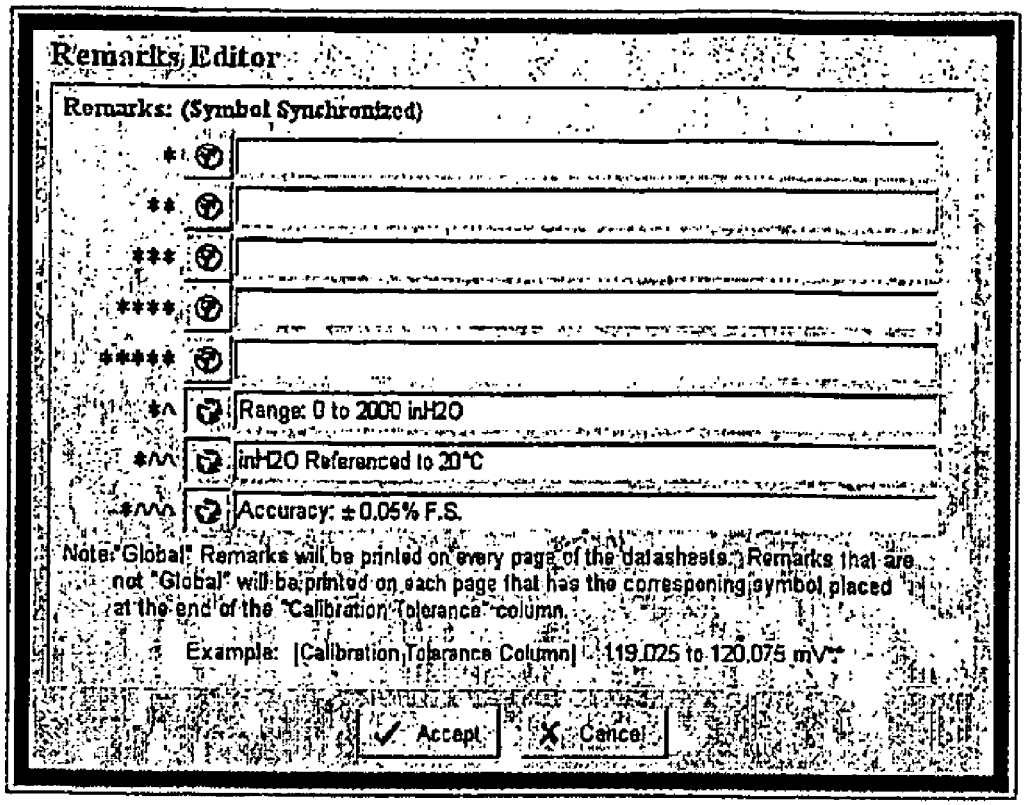

FIG. 30 is a representation of what the Remarks Editor looks like. The Calibration Process Manager Remarks Editor allows the user to set global or per-line comments for the data sheet. The Remarks Editor contains the interface features in Table 26.

Figure 31:
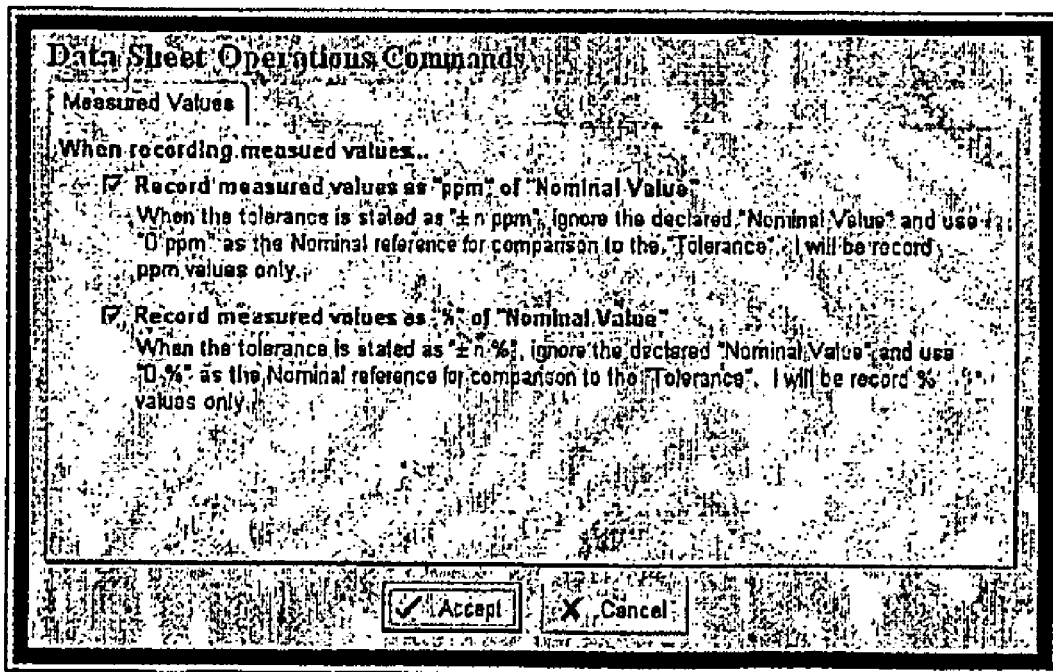

FIG. 31 is a representation of what the Data Sheet Operations Commands page looks like.

The Data Sheet Operations Commands page allows the user to set special data sheet directives that override normal data sheet behavior. The Data Sheet Operations Commands page contains the interface features in Table.

Figure 32:
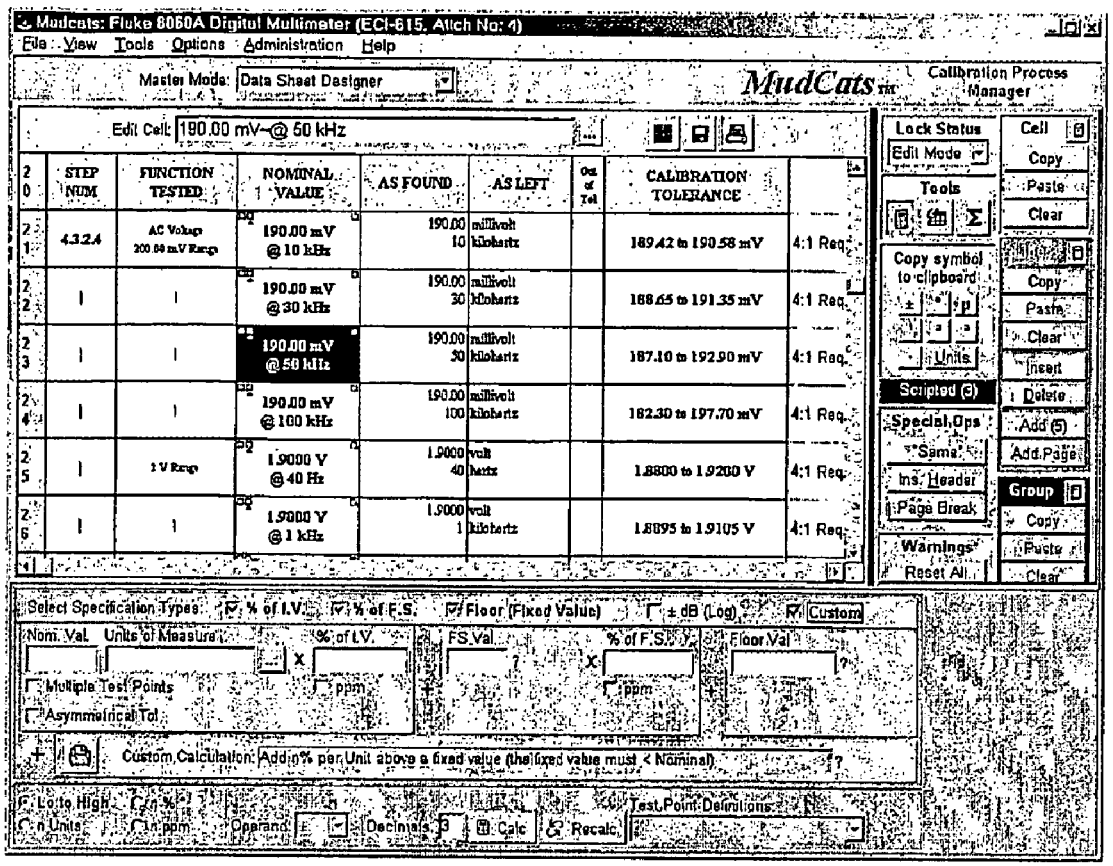

FIG. 32 is a representation of what the data sheet with the tolerance calculator looks like.

The integrated tolerance calculator allows a data sheet designer to generate test point row data by entering the nominal test point values and equipment specification data. The tolerance is calculated, formatted, and then the new test points are inserted into the data sheet.

The calculator uses a smart rounding system to appropriately round tolerance values. It will support both standard specifications, (% of I.V., ppm of I.V., % of F.S., ppm of F.S., ±n units of measure, and ±dB.) and custom specification calculators. The custom specifications contain more complex components (i.e. ±0.0025% of I.V., per volt above 750 volts). Custom specification calculators can be defined by the user, stored and used in conjunction with the standard specification components in the tolerance calculator. A basic version does not need to support the use of custom calculators. The Tolerance Calculator page contains the interface features in Table 27.

Figure 33:
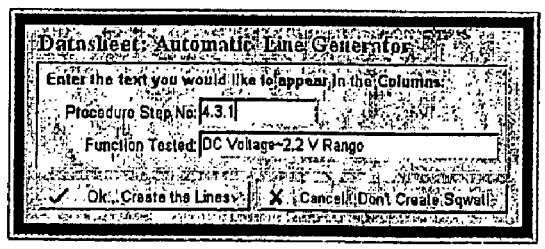

FIG. 33 is a representation of what the Automatic Line Generator page looks like. The Automatic Line Generator page is displayed when the tolerance calculator's Calculate button is clicked. When the new row is inserted, the user will be prompted to enter additional information to be placed in the new data sheet row. The Automatic Line Generator page contains the interface features in Table 28.

The tolerance calculator embeds the equipment specification data, used to calculate tolerances, into data sheet rows. A composite value for the standards requirement (0.25* Tolerance) is also embedded. This information is displayed for each data sheet row.

The Nominal Value and Tolerance columns of a data sheet play major roles in the Calibration Process Manager's overall function. The columns contain data that is used to assess in tolerance status during data collection and to interface with Specification Tracking instrument specifications. If the user were to directly edit the contents of these critical fields, the system could no longer be assured of their data integrity. It is therefore necessary to provide a means of modifying the content of the fields while preserving numerically critical content. A special editor page is provided for each of these fields to make this possible. These editors should be used to modify these fields. If a user directly edits the fields, all UUT specification and Specification Tracking Instrument references are dropped and the data sheet row looses all of its intelligence.

Figure 34:
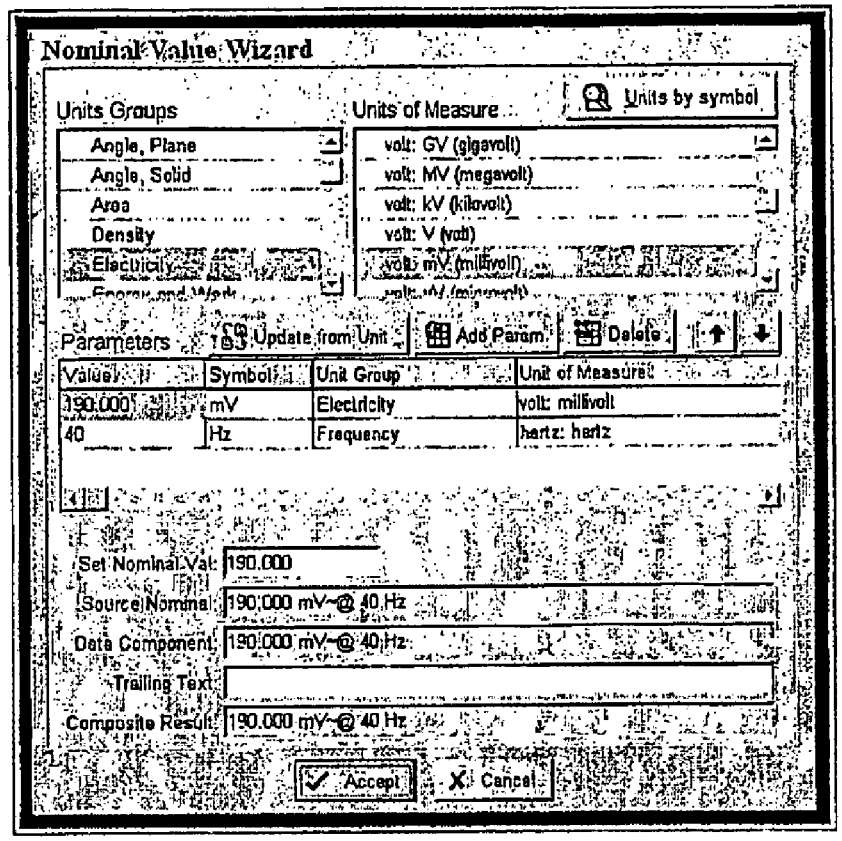

FIG. 34 is a representation of what the Nominal Value Wizard page looks like. The Nominal Value Wizard allows the user to configure the Nominal Value field of a data sheet row. All formatting is handled by the wizard. The user can edit the trailing text field without invalidating the field's data integrity, but any changes to fields parametric values will invalidate any Specification Tracking Instrument range references. Changing the first parameter will invalidate all specification data for the data sheet row. Calibration Process Manger uses the first parameter of the nominal value field as its reference for the nominal value of calibration data collected. If data integrity is compromised, you must recalculate tolerances using the integrated tolerance calculator and reassign Specification Tracking instrument ranges. The Nominal Value Wizard page contains the interface features in Table 29.

Figure 35:
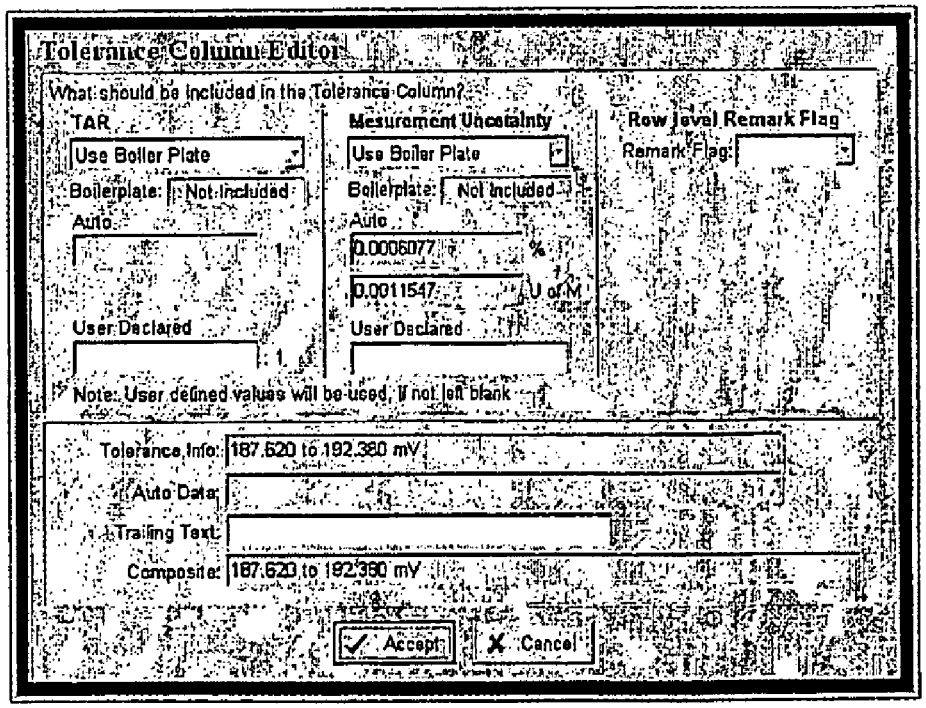

FIG. 35 is a representation of what the Tolerance Column Wizard page looks like. The Tolerance Column Wizard allows the user to configure the Tolerance field of a data sheet row. All formatting is handled by the wizard. The user can edit the TAR, EMU, remark flag, and trailing text field without invalidating the field's data integrity. Calibration Process Manger uses the Tolerance field content to assess the in tolerance condition of calibration data collected. If data integrity is compromised, you must recalculate tolerances using the integrated tolerance calculator. The Tolerance Column Wizard page contains the interface features in Table 30.

Figure 36:
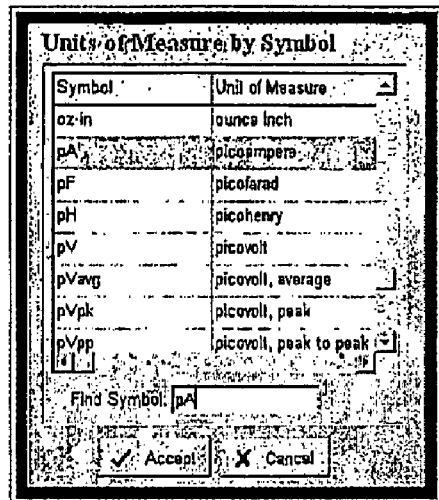

FIG. 36 is a representation of what the Unit of Measure by Symbol page looks like, The Unit of Measure by Symbol page allows the user to search for a desired unit of measure by its symbol. The form is activated by clicking on the main form's Units button when the main form is in the Data Sheet Designer mode and the Lock Status' Edit option is selected. The Unit of Measure by Symbol page contains the interface features in Table.

The Test Point Generation Wizard allows the user to pre-define test point values, tolerance format, functions tested descriptions, and boilerplate information. The wizard can contain multiple test point definitions. The tolerance calculator will automatically be configured when the test point definition is selected, and setup an array of test points.

Figure 37:
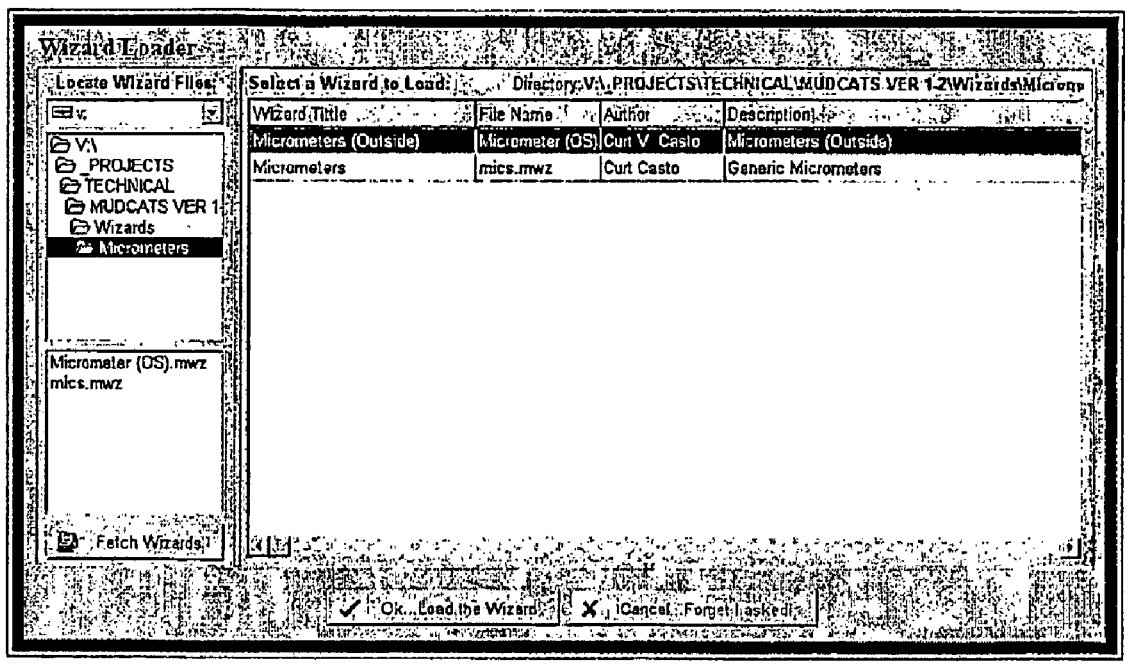

FIG. 37 is a representation of what the Wizard Loader page looks like. The Wizard Loader allows the user to load preset wizards for use in creating data sheets. This page is accessed through the Tools, Wizards, Test Point Wizards, Load menu option. The Wizard Loader page contains the interface features in Table 32.

Figure 38:
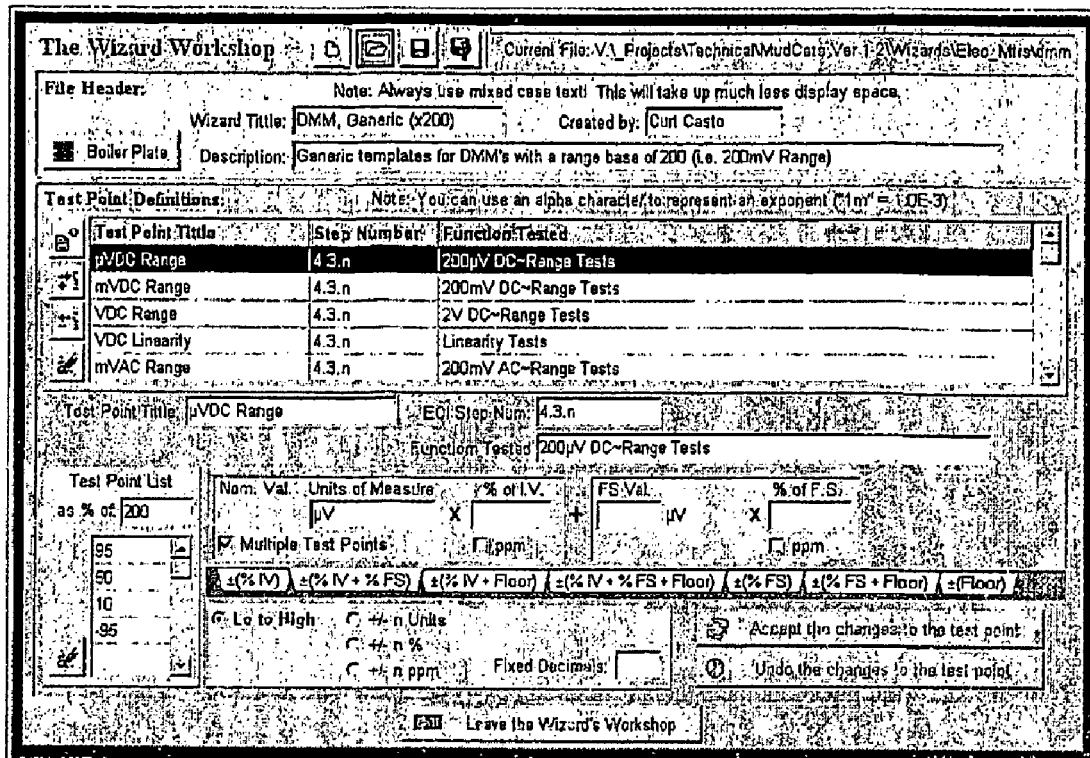

FIG. 38 is a representation of what the Wizard Workshop page looks like. The Wizard Workshop allows the user to create test point wizards for use in creating data sheets. This page is accessed through the tools, wizards, test point generators, load menu item. The Wizard Loader page contains the interface features in Table 33.

The Data Sheet Generation Wizard allows the user to generate a complete data sheet by entering data into a module specifically designed for a specific instrument type. Data sheet wizards posses an advanced of knowledge of the rules applicable to the instruments for which they are designed. Once data sheets are created with the module, they can be edited and manipulated in the same manner as any other data sheet.

Figure 39:
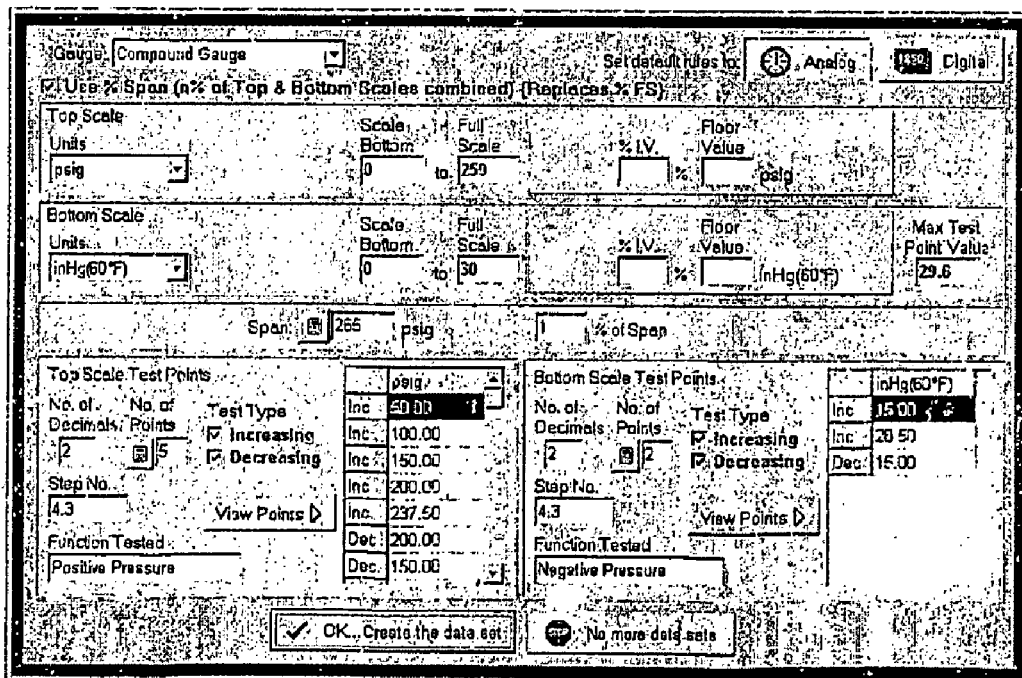

FIG. 39 is a representation of what the Pressure Gauge Data Sheet Generator page looks like. This is a Data Sheet generation wizard that will prompt the user for specific data relating to pressure instruments. Once the data has been inputted the entire data sheet is generated. This page is accessed by using the Tools, Data sheet Generators, Pressure option in the menu bar. The module supports the creation of multiple data sets within a single data sheet, i.e., Multiple sensor modules used with a single reader. Numeric fields on this page will turn red if an improper entry is made and an error message is then displayed.

The Pressure Gauge Data Sheet Generator uses specific information, embedded in the Suite's master units of measure table, to identify "absolute" and "gauge" pressure units of measure. The group names for these units must be "Pressure (absolute)" and "Pressure (gauge)". These two groups contain the units that can be directly cross referenced to each other. Changing the group names or adding units that don't cross reference may cause errors in the Pressure Gauge Data Sheet Generator module. The Pressure Gauge Data Sheet Generator page contains the interface features in Table 34.

Figure 40:
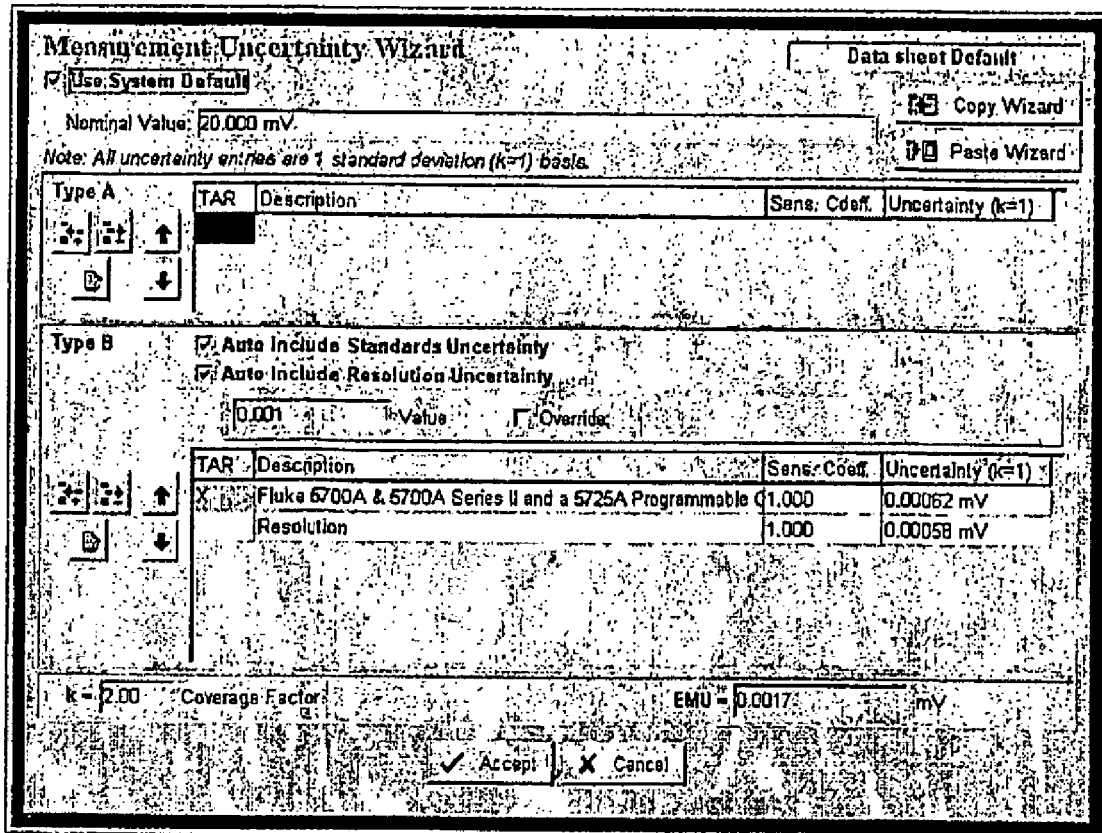

FIG. 40 is a representation of what the Test Point Uncertainty Wizard page looks like. The Test Point Uncertainty Wizard page is accessed from the Process Manger's main page when the main page is in the Data Sheet Designer mode. Click on the Measurement Uncertainty button (this is the button with the Σ symbol). The Test Point Uncertainty Wizard is used to view and edit the currently selected test point's measurement uncertainty model. The Calibration Process Manager will automatically manage the measurement uncertainty model when one or more Specification Tracking instrument ranges are assigned to the test point. The user can modify this model if the user has the necessary permissions. A fixed uncertainty value can also entered into the Tolerance Column Wizard page. If a value is entered directly into the Tolerance Column Wizard page, that value will override the uncertainty model.

The user can enter both type A and type B uncertainties. Some of the values used by the measurement uncertainty model can be set in the System Configuration page's "Measurement Uncty" configuration options. The measurement uncertainty model is also used in the calculation of the test accuracy ratio when directed to do so in the System Configuration page's "Measurement Uncty" configuration options.

The uncertainty model, test accuracy ratio, and applicable displayed results are always relevant to the currently selected Specification Tracking Interface mode. When in the Stanards used mode, the Model is using the actual calibration standards' specifications, when in the Default Standards mode, the model is using the default standards' specifications, etc. The values displayed will vary as the Specification Tracking Interface mode is changed. Pay close attention to the Specification Tracking Interface mode indicators in the data sheet's Nominal Value column. The Test Point Uncertainty Wizard page contains the interface features in Table 35.

Figure 41:
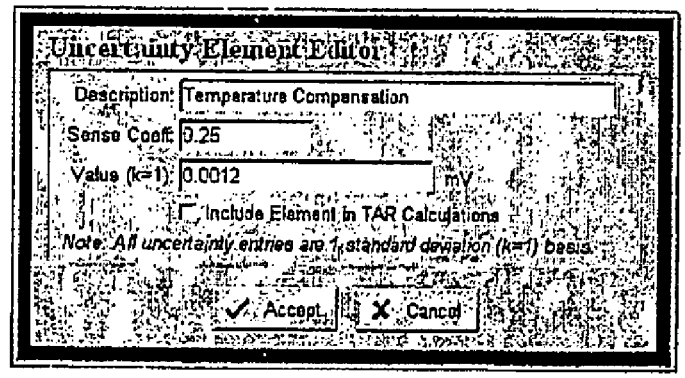

FIG. 41 is a representation of what the Uncertainty Element Editor Page looks like. The Uncertainty Element Editor Page allows the user to edit parameters of an uncertainty element.

The Uncertainty Element Editor Page contains the interface features in Table 36.

Specification Tracking

The Specification Tracking system records and manages instrument specifications. Specification Tracking was primarily designed for use with the Calibration Process Manager. The Calibration Process Manager has a built in interface to use the specification data stored within the Specification Tracking database system.

Specification Tracking defines instruments using three hierarchical categories: Instruments, Functions and Ranges. The instrument is subdivided into instrument functions, which are subdivided into instrument ranges. Once an instrument is assigned to a data sheet, its ranges can then be assigned to individual data sheet rows. Calibration Process Manager has tools to automate the range selection process.

Specification Tracking Instruments make use of the underlying system of serialization in the CPMS that provides unique serial numbers to both the instrument and individual instrument ranges. As explained below, each instrument and range is assigned two serial numbers: A Permanent Unique Identifier (PUI) and a Dynamically Unique Identifier (DUI). The PUI is assigned when an object is created or altered in a manner that would make it unlinkable to its past usage. The DUI is assigned any time the object is modified/saved. These unique identifiers allow the Calibration Process Manager to track and relate linkages of these objects for historical and statistical purposes. Once assigned to a data sheet, these serial numbers form a permanent link between the data sheet/Calibration and the instrument's applicable ranges.

When instrument ranges are assigned to data sheet rows the Calibration Process Manager can use the data to determine Test Accuracy Ratios, Estimated Measurement Uncertainties, Instrument range utilization, and assist in the failure analysis of calibration standards.

The interface has three modes that correspond to each of the three instrument specification data applications used within the Calibration Process Manager. The Specification Tracking Interface mode indicators allow the user to determine which mode of the Specification Tracking Interface is active, even when the Specification Tracking Instruments Interface is not visible.

The Calibration Process Manager's test point measurement uncertainty model, test accuracy ratio, and applicable displayed results are always relevant to the currently selected Specification Tracking Interface mode. i.e.: When in the Stanards used mode, the Model is using the actual calibration standards' specifications, when in the Default Standards mode, the model is using the default standards' specifications, etc. The values displayed will vary as the Specification Tracking Interface mode is changed. The following table describes the three modal applications of specification data. In the "Myself" mode the Specification Tracking instrument ranges of the instrument to be calibrated are assigned to applicable data sheet rows. This self definition information is used when the instrument to be calibrated is, itself, used as a calibration standard. When a calibration record is loaded into the Calibration Process Manger, the Statistics mode can be used to generate an Instrument Range Utilization Report. The report is generated for the currently selected data sheet row's applicable Specification Tracking instrument range. The report shows the instrument ranges' use in other calibrations. This report is extremely useful in performing calibration standard failure analysis.

The "Def Stds" mode allows the data sheet designer to assign calibration standard instruments to the data sheet and assign instrument ranges to data sheet rows. These assignments represent the default standards, with range assignments, recommended for use when actual calibrations are performed. If default standards are assigned, the user has only to click on the "Stds Used" pages' "Use 'Default' stds" button to transfer these predetermined selections to "Stds Used". The data derived through these assignments will also permit the Calibration Process Manager to estimate accuracies, accuracy ratio's and estimated measurement uncertainties to assist the data sheet designer in determining the adequacy of test conditions.

The "Stds Used" mode is designed to assign calibration standard instruments to the data sheet and assign instrument ranges to data sheet rows at the time of calibration. The user will also assign the specific instrument asset numbers for the standards used. The data derived through these assignments will permit the Calibration Process Manager to calculate, record, and report test accuracy ratio's and estimated measurement uncertainties for data sheet test points. The modes are in table 37.

The Specification Tracking Instruments Interface opens in the lower portion of the screen. The data sheet grid is reduced in height by approximately a third, in order to accommodate the Specification Tracking Instruments Interface. The Specification Tracking Instruments Interface can be opened by selecting the View, Show Specification Tracking Instruments menu option.

Figure 42:
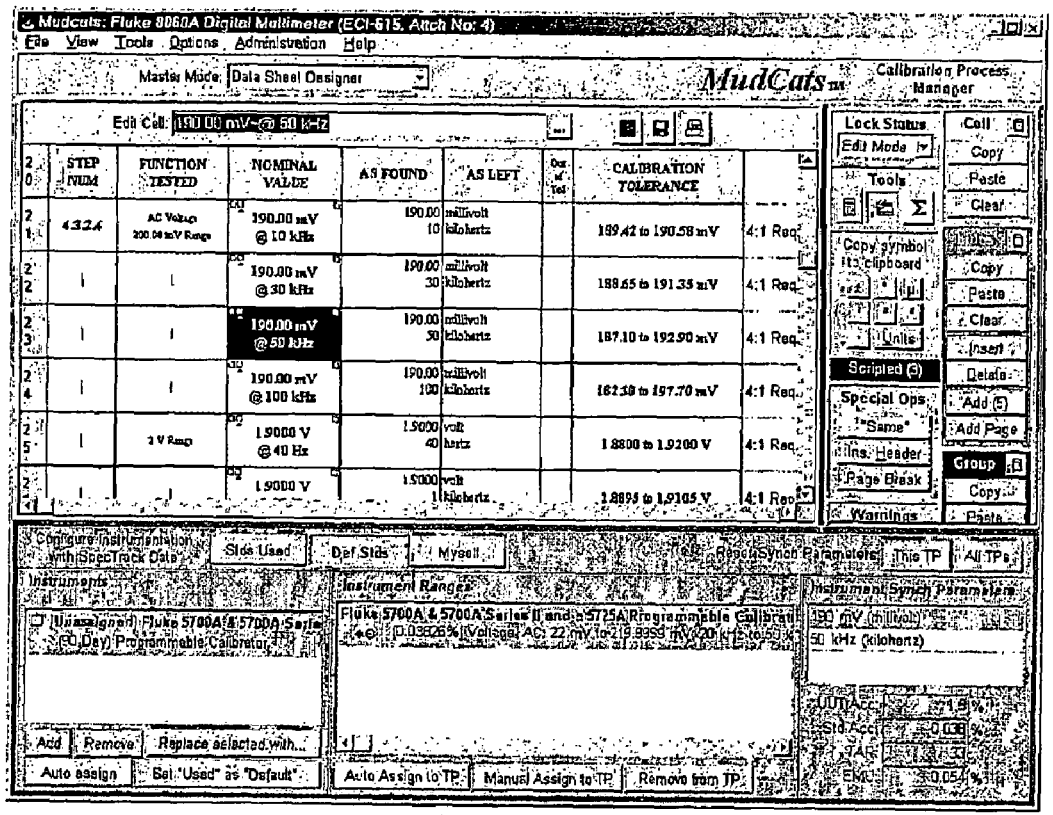

FIG. 42 is a representation of what the Calibration Process Manger's main page (Data Sheet Designer mode) looks like with the Specification Tracking Instruments Interface displayed.

Figure 43:
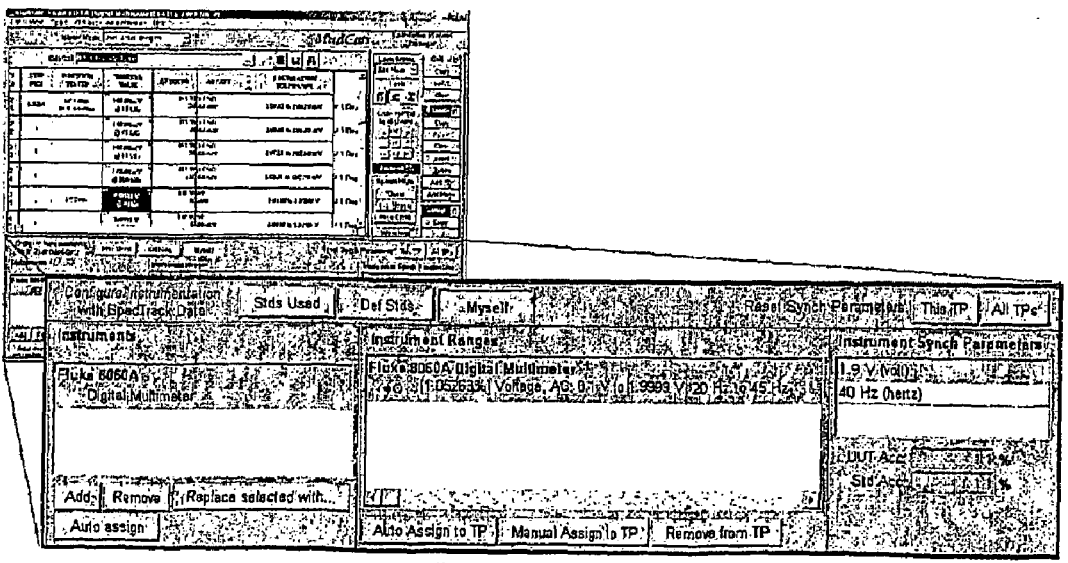

FIG. 43 is a representation of what the Specification Tracking Instruments Interface (Myself mode) looks like. In the Myself mode, specifications of the instrument being calibrated are assigned to the instrument itself. This self definition information is used to associate an instrument's calibration test points with its Specification Tracking instrument ranges. The process synchronizes Specification Tracking instrument and range serial numbers with the data sheet that calibrates the instrument. This identification process allows the Calibration Process Manger to link the usage of an instrument range to the data sheet on which it is calibrated.

This self awareness is especially important when the instrument is a calibration standard. When a calibration record is loaded into the Calibration Process Manger, the Statistics mode can be used to generate an Instrument Range Utilization Report. The report is generated for the currently selected data sheet row's applicable Specification Tracking instrument range. The report shows the instrument ranges' use in other calibrations. This report is extremely useful in performing calibration standard failure analysis.

Another reason to perform this assignment is to compare data sheet specifications with Specification Tracking specifications. When performing an auto-assignment of instrument ranges to the data sheet, Calibration Process Manager will not auto assign an instrument range to a data sheet row if the calculated accuracies do not agree within 0.1% of each other. If the Calibration Process Manager is unable to make a range assignment, either the data sheet or instrument's specifications are in error.

The Specification Tracking Instruments Interface (Myself mode) contains the interface features in Table 38.

Figure 44:
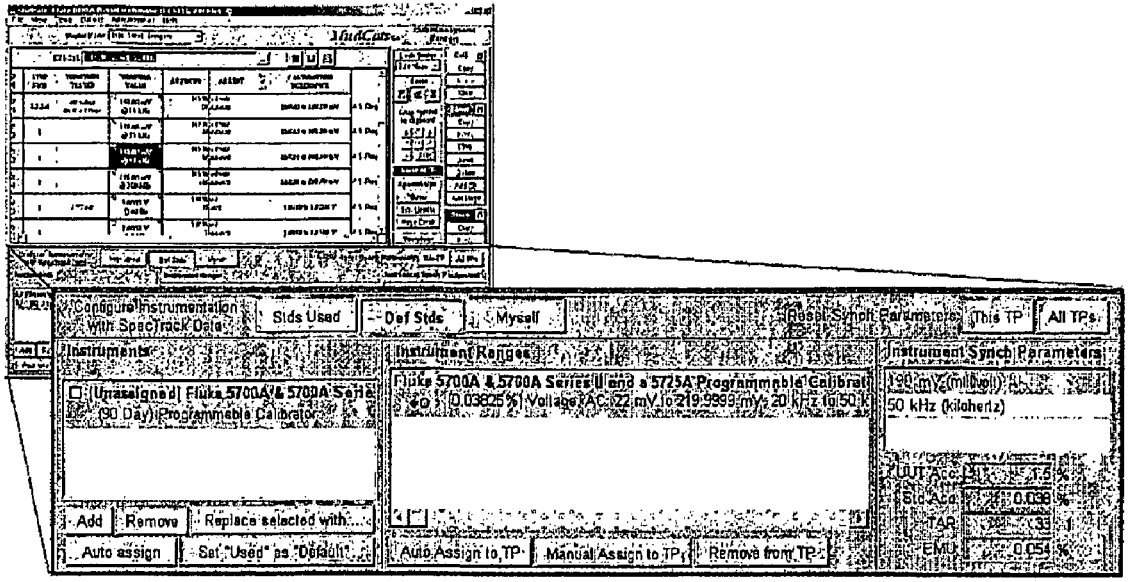

FIG. 44 is a representation of what the Specification Tracking Instruments Interface (Default Standards mode) looks like. In the Default Standards mode, specifications of the standards, planned for use during the execution of the data sheet (calibration), are assigned to the data sheet. This assignment of Specification Tracking instruments and instrument ranges to a data sheet's test points will enable the data sheet designer to pre-define a desired test point instrumentation configuration. When a user performs an actual calibration, with the data sheet, the user can select the Standards Used mode's "Use 'Default' Stds" button to copy the pre-defined configuration to the Standards Used configuration. The only other thing the user will have to do is assign asset numbers to the actual standards used. Another important purpose for assigning default standards is to provide the Calibration process Manger with the information necessary to calculate standards accuracies, test accuracy ratios, and estimated measurement uncertainty. This information is very useful in the calibration design process. The Specification Tracking Instruments Interface (Default Standards mode) contains the interface features in Table 39.

Figure 45:
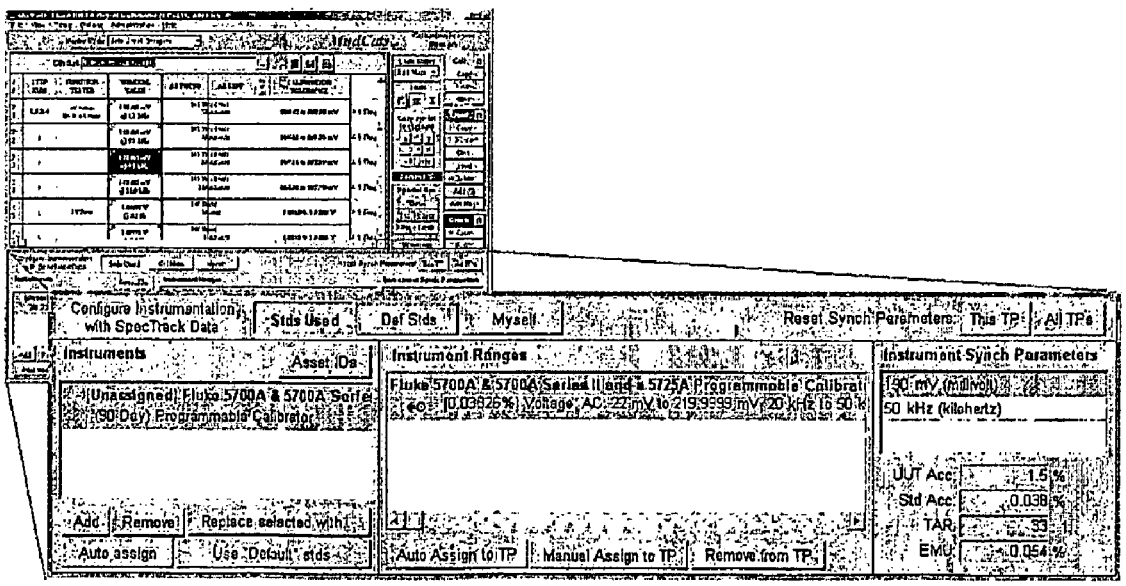

FIG. 45 is a representation of what the Specification Tracking Instruments Interface (Standards Used mode) looks like. In the Standards Used mode, specifications of the standards used during calibration are assigned. When a user performs a calibration, the user can click the "Use 'Default' Stds" button to copy the pre-defined default standards configuration to the Standards Used configuration. The only other thing the user will have to do is assign asset numbers to the actual standards used. If no default configuration is available or another configuration is used, the User can configure the standards at the time of calibration.

By associating the standards and standard ranges used during the calibration, to the data sheet test points, standard range utilization reporting can be achieved and greatly reduce the work required to perform standards failure analysis. The standard range data is also critical to the Calibration Process Manager's ability to calculate standards accuracies, test accuracy ratios and build an uncertainty model to calculate estimated measurement uncertainties. The Specification Tracking Instruments Interface (Standards Used mode) contains the interface features in Table 40.

Figure 46:
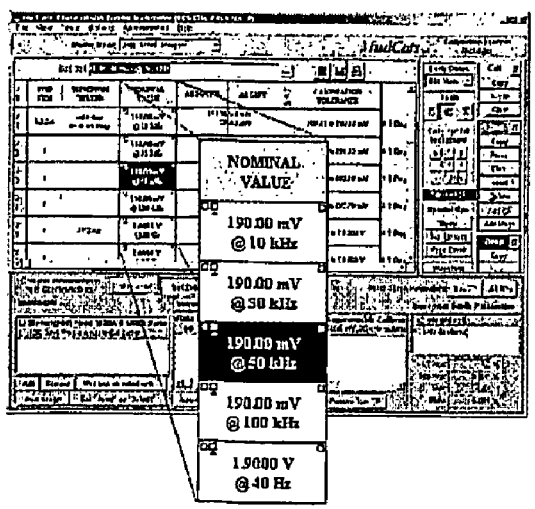

FIG. 46 is a representation of what the Specification Tracking Interface mode indicators look like. The Specification Tracking Interface mode indicators allow the user to determine which mode of the Specification Tracking Interface is active, even when the Specification Tracking Instruments Interface is not visible. Each cell of the data sheet's Nominal Value column will have three small boxes located at the top of the cell. The indicators are only present in actual test point rows of the data sheet. The indicators appear in the same order as the mode selection buttons in the Specification Tracking Instruments Interface. A carrot symbol (▲) under one of the indicators indicates the present mode. The presence and color of the symbols convey meaning to the status of instrument ranges assigned, or not assigned, to the test point. The Specification Tracking Interface mode indicators convey the information in Table 41.

Figure 47:
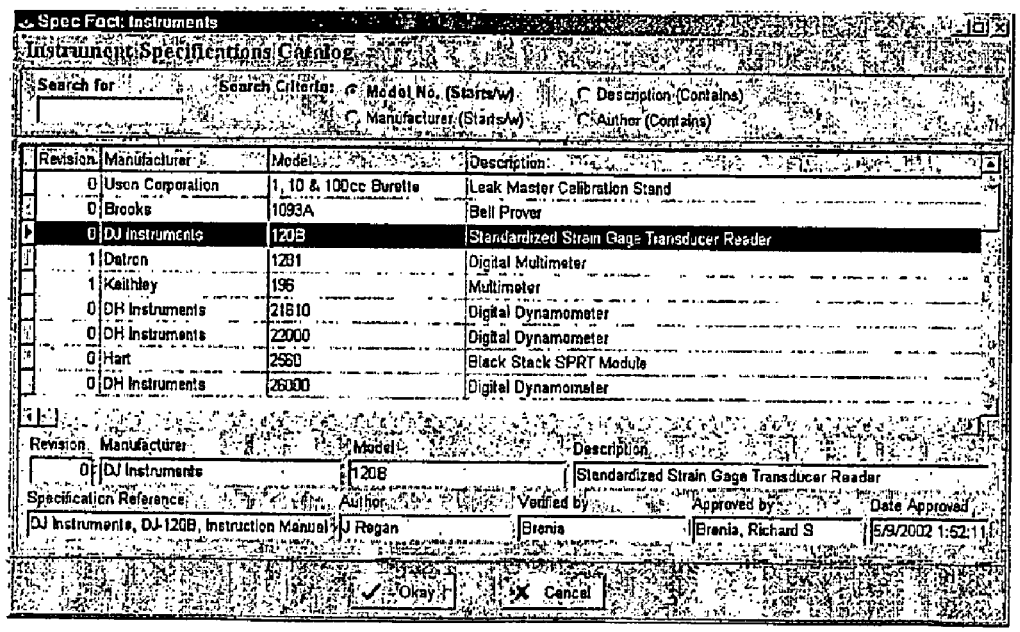

FIG. 47 is a representation of what the Instrument Specifications Catalog page looks like.

The Instrument Specifications Catalog page allows the user to choose an instrument to add to a data sheet. The Instrument Specifications Catalog page is accessed from the Calibration Process Manager's main page's Specification Tracking Instruments Interface by clicking on the Add button while in any of the three Specification Tracking Interface modes. The Instrument Specifications Catalog page contains the interface features in Table 42.

Figure 48:
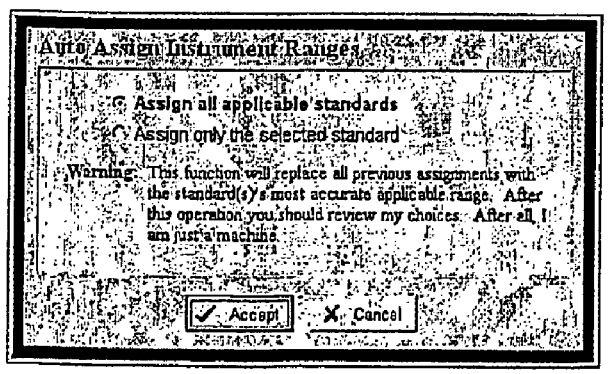

FIG. 48 is a representation of what the Auto Assign Instrument Ranges page looks like. The Auto Assign Instrument Ranges page is displayed when the user clicks the Auto Assign button, located on the Specification Tracking Instruments Interface's instrument section, while in any of the three Specification Tracking Interface modes. The Auto Assign Instrument Ranges page is displayed to inquire if the assignment is for the instrument currently selected in the Specification Tracking Instruments Interface's Instrument List grid or if the assignment is for all instruments assigned to the data sheet. The page also displays the following warning to the user describing the limitations of automatic instrument range selection: "Warning: This function will replace all previous assignments with the standard(s) most accurate range. After this operation, you should review my choices. After all, I am just a machine."

Although auto selection is capable of choosing an inappropriate range, based on parametric matching and best accuracy, it is usually a good idea to let the Calibration Process Manager have a try at auto selecting the ranges. It is usually easier to change the few inappropriate selections than it is to do them all manually. Of course, the user's experience with the system and knowledge of the parametric matching probability of the instruments in question, is the best determination of the time saved by auto matching. This page contains the interface features in Table 43.

Figure 49:
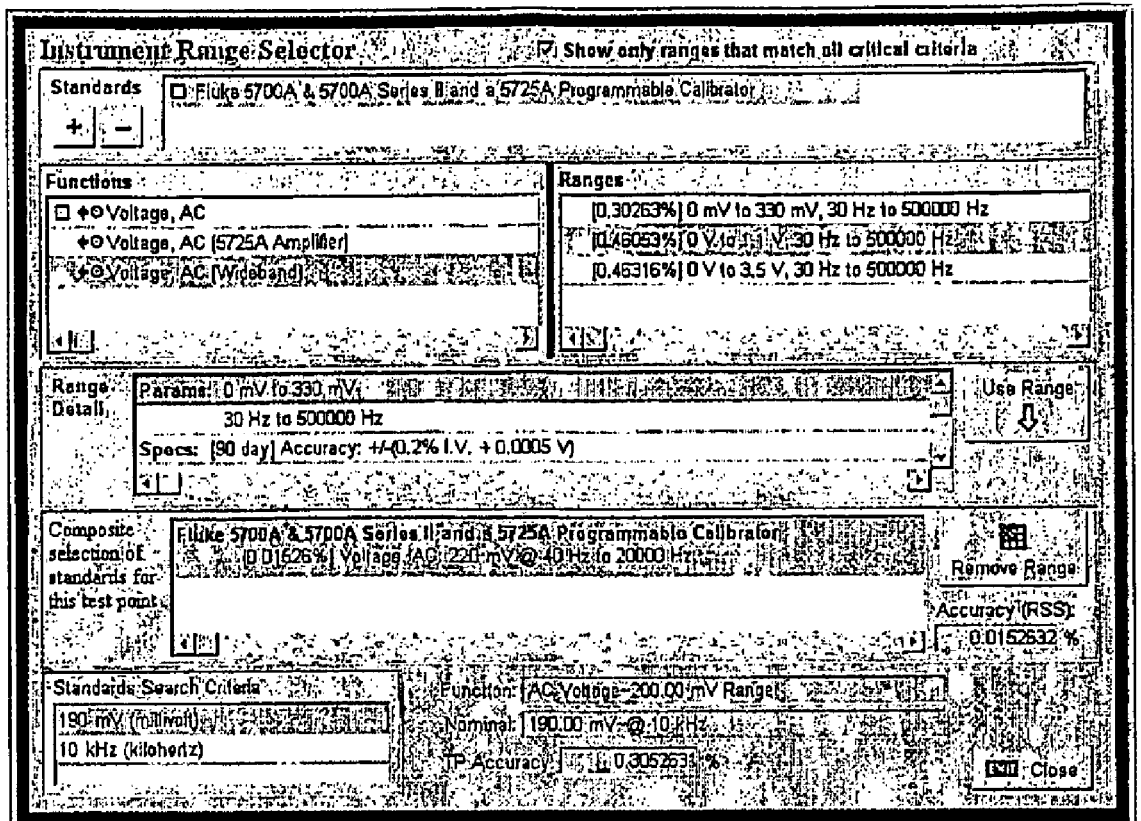

FIG. 49 is a representation of what the Manual Instrument Range Selector page looks like.

When the Calibration Process Manager is unable to auto select an instrument range or selects an inappropriate instrument range for a test point, the user must intervene. This intervention is performed using the Manual Instrument Range Selector. The Manual Instrument Range Selector page is accessed from the Calibration Process Manager's main page's Specification Tracking Instruments Interface by clicking on the Manual Assign to TP button while in any of the three Specification Tracking Interface modes. This page contains the interface features in Table 44.

Figure 50:

FIG. 50 is a representation of what the Instrument Substitution page looks like. The Instrument Substitution page is displayed when clicking the "Replace selected with" button on the Calibration Process Manager's main page's Specification Tracking Instruments Interface. This button is available while in any of the three Specification Tracking Interface modes.

The Instrument Substitution page is used to remove the currently selected instrument's range assignments from all data sheet test point rows and replace those assignments with ranges from the instrument selected on the Instrument Substitution page. The Calibration Process Manager will attempt to make range assignments for the newly selected instrument. Assignments will only be made for test point rows that had a range assigned for the instrument being replaced. All range assignments for the instrument being replaced will be removed, even if the newly selected instrument does not have an applicable range to assign in its place. This behavior is designed to reduce confusion as to why the removed instrument might still have ranges assigned to the data sheet.

The Instrument Substitution page also displays the following warning: "Warning: You should review all test points after this operation to ensure my selections are appropriate to the test point application. After all I will select ranges that meet my requirements, but the question is do they meet yours?" This page contains the interface features in Table 45.

Figure 51:
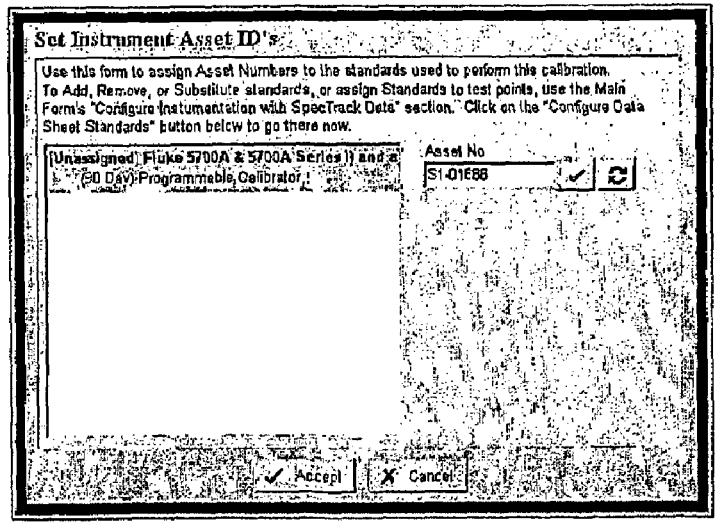

FIG. 51 is a representation of what the Set Instrument Asset ID's page looks like. Asset ID's should be assigned to each standard used while performing a calibration. This option is only available when in the Specification Tracking Interface Standards Used mode (applicable only during an actual calibration). The Set Instrument Asset ID's page is accessed from the Calibration Process Manager's main page's Specification Tracking Instruments Interface by clicking on the Asset IDs button while in the Specification Tracking Interface "Stds Used" mode. This page contains the interface features in Table 46.

Calibration Process Manager is designed to automate data sheets for the calibration of measuring and test equipment. Once designed, Calibration Process Manager data sheets can then be used to collect and store calibration data for up to eight instruments simultaneously. Automation scripting can be added to these data sheets to configure instruments, capture data, perform mathematical operations, and create instrument test points dynamically.

The scripted data sheet may result in a completely unattended calibration, a series of user prompts and calculations, or only one row of a data sheet may have automation scripting. This flexibility is designed to maximize calibration productivity while minimizing the data sheet design process.

Whatever your choices in script design, the starting point is always a data sheet. The data sheet can be edited before, during, and after the automation scripting process.

The Calibration Process Manager will allow the user to add and configure scripting commands to any row of a data sheet. The system will allow the operator to cut and paste individual script commands, a series of script commands, or entire data sheet rows. Each row of a data sheet is an independent island of automation scripting. These islands can be bridged together by navigation script commands that produce a continuous execution of all or a portion of a data sheet.

Any data sheet can have scripting commands. The automation scripting editor manages the relationship of automation commands to data sheet rows.

The Calibration Process Manager's automation scripting system is based on the grouped and sequenced execution of parameterized script commands. Appendix C describes each of the commands available and their parameters. Note: Most command parameters allow the use of a user defined variable in place of a hard coded (fixed) value.

With the Master Mode is set to Data Collection, the View, Show Script menu option displays the command list box in the lower right corner of the screen. The data sheet grid is reduced in width by approximately half, in order to accommodate the command list box. The command list box contains the interface features in Table 47.

Figure 52:
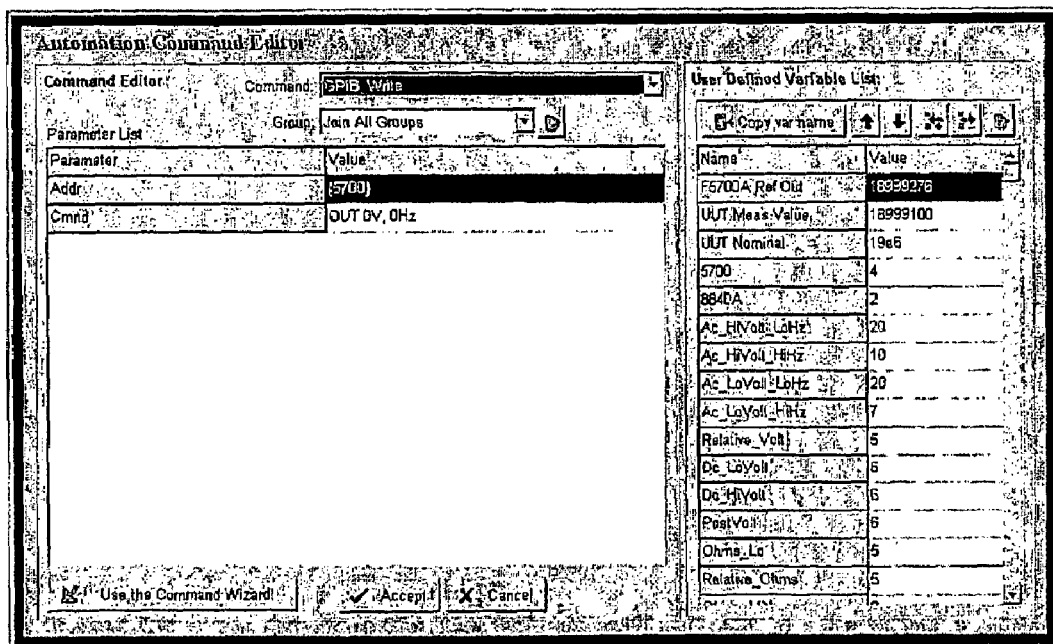

FIG. 52 is a representation of what the Automation Command Editor page looks like. This page allows the user to select and configure commands to be used in an automation script. This page also allows the user to assign the command to a command group to facilitate sequential execution of a collection of commands. As script commands represent the principle usage of user defined variables, this page is where the data sheet's user defined variables are managed. This page contains the interface features in Table 48.

FIG. 53 is a representation of what the Data Sheet Variables page looks like. The data sheet variables page allows the user to see the present content of all data sheet variables. The Automation scripting system uses these variables in many ways such as: Command parameter values, in equations, to hold user query values, etc. Any command parameter may have a user defined variable used in place of a direct value.

FIG. 54 is a representation of what the Data Sheet Variable Editor page looks like. The data sheet variable editor page allows the user to create and edit data sheet variables. This page contains the interface features in Table 49.

FIG. 55 is a representation of what the Command Group Editor page looks like. The Command Group Editor page is where the user can create command groups. Only one each, of command groups may be added into the list. Calibration Process Manager will display a warning screen if the user attempts to add a second iteration of a command group. Command groups are used to bind a set of commands into a command sequence. There are two types of command groups.

Interface Groups. These groups can be defined by the script author. When the user invokes the command menu, a unique list of all interface groups in the script, for the selected data sheet row, will appear on the menu. The Script author may assign a numeric "Key" value in the range of 0-9 to each interface group. The "Key" value will be displayed to the left of each item on the command menu. When the user presses the corresponding key, all of the commands assigned to the selected group are executed sequentially. Interface groups are displayed with a black font in the scripting system when created by the script author.

System Groups. These groups may not be edited by user or have "Key" values assigned to them. Their purpose is to bind script commands together for special behaviors that are programmed into the Calibration Process Manger's scripting system.

System and Interface groups may both be used within the same data sheet row to achieve a desired effect. While some script commands are designed to operate without being assigned to a command group, most commands will not execute unless they have a command group assigned to them.

This Command Group Editor page contains the interface features in Table 50.

Figure 56:
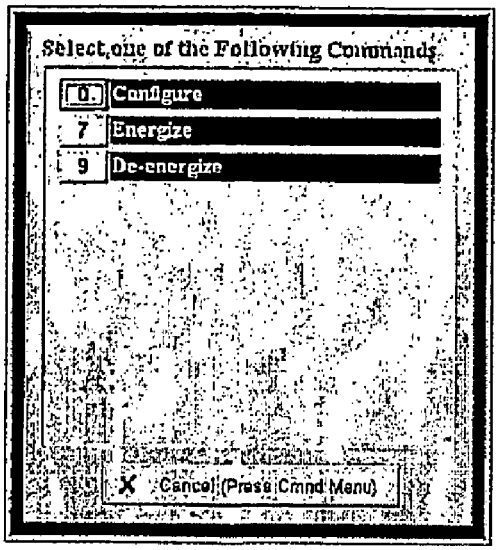

FIG. 56 is a representation of what the User Interface Command Menu page looks like. The User Interface Command Menu page can be displayed when the Calibration Process Manger's main page is in the Data Collection Mode, a data sheet is loaded, and a data sheet row is selected that has at least one Interface Group assigned in its automation script command list. Once the above criteria is met the User Interface Command Menu page can be displayed by clicking the Run button, pressing the F12 key, or pressing the Command Menu button on the optional Quick Data Entry pad.

When the user invokes the command menu, a unique list of all interface groups in the script, for the selected data sheet row, will appear on the menu. When the user presses the corresponding key, all of the commands assigned to the selected group are executed sequentially. This page contains the interface features in Table 51.

Figure 57:
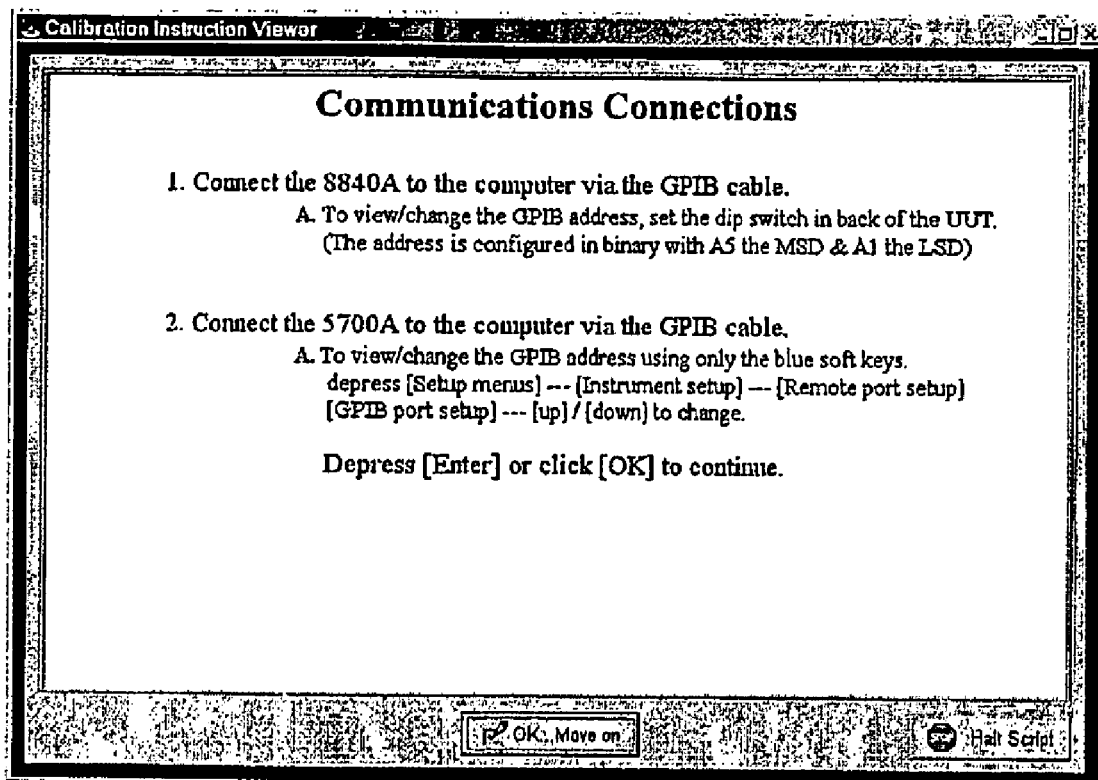

FIG. 57 is a representation of what the Calibration Instruction Viewer page looks like. This page will display information about steps that need to be taken in order to perform a successful test. The information and instructions are set by the user in the Calibration Instruction Editor. It will prompt the user by opening a message window which contains information like: "ensure the unit is connected to the system", and "test connections." Issue warnings, such as: "High Voltage will be present during these tests", and give information on how long a step will take before user intervention is required again. The calibration instructions viewer window has two buttons: O.K. move on, and Halt Script. The test will not proceed until the user presses the O.K. buttons. Pressing the Halt button will end the execution of the script.

Figure 58:

FIG. 58 is a representation of what the Select a Calibration Instruction page looks like. This page allows the user to create instruction pages to assist during test execution. The page displays a list of the current instructions and allows for the addition of new instructions, removal of old instructions, and editing of all instructions.

Figure 59:
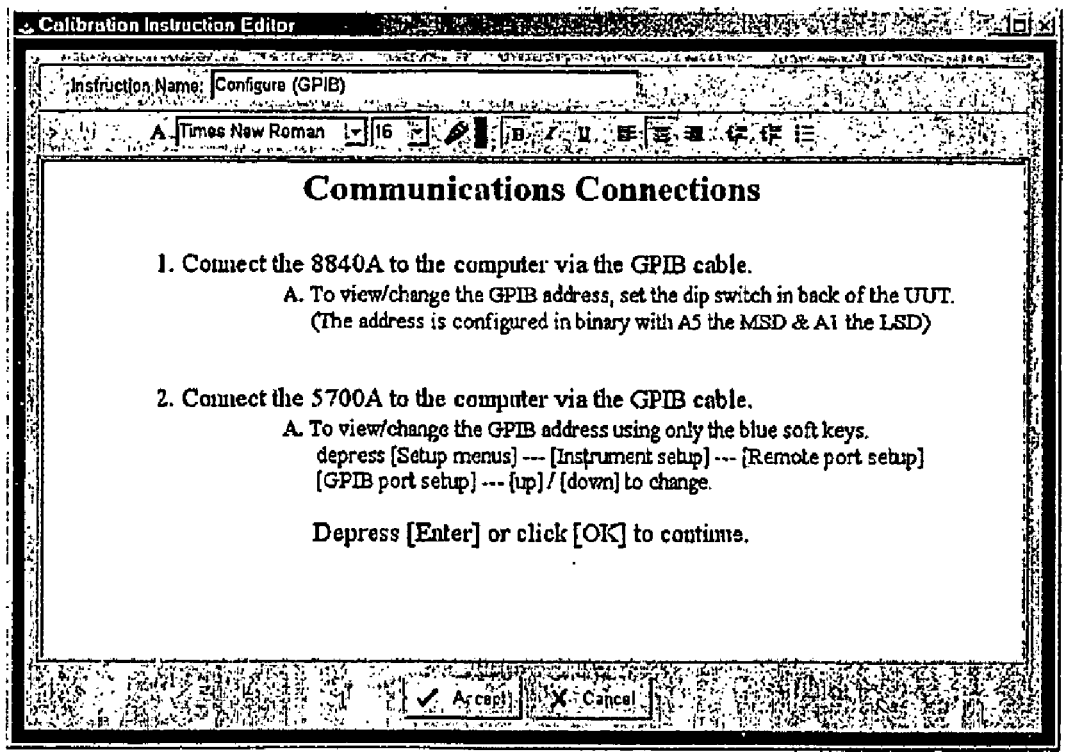

FIG. 59 is a representation of what the Calibration Instruction Editor page looks like. This page allows the user to edit calibration instructions.

Figure 60:
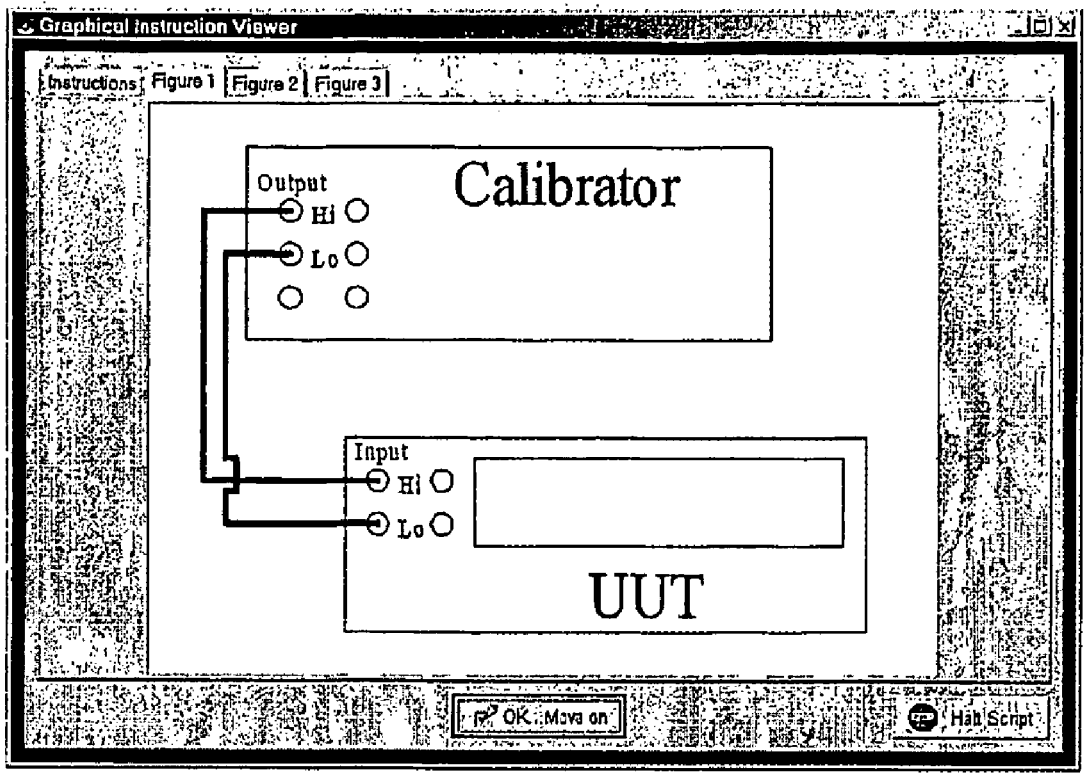

FIG. 60 is a representation of what the Graphical Instruction Viewer page looks like. This page allows the user to view instructions and graphical images to assist during test execution. The Instructions tab displays calibration instruction text. The text can be viewed by clicking on the tab.

Figure 61:
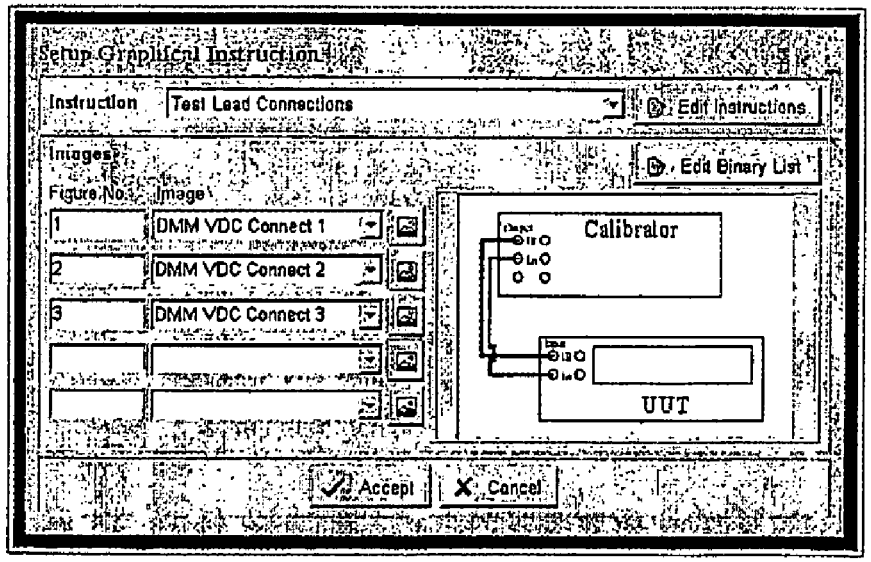

FIG. 61 is a representation of what the Graphical Instruction Editor page looks like. This page allows the user to build a graphical instruction to assist during test execution. The page displays the name of the currently selected instruction and allows for the selection of other instructions, and the ability to edit instructions. The page also displays the currently selected images, their names, and figure numbers. Up to five images can be selected in this embodiment. The edit Binary List button provides the ability to add and remove images from the data sheet's Binary Resource List. This page contains the interface features in Table 52.

Figure 62:
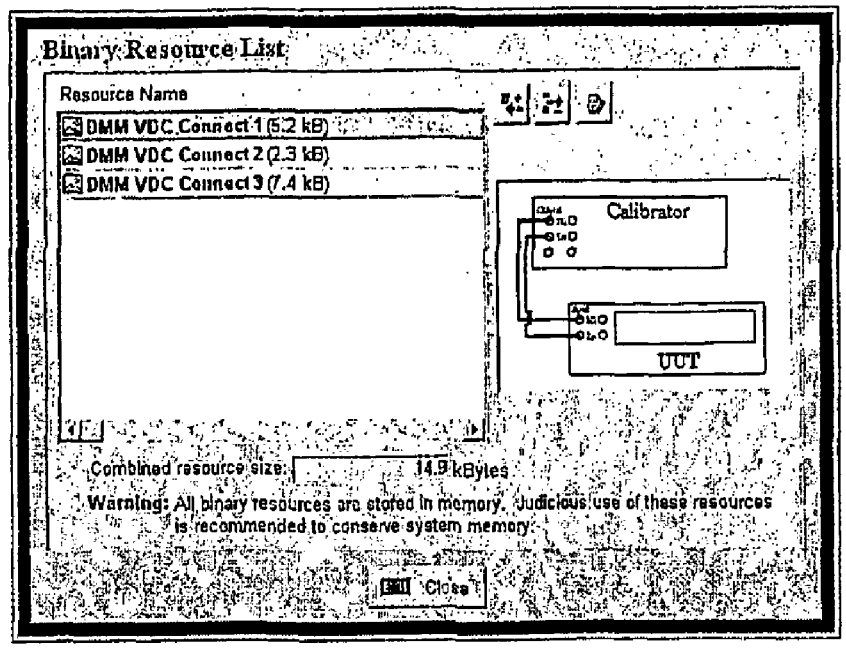

FIG. 62 is a representation of what the Binary Resource List page looks like. This page allows the user to manage binary resources contained within the data sheet. The page displays a list of the binary resources stored in memory and allows for the addition of new resources, removal of old resources, and editing of all resource names. As of the present version, the Calibration Process Manager only supports image files in the Binary Resource List, but this list will contain other types of files in the future. Resource files are stored in the database with the data sheet and are exported as files when the data sheet is exported to a file. This page contains the interface features in Table 53.

Figure 63:
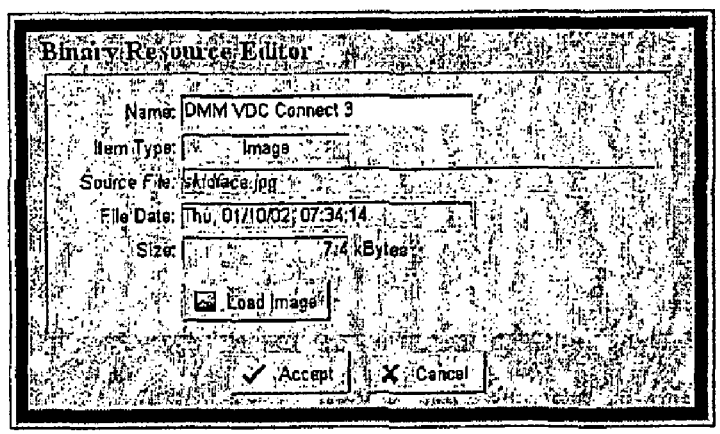

FIG. 63 is a representation of what the Binary Resource Editor page looks like. This page allows the user to add a binary resource from an external file and edit the name of the resource. This page contains the interface features in Table 54.

Figure 64:
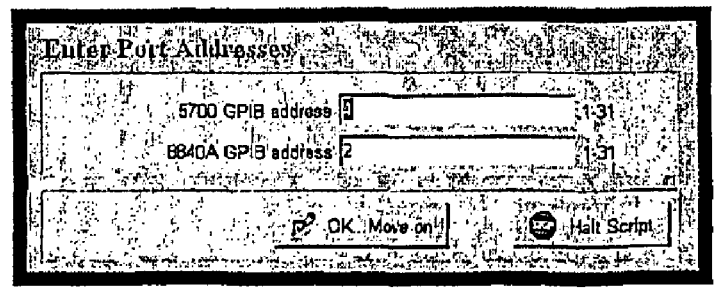

FIG. 64 is a representation of what the User Query Prompt page looks like. This page appears when the Sys_UserQuery command is executed. The Query User Prompt will assign values, entered by the user, into the assigned user defined variables. The Prompt is designed using the User Query Wizard.

Figures 65, 66:
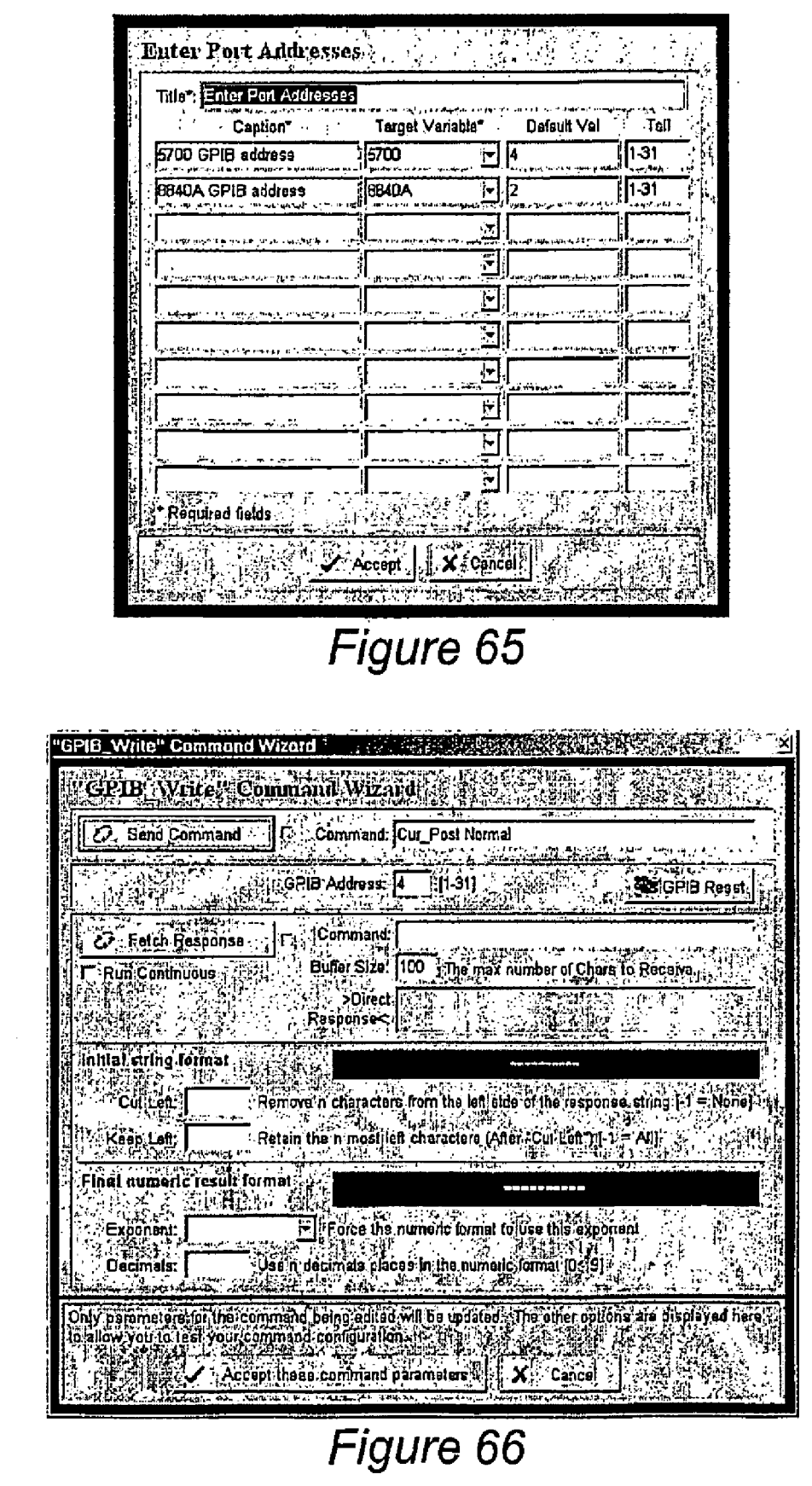

FIG. 65 is a representation of what the User Query Wizard page looks like. This page allows the user to configure parameters for the Sys_UserQuery command's User Query Prompt. This page contains the interface features in Table 55.

FIG. 66 is a representation of what the GPIB Command Wizard page looks like. The GPIB command wizard allows the user to set the parameters for commands used to communicate with GIPB instruments. Clicking the Automation Command Editor's "Use the Command Wizard" button, with one of the GPIB commands selected, opens the GPIB Command Wizard page, described below. The GPIB Command Wizard page contains the interface features in Table 56.

Figure 67:
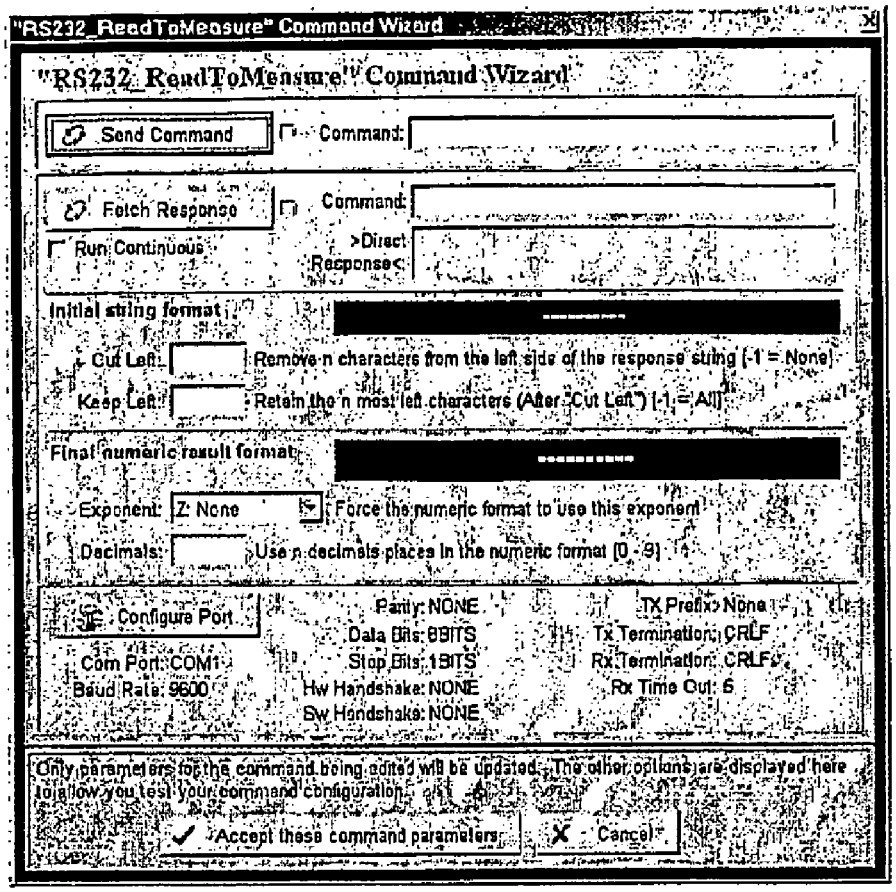

FIG. 67 is a representation of what the RS-232 Command wizard page looks like. The RS-232 Command wizard allows the user to set the parameters for commands that communicate with instruments over a RS-232 connection. Clicking the Automation Command Editor's "Use the Command Wizard" button, with one of the RS-232 commands selected, opens the RS-232 Command Wizard page, described below. This page lists the current settings for the corn port. The settings can be edited using the Configure Port button. The RS-232 Command wizard page contains the interface features in Table 57.

Figure 68:
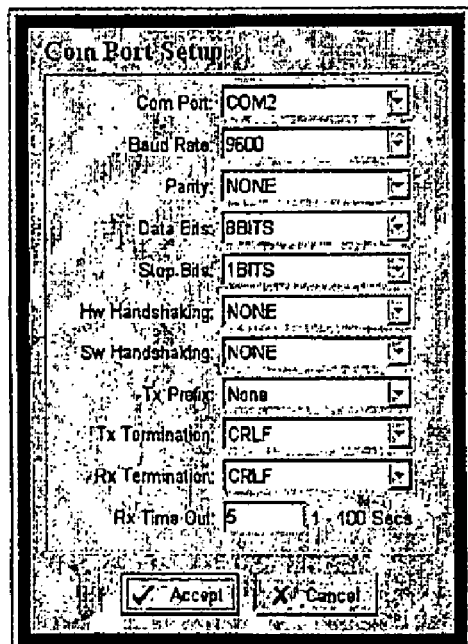

FIG. 68 is a representation of what the Corn Port Setup Page looks like. This page allows the user to set the variables for the corn ports. This information is viewable at the bottom of the RS-232 Command wizard page.

Figure 69:
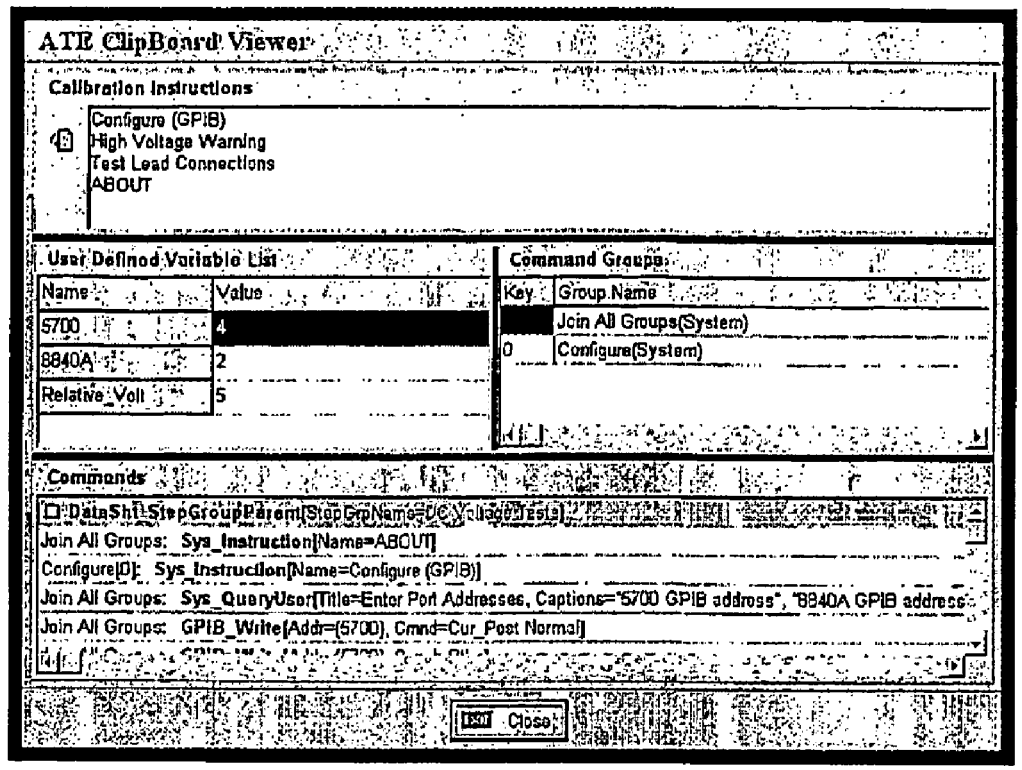

FIG. 69 is a representation of what the ATE Clipboard Viewer page looks like. The ATE Clipboard Viewer allows the user to view the commands and associated objects that are currently held in memory. The ATE Clipboard Viewer contains the interface features in Table 58.

Calibration Process Manager includes several tools that can be used independently to assist the user in performing metrology work. All of the tools in this section are accessed by selecting one of the Tools menu options from the Calibration Process Manager's main page.

Figure 70:
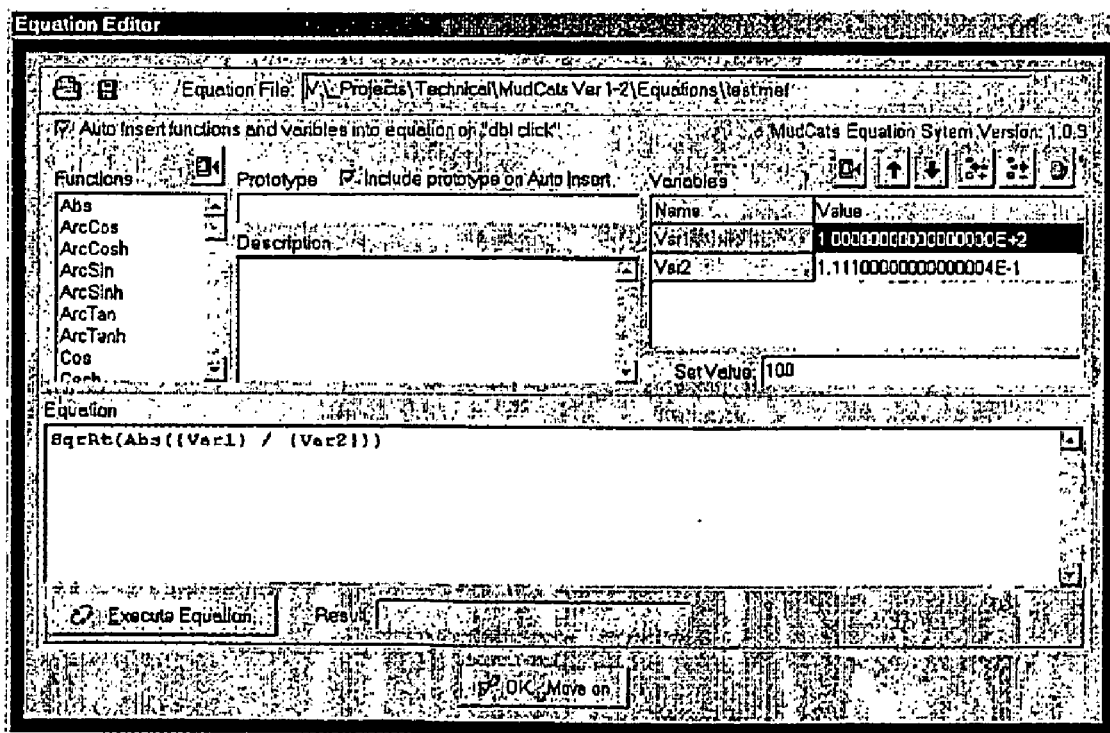

FIG. 70 is a representation of what the Equation Editor page looks like. The Equation Editor page contains the interface features in Table 59.

Figure 71:
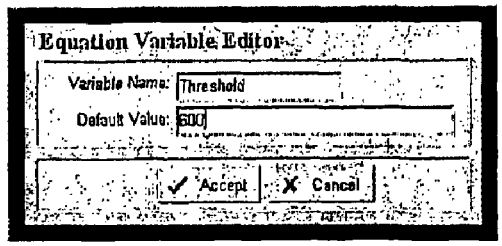

FIG. 71 is a representation of what the Data Sheet Variable Editor page looks like. The Equation Variable Editor Page allows the user to create and edit equation variables.

Figure 72:
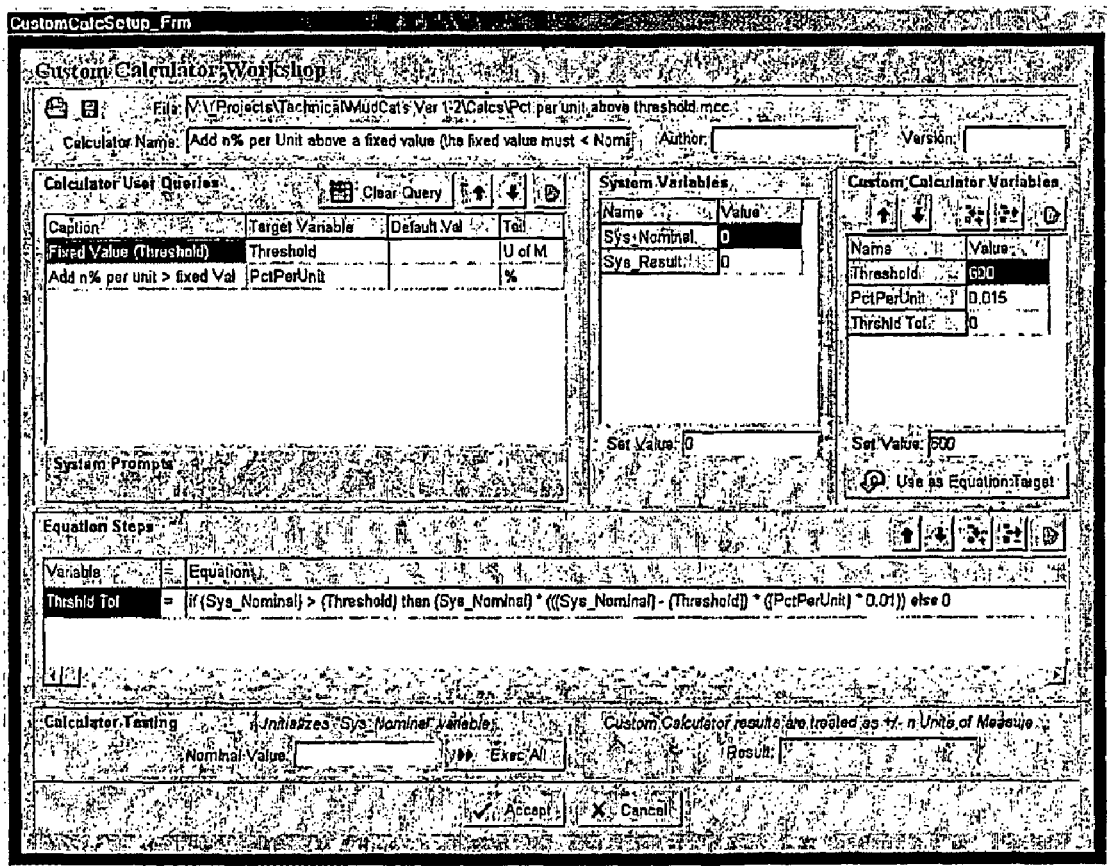

FIG. 72 is a representation of what the Custom Calculator Workshop page looks like. The Calibration Process Manager system allows the user to create calculators for use with data sheets and for standalone use. Custom calculators can be saved for re-use later. Custom Calculators can be configured to prompt the user for variable values and execute one or more equations. The equations are edited using the Equation Editor page. When a custom calculator is intended for use with the Calibration Process Manager's integrated tolerance calculator, the calculated result of all custom calculators should be in the same unit of measure as the "nominal value" of the test point. The value must also be absolute. If the value is negative, the tolerance calculator will declare it to be in error. The custom calculator workshop page contains the interface features in Table 60.

The Open Custom Calculator button allows the user to open previously saved Calibration Process Manager custom calculator files. These files will have a file extension such as .MCC (Calibration Process Manager Custom Calculator). This is a standard Windows open file dialogue box.

The Save a Custom Calculator button allows the user to save Calibration Process Manager custom calculator files. These files will have the file extension of .MCC (Calibration Process Manager Custom Calculator). This is a standard Windows open file dialogue box.

Figures 73, 74, 75:
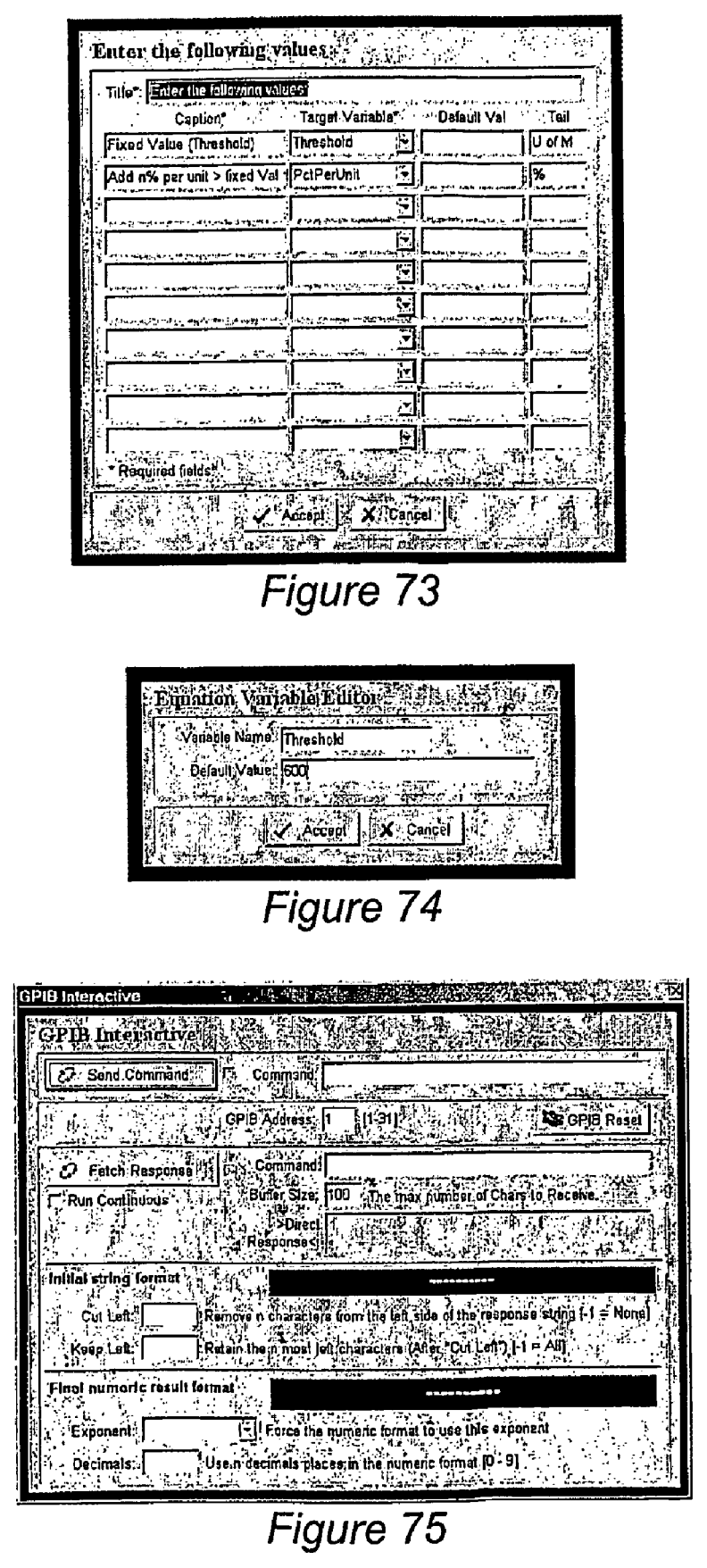

FIG. 73 is a representation of what the User Query Setup Page looks like. This page allows the user to input customized Calculator User Queries for use in the Custom Calculator Workshop. The features are in Table 61.

FIG. 74 is a representation of what the Custom Calculator Equation Variable Editor Page looks like. The Custom Calculator Equation Variable Editor Page allows the user to set variable values for equations in the custom calculator workshop.

FIG. 75 is a representation of what the GPIB Interactive Controller page looks like. The GPIB Interactive Controller page allows the user to set the parameters for data being collected over a GIPB connection. This interface allows for direct manipulation of attached units without requiring automation script commands. The GPIB Interactive Controller page contains the interface features in Table 62.

Figure 76:
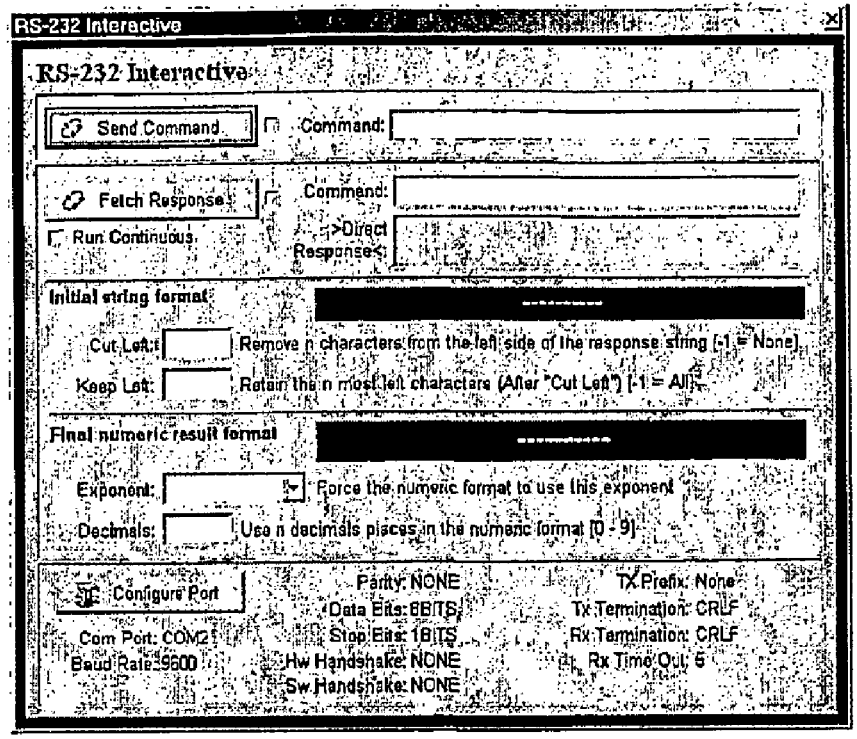

FIG. 76 is a representation of what the RS-232 Interactive Controller page looks like. The RS-232 Interactive Controller allows the user to set the parameters for data being collected over a RS-232 connection. This interface allows for direct manipulation of attached units without requiring automation script commands. This page also lists the current settings for the corn port. The settings can be edited using the Configure Corn Port button. The RS-232 Interactive Controller page contains the interface features in Table 63.

Figure 77:
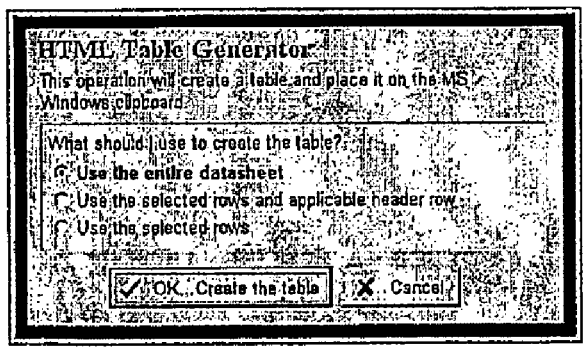

FIG. 77 is a representation of what the HTML Table Generator Page looks like. The HTML Table generator page allows the user to copy all, or part, of a data sheet to the Windows clipboard. The information will be in HTML format.

Figure 78:

FIG. 78 is a representation of what the Tab Delimited Table Generator Page looks like. The Tab Delimited Table generator page allows the user to copy all, or part, of a data sheet to the Windows clipboard. The information will be in Tab Delimited format.

Figure 79:
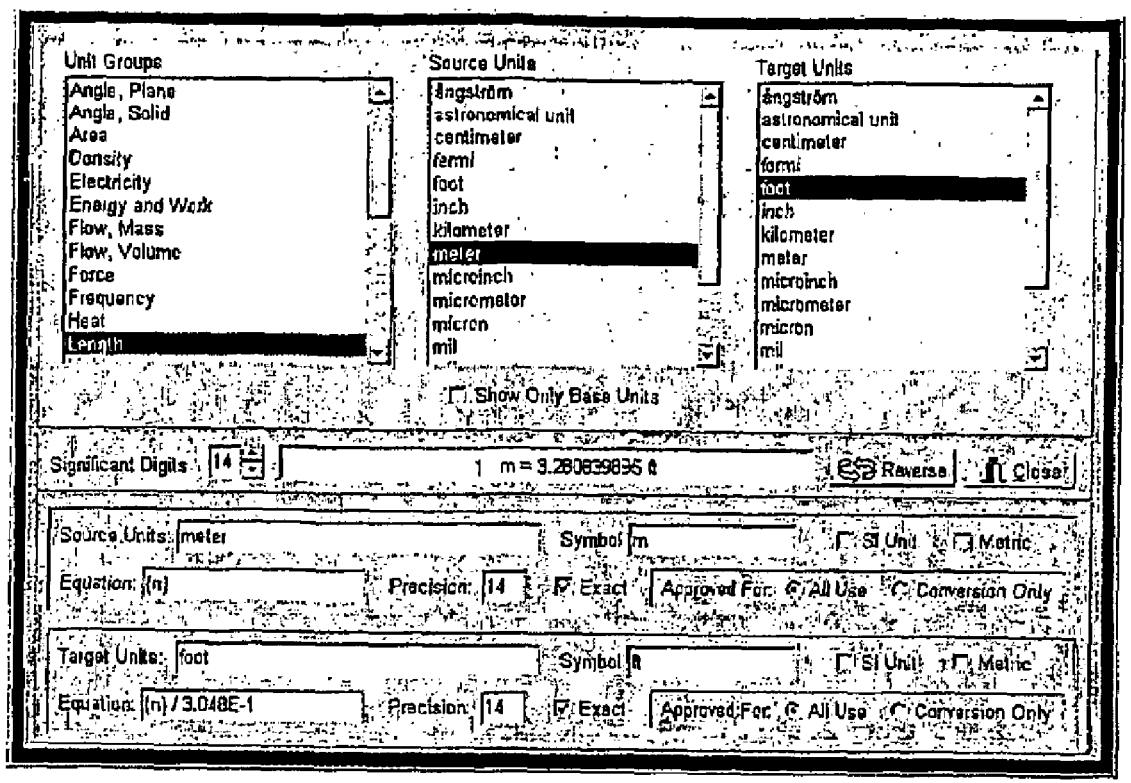

FIG. 79 is a representation of what the Units Converter Page looks like. The Units Converter page allows the user to convert values from one unit of measure to another.

Globally Unique Identifiers

Implementation of the Calibration Process Manager is facilitated by a data structure for recording calibration data from a UUT. Typically, with reference to FIG. 80, this data structure will be stored on a hard drive memory 54 of the computer 52 which is connected to the calibration testing unit 56, and the UUT 58. It is possible to have multiple UUTs 58 connected and tested using the present invention.

As will be known in the art with reference to this disclosure, it would be possible to store a data structure of the present invention on any computer readable medium, such as floppy drives, dismountable hard drives, DVDs, CD-ROM, CD-R, CD-RW, memory cards, and the like.

The structure centers on use of two guaranteed identification address globally unique identifiers ("GUID"). The generation of GUIDs is know in the art, and information relating to GUIDs may be found in the Microsoft Knowledge Base article Q176790 "HOWTO: Use CoCreateGUID API to Generate a GUID with VB."

The first GUID used in the present invention is a permanent unique ID, or "PUI." The second GUID used in the present invention is a dynamic unique ID, or "DUI."

This underlying system of serialization provides the unique identifiers to both the data sheet and individual rows of the data sheet. Preferably, serial numbers are used as the identifiers. Each data sheet and data sheet row is assigned two serial numbers: A Permanent Unique Identifier (PUI) and a Dynamically Unique Identifier (DUI). The PUI is assigned when an object is created or altered in a manner that would make it unable to link to its past usage. A new DUI is assigned each time the object is modified/saved.

These unique identifiers allow the Calibration Process Manager to track and relate linkages of these objects for historical and statistical purposes. The relationship of the unique identifiers to data sheet and calibration history should be understood and considered any time a datasheet is modified. Calibration test point history is related to data sheet row by its PUI. Changing parametric data in the Nominal Value cell of a data sheet row will cause the Calibration Process Manger to issue the row a new PUI. When these parameters are changed the Calibration Process Manager must assume that the quantitative relationship to calibration history for the test point is no longer applicable. The result is that the data sheet row is no longer directly linkable to calibration test points that used the row in the past. The security of data preservation is not broken, but statistical analysis will be disrupted. The bottom line is that the user must consider these impacts in the decision to alter the data sheet.

The system permits a secure environment along with an audit trail to track changes to the system parameters. Archiving of records is also possible.

Using the PUI and DUI identifiers, for example, it will be possible to locate all UUTs that were measured with a particular calibration testing unit 56. If it is later determined that the particular calibration testing unit 56 is itself out of calibration in a particular range, the PUI/DUI identifiers permit identifying each UUT 58, and each range tested, that may be affected by the our of calibration testing unit.

Method For Calibration

Figure 81:
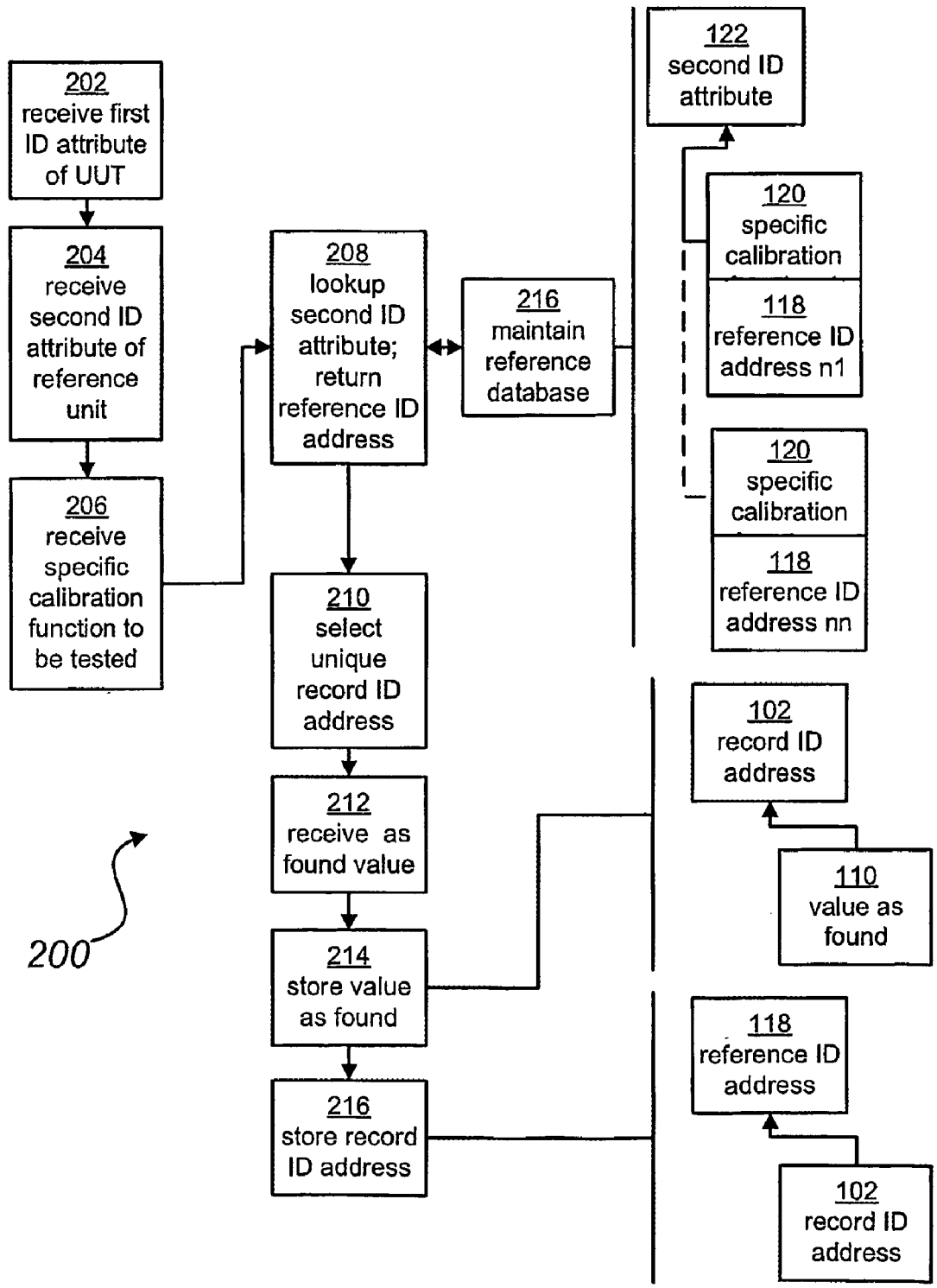
FIG. 81 is a flowchart showing the steps of the method for calibrating a UUT for a specific calibration function.

With reference to FIG. 81, method 200 for calibrating a UUT for a specific calibration function is described, comprising the steps of receiving 202 a first identification attribute associated with a UUT; receiving 204 a second identification attribute associated with a reference measuring unit; receiving 206 a specific calibration function to be tested; maintaining 216 in a first memory a reference database of one or more than one second identification attribute in holding relationship to one or more than one reference identification address, each reference identification address being associated with a single calibration function; looking up 208 in the reference database, the reference identification address being held by the second identification attribute, and associated with the specific calibration function; selecting 210 a unique record identification address; receiving 212 a value as found for the specific calibration function for the UUT; storing 214 in a second memory the value as found in a being-held relationship to the record identification address; and storing 216 in a third memory the record identification address in a being-held relationship to the reference identification address.

In one preferred embodiment, either the first identification attribute (not numbered) or the second identification attribute 122, or both the first identification attribute and the second identification attribute 122, can be an asset number.

In a further embodiment, steps may be added of receiving (not shown) a value as left for the specific calibration function for the UUT and storing in the second memory the value as left in a being-held relationship to the record identification address. Additionally, optionally steps (not shown) may be added returning a test accuracy ratio, or returning an estimated measurement uncertainty, or automatically converting the units of the received value as found.

In a further embodiment, method 200 may further comprise maintaining in a fourth memory an equipment database correlating for individual make and model of equipment, a nominal value to calibration function; receiving make and model of equipment attributes for the UUT; looking up in the equipment database, the nominal value for the specific calibration function for the received make and model of equipment; returning the nominal value; and calculating a calibration tolerance and returning the limits. In a still further embodiment, additional steps may be receiving a value as left for the specific calibration function for the UUT and storing in a fifth memory the value as left in a being-held relationship to the record identification address. The method may still further comprise the step of indicating whether the value as found or the value as left is within the limits of the calibration tolerance.

Management System

Figure 82:
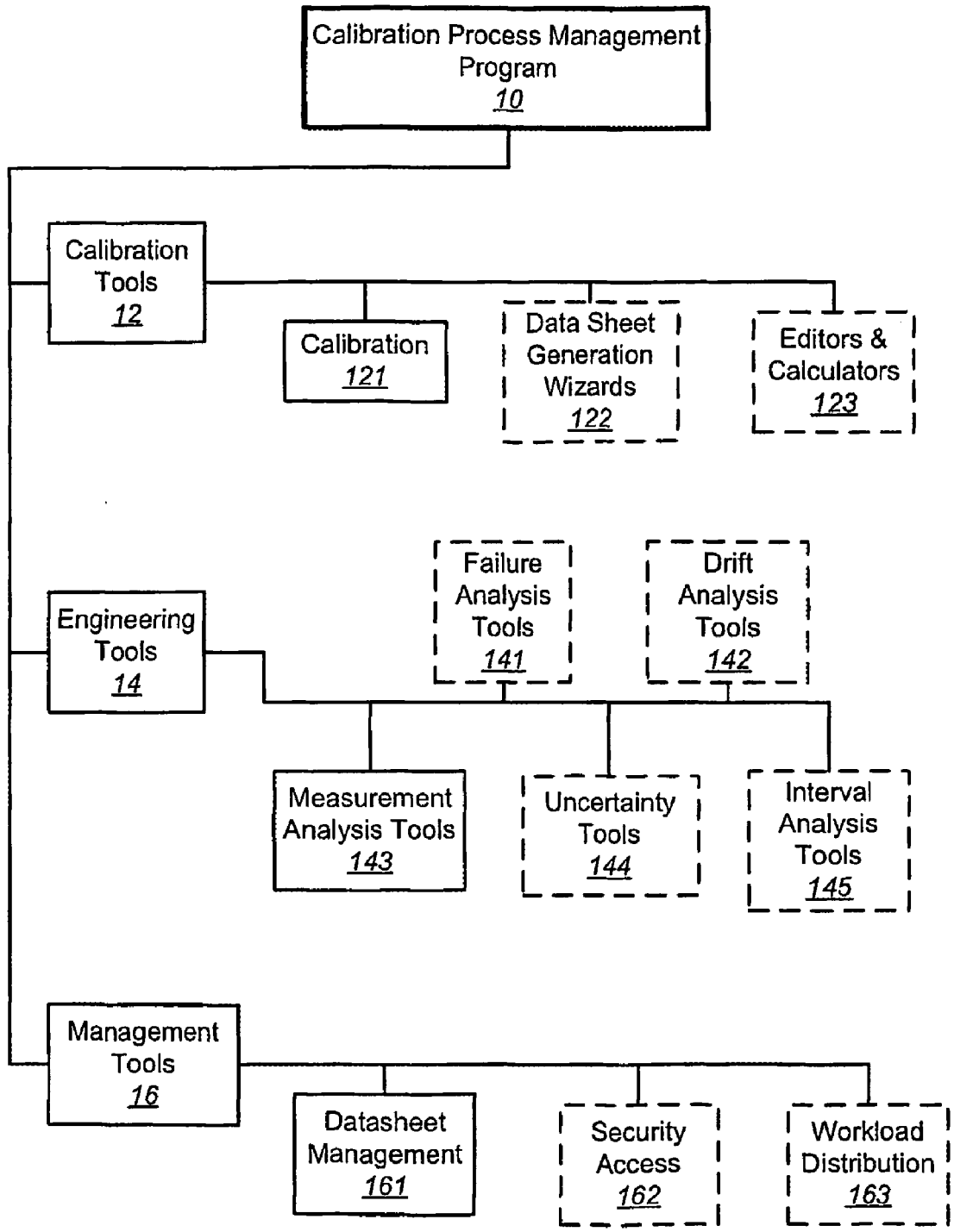
FIG. 82 is a block diagram of the component modules of the Calibration Process Management program.

As shown in FIG. 82, a Calibration Process Management Program 10 implementing method 200 is shown, of which the previously described Calibration Process Manager is one embodiment, comprising a set of modules including calibration tools 12, engineering tools 14, and management tools 16. Multiple formerly independent modules can thus be integrated into a Calibration Process Management System ("CPMS") 50 comprising program 10, residing on memory 54 of an appropriate computer 52, and an optional printer 60. A data sheet 62 may then be printed. A sample of a data sheet 62 is shown in FIG. 83.

The calibration tools module 12 comprises calibration tools 121, and optionally data sheet generation wizards 122, and editors and calculators 123. The engineering tools module 14 comprises measurement analysis tools 143 and optionally failure analysis tools 141, drift analysis tools 142, uncertainty tools 144, and interval analysis tools 145. The management tools module 16 comprises datasheet management tools 161, and optionally security access 162, and workload distribution 163. These have been described in various embodiments in the Calibration Process Manager above. Other embodiments of these tools will be evident to those skilled in the art with reference to this disclosure.

It would be possible to implement the CPMS on any type of personal computer, such as a Pentium® class machine. Operating systems useable include those available from Microsoft®, including Windows® 98, ME, 2000, and XP. The computer memory can be any media useable for storage of computer data, including but not limited to hard drives, floppy drives, removable drives, RAM, ROM, DVDs, and CD-R.

It is possible to implement management program 10 as a 32 bit, Windows 9x, NT, or 2000 based program, designed for standalone or Client/Server SQL database applications. In one embodiment, it can be designed and developed to satisfy ISO-17025, ANSI Z-540, 10 CFR 50 Appendix B, ISO-9002, GMP, and other stringent quality requirements for calibration data collection.

Certain aspects of Calibration Process Management Program 10 are desirable, and will now be described. It will be understood that individually each of these are optional.

An integrated tolerance calculator allows a data sheet designer to generate test point row data by merely entering nominal test point values and equipment specification data. The tolerance is calculated, formatted, and then the new test points are inserted into the data sheet. Preferably, the calculator uses a smart rounding system to appropriately round tolerance values, and supports both standard specifications (% of I.V., ppm of I.V., % of F.S., ppm of F.S., ±n Units of measure, and ±db) and custom specifications. Custom specifications are more complex specification components such as: "±0.025% of I.V. per volt above 750 volts". Custom specifications can be defined by the user, then used in combination with the standard specification components in the tolerance calculator.

A custom tolerance calculator is used to calculate tolerances, based on specification components that are more complex than the standard specification components (% of I.V., ppm of I.V., % of F.S., ppm of F.S., ±n Units of measure, and ±db). These more complex specification components are things such as: "±0.025% of I.V. per volt above 750 volts". CPMS 50 provides a special set of tools that allow you create your own library of custom specification statements and then use them in combination with the standard specification components in tolerance calculator.

An equation system permits equations to be constructed using a user-friendly equation editor. The system uses, standard operands, a function library, user defined variables, and conditional clauses in equations. The equation system can be used throughout CPMS 50 to create and execute equations in such operations as: custom calculators, units conversion, automation scripting math commands, etc.

When creating data sheets, development productivity and format continuity are important factors. This is where data sheet generation wizards fit the bill. These wizards allow for the predefinition of test point values, tolerance format, function tested descriptions, and data sheet boilerplate information. A single data sheet wizard can contain multiple test point definitions.

As an example, a wizard for digital multimeters with a range base of 200 (i.e. 200 mV Range) might contain the following test point definitions shown in Table 64.

Selecting one of these test point definitions will automatically configure the tolerance calculator with predefined numeric and tolerance formats, and setup an array of test points. When the new test points are inserted into the data sheet, the Step Number and Function Tested descriptions are taken from the wizard test point definition. Any of the predefined values can be overridden, if necessary.

Data sheets can be created using special data sheet wizards. These wizards prompt the user for specification data then generate an entire datasheet. An example of a user interface suitable for use in a data sheet generation wizard is shown in Figure X.

Multiple Channel Data Collection. For many types of instruments, it is much more efficient to collect data for more than one instrument at the same time. CPMS 50 allows you to do this, providing the instruments use the same data sheet. Up to eight simultaneous sets of measurement data can be collected within CPMS 50 in one embodiment. Each set of measurement data is referred to as a "Channel". Each channel has a display module for "As Found", "As Left", and "Out of Tolerance" data. All eight channels can be displayed and edited simultaneously.

Automatic "Out of Tolerance" detection. When a measured value is recorded for an instrument channel, CPMS 50 will compare the value to the instrument's "Tolerance", indicate the "Out of Tolerance" status, and display the percentage of the tolerance consumed.

Data collection via automation scripting. Instrument data can also be collected through the use of an automation scripting system. This allows data collection from GPIB, or RS-232, custom user prompts, or the result of scripted mathematical operations.

Storage and retrieval of collected data. Measurement data collected for each channel can be stored independently. This data can be recalled or reprinted at any time. The data can be either recalled, into any one of the eight instrument channels, or opened as an independent data sheet.

Automation Scripting. CPMS 50 allows you to add automation scripting commands to any row of a data sheet. Scripting data sheet rows independently has many advantages, but chief among them is the direct interaction between a row's script commands, test point data, and measurement data. With this direct correlation you can apply automation commands to a specific row or section of a data sheet, by simply selecting the applicable data sheet row. If only one section of a data sheet is to be automated, no action is required in any unaffected row. Even when scripting is available for a section/row of a data sheet, it can also be treated as just that, a simple data sheet row. The user can simply enter the measurement data or run the applicable part of the script.

Editing the automation script for a data sheet is simple. Script commands for a data sheet row are displayed whenever that row has focus in the data sheet editor. The script editor makes it simple to cut and paste a series of commands, from one data sheet row, to another data sheet row, or even another data sheet. When copying and pasting entire data sheet rows, the data sheet editor will also copy and paste all applicable commands.

Scripting of preexisting data sheets. Any data sheet can have scripting commands added to it. The result is incremental development. Whenever someone creates a data sheet, they are laying out the framework for an automation process. When scripting is undertaken, this work does not have to be repeated. As a result of the direct relationship of the script to the data sheet row, evaluation of measured values to the calibration tolerances is internally handled, with no scripting required.

Scripting commands are available for both GPIB and RS-232 operations.

CPMS 50 has the ability to use scripting commands to actually build a data sheet. Scripting commands are available to prompt the user for specification data, manipulate the tolerance calculator, perform math operations, and generate test points. This type of scripting is very useful as replacement for generic data sheets. Creating self generating data sheets for instruments such as torque wrenches, pressure gauges, micrometers, etc., is very easy.

The automation scripting system features commands can make full use of a CPMS 50 equation system described above.

Interaction with external applications can be done by including in the scripting commands Object Linking and Embedding (OLE) commands. These commands allow the scripting system to share data with external applications, i.e., MATH-CAD, WORD, EXCEL, etc. Calibration instructions can be created with a Rich Text Format (RTF) instruction editor or imported from another word processor. The instructions can be displayed using a script command.

Groups of commands can be saved to a file. These files are intended to serve as a command group library. Groups of commands can be inserted directly into a script from one of these files. Groups of commands can also be cut and pasted across rows or even data sheets.

An intelligent SI Units of Measure converter automatically interprets measurement units for the nominal values in the calibration data sheet. The Units of measure engine also automatically converts measurement units be the UT and applied standards. The Units of measure engine can also be used as a stand alone units converter for quick conversions.

Specification Tracking

Specification Tracking is an optional CPMS 50 module that contains a library of calibration standards accuracy specifications and/or uncertainties. Specification Tracking enables CPMS 50 to assign calibration standards, and their related function, range and accuracy specifications to data sheets and applicable UUT calibration data. Standards accuracy specifications are entered through a unique user interface which provides a systematic, logical architecture for building specification data.

Standards specifications can be divided by Function, Parameter, Range, Accuracy, Resolution, and other metrological criteria to properly identify the specification. Specification data stored in Specification Tracking can be used throughout CPMS 50 in the calculation of Estimated Measurement Uncertainty (EIU), Test Accuracy Ratios (TAR) and failure analysis.

CPMS 50 can be used in the field to collect calibration data and merge data into the main system by adding optional Mobile PC support.

The CPMS can also optionally automatically calculate each test point's estimated measurement uncertainty ("EMU"), using principle sources of error from standards accuracy specifications, inverse normal distribution function, in-tolerance probability, and uncertainty contributed by the measurement system resolution. These sources of error are combined with a suitable coverage factor and expressed as EMU. This meets the Quality Standards and Practices requirement of ISO/IEC 170255.4.6 "Estimation of uncertainty of measurement" which states in section 5.4.6.2 "Y[t]esting laboratories shall have and apply procedures for estimating uncertainty of measurement. In certain cases the nature of the test method may preclude rigorous, metrologically and statistically valid, calculation of uncertainty of measurement. In these cases the laboratory shall at least attempt to identify all the components of uncertainty and make a reasonable estimation." ISO/IEC 17025, "General Requirements for the Competence of Testing and Calibration Laboratories."

There are two distinct testing methods; Type A tolerance testing (method of evaluation of uncertainty by the statistical analysis of series of observations) and Type B uncertainty testing (method of evaluation of uncertainty by means other than the statistical analysis of series of observations). In tolerance testing measurement reliability is the objective, parametric data is not utilized, and is typically done in a secondary calibration laboratory. In uncertainty testing, typically done in a primary standards laboratory, measurement uncertainty is the objective, and parametric data is utilized.

Preferably, the CPMS is capable of Type B evaluation of uncertainty. It is sufficient to assume that a heuristic estimate is adequate, and that standards and UUT are the principle sources of error, where the standards contribution is based on in-tolerance probability, and the UUT contribution is based on measurement system resolution.

One way of defining the uncertainty contributed by the standard is shown in Equation (Eq. 1), where $L_S$ is the standard accuracy specification, $\Phi^{-1}$ is the inverse normal distribution function, and P is the in tolerance probability.

$$u_s = \frac{L_s}{\Phi^{-1}\left(\frac{1+P}{2}\right)} \quad \text{(Eq. 1)}$$

One way of defining the uncertainty contributed by the UUT is shown in Equation (Eq. 3), where $X_R$ is the measurement system resolution (e.g., ½ LSD)

$$u_R = \frac{x_R}{\sqrt{3}} \quad \text{(Eq. 2)}$$

$$u_R = \frac{X_R}{\sqrt{3}} \quad \text{(Eq. 3)}$$

The combined standard and UUT uncertainty is then given by Equation (Eq. 4), where us is the standard uncertainty and $u_R$ is the UUT uncertainty.

$$u_c = \sqrt{u_S^2 + u_R^2} \quad \text{(Eq. 4)}$$

The estimated measurement uncertainty may then be expressed by Equation (Eq. 5), where k is a coverage factor (e.g. k=2). "Estimates of uncertainty are derived form the statistical concept of the standard deviation. The standard deviation is a characteristic or number that describes the amount of variability of a distribution of measurements." Jackson, D. and Castrup, H., "Uncertainty Propagation in Calibration Support."

$$U = k \cdot u_c \quad \text{(Eq. 5)}$$

Substituting Equation (Eq. 4) into Equation (Eq. 5), we can obtain an approximate value for $U_{echelon\ I}$ in a Type B evaluation using Standard and UUT data from Equation (Eq. 6), where $k_{factor}$ is the coverage factor.

$$U_{echelon\ I} = k_{factor} \cdot [u_{standard}^2 + u_{resolution}^2]^{0.5} \quad \text{(Eq. 6)}$$

Similarly, we can obtain an approximate value for $U_{echelon\ II}$ in a Type A evaluation using parametric test data with Equation (Eq. 7).

$$U_{echelon\ II} = k(v_{eff}, P)[\Sigma(c_i u_{standard_i})^2 + \Sigma(c_j u_{other_j})^2 + u_{test\ data}^2]^{0.5} \quad \text{(Eq. 7)}$$

Further, we can obtain an approximate value for $U_{echelon\ III}$ in a Type A evaluation using parametric historical data with Equation (Eq. 8).

$$U_{echelon\ III} = k(v,p)[\Sigma(c_i u_{standard_i})^2 \Sigma(c_j u_{other_j})^2 \pm u_{historical\ data}^2]^{0.5} \quad \text{(Eq. 8)}$$

A CPMS preferably automatically calculates each test point's test accuracy ("TAR") ratio between the UUT and the applicable standard's function and range, preferably in accord with ANSI/NCSL Z540-1-1994 "Calibration Laboratories and Measuring and Test" section 10.2 b): "The laboratory shall ensure that the calibration uncertainties are sufficiently small so that the adequacy of the measurement is not affected . . . the collective uncertainty of the measurement standards shall not exceed 25% of the acceptable tolerance (e.g., manufacture's specification) for each characteristic of the measuring and test equipment being calibrated or verified."

In one preferred embodiment, the CPMS uses an algorithm that combines the calibration tolerance of the UUT, and the collective uncertainty of the standard to derive the Test Accuracy Ratio or TAR. This method represents the model specified in ANSI/NCSL Z540-1-1994. Section 10.2, and is expressed in Equation (Eq. 9), where TAR is the Test Accuracy Ratio, $L_X$ is the calibration tolerance of the UUT, and the radical denominator term is the collective uncertainty of standards, k=1.

$$TAR = \frac{L_X / \sqrt{3}}{\sqrt{\Sigma u_S^2}} \quad \text{(Eq. 9)}$$

Failure Analysis. This feature enables the user to automatically evaluate out-of-tolerance conditions by tracking the function, range and test point information between each standard and the unit under test. Failure analysis pertains to compliance with ISO 17025 paragraph 4.9 b) or Z540-1 paragraph 8.2. That is, the laboratory shall examine the effect of nonconforming work or equipment defects (out-of-tolerance conditions) on other work. Most labs keep track of what standards are used to calibrate what equipment. Therefore, the starting point for failure analysis is an out-of-tolerance condition on a standard and a list of items on which the standard was used. It is then up to the evaluator to re-trace each calibration to determine whether or not the individual range and test point that failed on the standard was actually used on the UUT, to quantitatively assess what effect the failure had, and to notify the client if the effect was significant. Imagine doing this if the standard is a multifunction meter calibrator and the UUT list contains 100 items, and across the laboratory's inventory of standards.

The CPMS enables this evaluation to be done automatically by keeping track of the function, range and test point information between each standard and UUT. By knowing the applicable specifications and the magnitude of the failure, it could determine whether or not the failure had an adverse effect on the calibration. It could produce a list of items that were actually affected, where and by how much. It could even prepare this information for transmittal to the client. This a huge feature because most labs are overwhelmed by this or do not comply with this provision of the standard.

Failure Report. Failure analysis reports can be generated by selecting the calibration standard, function and range within a specified date range. This report indicates which UUT where calibrated by the selected standard, grouped by individual Asset ID number, and the specific function, ranges, and test points affected.

Drift/Interval Analysis. Drift and Interval Analysis enables users to plot data and to analyze trends of measuring and test equipment, between calibrations, on a test point basis. This feature will allow users to determine optimum calibration intervals for their equipment. Drift analysis tracks and analyzes trends in laboratory standards and client M&TE between calibrations on a test point by test point basis. The Drift analysis module allows you to plot data, look for trends and calculate basic statistics. Ultimately, this tool will enable the laboratory to establish the uncertainty of its standards and client's M&TE in real time, to determine optimum calibration intervals for its equipment.

CPMS 50 may also incorporate advanced security features including; Comprehensive User Manager Detailed Audit Trail; and Selectable audit trail reporting. A User Manager allows the system Administrator to set user access, and permission levels within CPMS 50. Users' activities are automatically tracked and logged in the audit trail for database trace ability and compliance to 21 CFR Part 11 audit requirements.

Revision Control. Calibration data sheets and subsequent revisions can be maintained and controlled through CPMS 50 exclusive data sheet approval process. Data sheets are created in an ASCII file based format out side of the SQL database. Data sheets can only be inserted into a database by individuals authorized for data sheet approval. Upon review and approval, data sheets are e-signed, and time and date logged as new or a revision, as selected by the authorized individual. When a data sheet is revised, the old data sheet is inactivated, but maintained in the system, thus preventing the use of retired data sheets, and only allowing the currently approved data sheet for use.

Storage options. Typically, a Data sheet file contains all of the test point data, specifications, automation script commands, and calibration instructions for a single data sheet. A calibration file is a simplified version of a Data sheet file. No automation scripting or calibration instructions are stored. The calibration file also stores the UUT's measurement data. The calibration file can be either recalled into one of the UUT channels or reopened independently as a data sheet, with UUT measurement data.

CPMS 50 may also feature an automated cataloging system of all data sheets and calibration files. The catalog can be used to locate a data sheet or a calibration file. The data sheet catalog can be searched by model, manufacturer, equipment description or calibration procedure. CPMS 50 can also support barcode data entry for M&TE ID and Test Report numbers.

Data sheets can be created by any person with the prerequisite technical knowledge of the unit under test. The actual process of creating data sheets requires minimal training. Data sheets should be approved by the appropriate authorized individual before they can be inserted into the database for use. Data sheets are initially created in file format, and must be approved, and e-signed prior to submittal into the database. This process assures proper data sheet validation and approval in accordance with industry quality standards, and users quality procedures. Data sheet approvals are controlled by the customer, adequate controls should be in place for the review, acceptance and approval of data sheets prior to use.

Data sheet revision control. In further embodiments, Data sheets must not only be approved, their revision are also tracked and controlled. Upon approval of a new data sheet, CPMS 50 tracks previously created data sheets of the same number. If previous data sheets exist, the new data sheet can be added as a revision, or a new data sheet. CPMS 50 tracks old revisions and only allows the current revision for use.

The usual starting place for an automation script is a previously created data sheet. Having said that, scripting commands can be added to a blank data sheet if desired. The training requirements for script authors will vary with the nature of the scripts being written. If, for example, a mathematically intensive script is being written, the author must have the requisite math skills. As far as the actual scripting process is concerned, the direct relationship of data sheet rows and script commands keeps the process relatively easy.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent or similar purpose, unless expressly stated otherwise. Thus, unless expressly stated otherwise, each feature disclosed is one example only of a generic series of equivalent or similar features.

Also, any element in a claim that does not explicitly state "means for" performing a specified function or "step for" performing a specified function, should not be interpreted as a "means" or "step" clause as specified in 35 U.S.C. § 112.

| | |
|---|---|
| AF | As Found |
| AL | As Left |
| A/N | Alpha-numeric |
| Bar | Barometer |
| Cal | Calibration |
| CFR | Code of Federal Regulations |
| Com Port | Communications Port |
| CR | Carriage Return |
| CRLF | Carriage Return Line Feed |
| dB | Decibels |
| OLE | Object Linking and Embedding |
| Esc | Escape |
| F.S. | Full Scale |
| GPIB | General Purpose Interface Bus |
| Hg | Mercury |
| inHg | In Mercury |
| HW | Hardware |
| IEEE | Institute of Electrical and Electronic Engineers |
| I.V. | Indicated Value |
| LF | Line Feed |
| Max | Maximum |
| Mhz | Mega Hertz |
| mm | Millimeter |
| mV | millivolt |
| N/A | Not Applicable |
| Nav | Navigation |
| No | Number |
| Pa | Pascal |
| ppm | Parts Per Million |
| Psig | Pounds per Square Inch Gauge |
| Psia | Pounds Per Square Inch Absolute |
| RAM | Random Access Memory |
| Rcv | Receive |
| Ref | Reference |
| RS-232 | Recommended Standard 232 (computer interface cable) |
| RTSCTS | Request to send clear to send |
| SDD | Software Design Description |
| SOPs | Standard Operating Procedures |
| SQL | Structured Query Language |
| SW | Software |
| Tol | Tolerance |
| Tx | Transmit |
| UUT | Unit Under Test |
| Val | Value |

APPENDIX B

| | | | |
|---|---|---|---|
| File | Data Sheet | | This option allows the following: |
| | | Open | Loads a previously saved data sheet. This option opens the Open Data Sheet catalog. |
| | | Save | Saves edits made to the currently opened data sheet. This option exports the Data Sheet to a File. |
| | | Save As | Saves edits made to the currently opened data sheet, also allows the operator to rename the data sheet. This option exports the Data Sheet to a File. |
| | | New | Creates a blank data sheet. |
| | | Approve | This option allows users with data sheet approval privileges to approve a data sheet for use in the system database. |
| | Calibration File | | This option allows the following: |
| | | Open | This option allows the user to open a previously saved Calibration. |
| | | Save | This option allows the user to Export the current calibration to a file. |
| | Import | | This option allows the following: |
| | | Data Sheet File | This option imports data sheet files into the editor for review/edit/approval. |
| | | Calibration File | This option imports a calibration file into the editor for review/edit/approval. |
| | Export | | This option allows the following: |
| | | Data Sheet File | This option exports data sheets to a file |
| | | Calibration File | This option imports calibrations to a file. |
| | Find | | This option allows the following: |
| | | Data Sheet | This option opens the Data Sheet Database Catalog. |
| | | Calibration | This option allows users to search the system database for calibrations. |
| | | Calibration File>(*.mdc) | This allows the user to search the system for files with the .mdc extension to open and calibrate. |
| | | Calibration File>All Files | This allows the user to search the system for files to pen. |
| | Exit | | This option terminates the application. |
| View | Channel Matrix | | This option allows the following: |
| | | 2 × 4 | Displays 2 rows of 4 Channel boxes. |
| | | 1 × 4 | Displays 1row of 4 Channel boxes. |
| | | 1 × 3 | Displays 1row of 3Channel boxes. |
| | Show Script | Commands | This displays the Command List in the lower right of the main screen. The data sheet grid section of the screen will be resized to approximately half the original size while the command list is visible. "As found," "As left," and "out of tolerance" columns are not displayed in this mode. |
| | Show Specification Tracking | Instruments | This option opens the Specification Tracking Interface page. |
| Tools | Wizards | | |
| | | Test Point Generators>Load | This option opens the Wizard Loader page. |
| | | Test Point Generators>Workshop | This option opens the Wizard Workshop. |
| | | Data Sheet Generators>Pressure | This opens the Pressure Gauge Data Sheet Generator page. |
| | | Data Sheet Group>New Group | Allows the user to create a new group of data Sheets. |
| | | Data Sheet Group>Edit Existing | Allows the user to edit members of an existing group. |
| | Calculators | | |
| | | Units Conversion | This option opens the Specification Tracking units conversion tool details. |
| | | Custom | This opens the Custom Calculator Workshop page. |
| | | Equation Editor | This option opens the Equation Editor page. |

APPENDIX B-continued

| | | | |
|---|---|---|---|
| | Instrument Controllers | | |
| | | GPIB (IEEE-488) | This opens the GPIB Interactive page. |
| | | Com Ports (RS-232) | This opens the RS-232 Interactive page. |
| | Clipboard Special Copy | | |
| | | HTML Table | This opens the HTML Table Generator page. |
| | | Tab Delimited | This opens the Tab Delimited Table Generator page. |
| | Modules | | |
| | | Specification Tracking | This option activates Specification Tracking. |
| | External Applications | | |
| | | Microsoft Notepad | This opens the standard Windows notepad. |
| | | Microsoft Explorer | This opens Windows Explorer. |
| | | Microsoft Calculator | This opens the Windows calculator. |
| Options | Preferences | | |
| | | Sound Settings | This option allows the operator to set the audio properties for the Calibration Process Manager application, if implemented. |
| | | Change Password | This option allows the user to change their personal password. |
| | | Show Hints | Turns on or off the hint comments to assist users. |
| Administration | Document History | | This option opens the Document History page. |
| | Audit Report | | This option opens the Audit File Report Selection Criteria page. |
| | User Manager | | This option opens the User Manager page. This option is only available to users with administrator privileges. |
| | System Configuration | | |
| | | Database Server | This option opens the Database Server Settings page. |
| | | Master Setup | This option opens the System Configuration page. |
| Help | Cal Manager Help | | This provides help on the calibration manager. |
| | Web site | | This accesses the web site for the suite of applications. |
| | About | | Help About will provide the operator with the program name, current version number, and copyright information for the application currently installed on the user's system. |

APPENDIX C

| Command | Parameters | Description |
|---|---|---|
| DataSht_StepGroupParent | | Indicates that the current data sheet row is a parent to child rows that will follow. A Step Group Parent row normally contains configuration commands, user queries, or instructions that must be executed prior to executing subsequent rows. Children of the parent will not be allowed to execute until the parent is executed. See "DataSht_StepGroupChild" |
| | StepGrpName | The user defined text that represents the name of the group. This parameter must exactly match the value entered for the other applicable step group commands to which it is associated. |
| DataSht_StepGroupChild | | Indicates that the current data sheet row has a subordinate relationship to its Step Group Parent. Step Group Children will not be allowed to execute until the parent is executed. See "DataSht_StepGroupParent". |

APPENDIX C-continued

| Command | Parameters | Description |
|---|---|---|
| | StepGrpName | The user defined text that represents the name of the group. This parameter must exactly match the value entered for the other applicable step group commands to which it is associated. |
| DataSht_GoToStepGroupParent | | Send the execution pointer to the Parent Step indicated by the "StepGrpName" parameter and Halt the Automation script. See "DataSht_StepGroupParent" |
| | StepGrpName | The user defined text that represents the name of the group. This parameter must exactly match the value entered for the other applicable step group commands to which it is associated. |
| DataSht_NormalizeMeasure | | Compensate the measured value for the deviation between the reference (true) and test point nominal values. (ie. Ohms nominal 190 but reference value is 189.99982). The measured value will be adjusted by the deviation quantity of the nominal vs. reference values. This compensation allows the test point to retain the fixed nominal value, as opposed to replacing it with the reference value. |
| | NominalValue | The nominal value of the test point. The value must be numeric. This parameter should match the test point's nominal value. |
| | ReferenceVal | The Reference (True) Value of the measurement. The value must be numeric. |
| | MeasuredVal | The Unknown (indicated) Measured Value. The value must be numeric. |
| | ExponentLetter | A single letter that represents the desired exponential format of the measurement result. |
| | NumDecimals | The desired number of decimal places the measured value should have. |
| DataSht_PassFailToMeasure | | Invokes a popup form containing Pass/Fail criteria. The popup form has buttons to select Pass or Fail. |
| | Criteria | The name of a calibration instruction to display in the popup form |
| DataSht_ResetScript | [None] | Resets all running automation status flags, including Parent Step flags. The user will be required to re-run a parent step prior to any children. This is usually invoked at the end of a scripted test series. |
| DataSht_ShowBoilerPlate | [None] | The master Boilerplate form will be displayed to allow the user to interact with it. |
| DataSht_ToCalc(H/L) | | Calculates the test point tolerance using the parametric values indicated above. The formatted nominal value, calibration tolerance, and test point specifications are then inserted into the data sheet row. Once inserted the row behaves as though the values were placed there when the data sheet was designed. Unused parameter values can be set to zero, but none can be left blank. |
| | NominalVal | The test point's nominal value |
| | FullScaleVal | The full scale value of the applicable instrument range. |
| | ErrPctIV | The % I.V. specification |
| | ErrPctFS | The % F.S. specification, If this parameter is not zero, then the FullScaleVal parameter is relevant. |
| | ErrFloor | The floor error specification relative to the NominalVal parameters unit of measure. This value will be used in its absolute form (not negative). |
| | NumDecimals | The desired number of decimal places. |
| | Units | The test point's unit of measure |
| DataSht_VarToMeasure | | The contents of a user defined variable are formatted and inserted into the data sheet row as the measured value. The variable must contain a numeric value. |
| | UserVar | A user defined variable. |
| | NumDecimals | The desired number of decimal places the measured value should have. |
| | ExponentLetter | A single letter that represents the desired exponential format of the measurement result. |
| GPIB_ReadToMeasure | | The result of a GPIB query is formatted and inserted into the data sheet row as the measured value. The GPIB query result must be convertible to a numeric value. |

APPENDIX C-continued

| Command | Parameters | Description |
|---|---|---|
| | Addr | The GPIB address of the instrument to receive the communication |
| | Cmnd | The command to be issued to the instrument. |
| | BufferSize | The maximum number of characters to receive. This number should be set higher than the number of characters actually expected. When in doubt, set the number to 100. |
| | CutLeft | The number of characters to remove from the response string. An entry of −1 indicates no characters are removed. |
| | KeepLeft | The number of characters to retain after the "cut left". An entry of −1 indicates all characters are retained. |
| | ExponentLetter | A single letter that represents the desired exponential format of the measurement result. |
| GPIB_ReadToMeasure | | The result of a GPIB query is formatted and inserted into the data sheet row as the measured value. The GPIB query result must be convertible to a numeric value. |
| GPIB_ReadToVar | | The result of a GPIB query is trimmed and numerically formatted, then inserted into the user defined variable specified by the "UserVar" parameter. The GPIB query result must be convertible to a numeric value. |
| | Addr | The GPIB address of the instrument to receive the communication |
| | Cmnd | The command to be issued to the instrument. |
| | UserVar | A user defined variable. |
| | BufferSize | The maximum number of characters to receive. This number should be set higher than the number of characters actually expected. When in doubt, set the number to 100. |
| | CutLeft | The number of characters to remove from the response string. An entry of −1 indicates no characters are removed. |
| | KeepLeft | The number of characters to retain after the "cut left". An entry of −1 indicates all characters are retained. |
| | NumDecimals | The desired number of decimal places the resulting value should have. |
| | ExponentLetter | A single letter that represents the desired exponential format of the result. |
| GPIB_Write | | A command is issued to a GPIB device at the address specified. |
| | Addr | The GPIB address of the instrument to receive the communication |
| | Cmnd | The command to be issued to the instrument. |
| Math_CalcToVar | | The specified equation is executed and the result is placed into the indicated user defined variable. |
| | UserVar | A user defined variable. |
| | Equation | The equation to be executed. Once the equation is executed the result is placed in the User Defined Variable specified in the "UserVar" parameter. The equation must be capable of being executed by the Calibration Process Manager's internal equation system. The best way to ensure this is to design and test the equation using The Calibration Process Manager's Equation Editor. The equation editor is the command wizard for the "Math_CalcToVar" command. |
| RS232_Config | | This command configures the specified com port for RS-232 communications. |
| | ComPort | This parameter can only be set using the command wizard. |
| | ComPortID | This parameter can only be set using the command wizard. |
| | BaudRate | This parameter can only be set using the command wizard. |
| | Parity | This parameter can only be set using the command wizard. |
| | DataBits | This parameter can only be set using the command wizard. |
| | StopBits | This parameter can only be set using the command wizard. |
| | HwHandshake | This parameter can only be set using the command wizard. |

APPENDIX C-continued

| Command | Parameters | Description |
| --- | --- | --- |
| | SwHandshake | This parameter can only be set using the command wizard. |
| | TxPrefix | This parameter can only be set using the command wizard. |
| | TxTermination | This parameter can only be set using the command wizard. |
| | RxTermination | This parameter can only be set using the command wizard. |
| | RxTimeOut | This parameter can only be set using the command wizard. |
| RS232_ReadToMeasure | | The result of an RS-232 query is formatted and inserted into the data sheet row as the measured value. The RS-232 query result must be convertible to a numeric value. |
| | ComPort | The com port number to be used. The allowable range is 1–9. |
| | Cmnd | The command to be issued to the instrument. |
| | CutLeft | The number of characters to remove from the response string. An entry of −1 indicates no characters are removed. |
| | KeepLeft | The number of characters to retain after the "cut left". An entry of −1 indicates all characters are retained. |
| | NumDecimals | The desired number of decimal places the measured value should have. |
| | ExponentLetter | A single letter that represents the desired exponential format of the measurement result. |
| RS232_ReadToVar | | The result of an RS-232 query is trimmed and numerically formatted then inserted into the user defined variable specified by the "UserVar" parameter. The RS-232 query result must be convertible to a numeric value. |
| | ComPort | The com port number to be used. The allowable range is 1–9. |
| | Cmnd | The command to be issued to the instrument. |
| | UserVar | A user defined variable. |
| | CutLeft | The number of characters to remove from the response string. An entry of −1 indicates no characters are removed. |
| | KeepLeft | The number of characters to retain after the "cut left". An entry of −1 indicates all characters are retained. |
| | NumDecimals | The desired number of decimal places the resulting value should have. |
| | ExponentLetter | A single letter that represents the desired exponential format of the result. |
| RS232_Write | | A command is issued to an RS-232 device at the address specified. |
| | ComPort | The com port number to be used. The allowable range is 1–9. |
| | Cmnd | The command to be issued to the instrument. |
| Sys_AssignToVariable | | Copies the Contents of one user defined variable into another. |
| | UserVar | A user defined variable. |
| | NewValue | The value to assign to the user defined variable. |
| Sys_AutoExecNextRow | [None] | Instructs the script engine to proceed to the next data sheet row and continue script execution. |
| Sys_Instruction | | Displays a pop-up form containing instructions/notes/warnings for the user to read.. |
| | Name | The name of the Calibration Instruction to be displayed. |
| Sys_ImageInstruct | | Displays a pop-up form containing instructions/notes/warnings for the user to read. and images for the user to view. |
| | InstName | This parameter can only be set using the command wizard. |
| | ImageNames | This parameter can only be set using the command wizard. |
| | FigNums | This parameter can only be set using the command wizard. |
| Sys_QueryUser | | Displays a user query prompt for the user to enter values. The values are then assigned to user defined variables. |
| | Title | This parameter can only be set using the command wizard. |
| | Captions | This parameter can only be set using the command wizard. |

APPENDIX C-continued

| Command | Parameters | Description |
| --- | --- | --- |
| | Variables | This parameter can only be set using the command wizard. |
| | DefValues | This parameter can only be set using the command wizard. |
| | Tails | This parameter can only be set using the command wizard. |
| Sys_Walt | | Causes the scripting system to pause for a fixed amount of time. |
| | Seconds | The number of seconds to wait. This value must be numeric. |

APPENDIX D

| Name | Type | Description |
| --- | --- | --- |
| Primary Objects | Panel | This panel contains the primary interface objects for the data sheet and is located just above the data sheet grid. |
| Edit Cell Field | A/N | Text box |
| ... (Nominal Value/ Tolerance Cell wizard) | Button | This button is only visible when a Nominal Value or Tolerance cell is selected in the data sheet grid. Selecting the button causes the applicable wizard to be displayed. The purpose of these wizards is to allow some content of the cell to be edited without invalidating calculable aspects of the cell's content. (The Standard version does not have this feature) |
| View/Edit Master Boilerplate | Button | Opens the Master Boilerplate Setup page. |
| Save Files | Button | Saves the current file. |
| Print Data Sheets | Button | Opens the Data Sheet Print Shop page. |
| Data Sheet Grid | Grid | This grid is a representation of the printed data sheet rows. The data sheet grid is used as the primary method of navigation within the Calibration Process Manager. The currently selected data sheet row is the target of all data sheet operations. |
| Step number | Column | The applicable step number of a calibration procedure document. |
| Function Tested | Column | Description of the test. |
| Nominal Value | Column | The "nominal" value of the test point. These cells also have three indicators to represent the status of the Specification Tracking Interface and instrumentation. The cells also display a □ symbol when a test point's measurement uncertainty model has been modified by a user. |
| As Found | Column | The "as found" value for the unit under test. |
| As Left | Column | The "as left" value for the unit under test. |
| Out of Tolerance | Column | "X" indicates "out of tolerance." |
| Calibration Tolerance | Column | The measurement "tolerance." |
| Specifications | Column | Displays the specifications entered into the tolerance calculator when the tolerance calculator is used to create the test point. |
| Lock Status | Drop Down List | This option is used to lock or unlock the data sheet for editing. |
| View Only | Selection | This selection only allows users to view data sheets. No edits are allowed. |
| Edit mode | Selection | This selection allows the user access to all edit tools within the page. |
| Cell Clipboard | panel | This clipboard operates on a single data sheet cell and is independent of the MS Windows clipboard. |
| View (Cell) | Button | View "Cell" clipboard. |
| Copy (Cell) | Button | Copies currently selected cell to the "cell" clipboard. |
| Paste (Cell) | Button | Pastes information from the "cell" clipboard to the currently selected cell. |
| Clear (Cell) | Button | Clears the currently selected "cell" of information. |
| Line Clipboard | panel | This clipboard operates on one or more selected data sheet rows (lines) and is independent of the MS Windows clipboard. |
| View (Line) | Button | View "Line" clipboard. |
| Copy (Line) | Button | Copies currently selected line/s to the "line" clipboard. Note: This clipboard is independent of the MS Windows clipboard. |
| Paste (Line) | Button | Pastes information from the "line" clipboard before the currently selected line. |
| Clear (Line) | Button | Clears the currently selected "line"/s of information. |
| Insert (Line) | Button | Inserts a new "line" before the currently selected line of the data sheet. |
| Delete (Line) | Button | Deletes the currently selected "line"/s. |
| Add (5) (Line) | Button | Inserts five new "lines" at the bottom of the data sheet. |
| Add Page (Line) | Button | Inserts a new page of "lines" at the bottom of the data sheet. |

APPENDIX D-continued

| Name | Type | Description |
|---|---|---|
| Group Clipboard | panel | This clipboard operates on one or mores selected data sheet cells (group) and is independent of the MS Windows clipboard. |
| View (Group) | Button | View "group" clipboard. |
| Copy (Group) | Button | Copies the "group" of the currently selected cells to the clipboard. Note: This clipboard is independent of the MS Windows clipboard. |
| Paste (Group) | Button | Pastes information from the clipboard to the currently selected cells. Note: The selected cells area for pasting must be a single or multiple, two dimensional, match of the cells area selected when the group of cells was copied. |
| Clear (Group) | Button | Clears the contents of the currently selected "group" of cells. |
| Tools | panel | This panel contains buttons that invoke editor tool modules. |
| Tolerance Calculator | Button | Opens the Tolerance Calculator page at the bottom of the screen. The application resizes the main screen by approximately ⅓. |
| Test Point Measurement Uncertainty Wizard | Button | Opens the Measurement Uncertainty Wizard page. |
| Specification Tracking Instruments | Button | Opens the Configure Instrumentation with Specification Tracking Data page at the bottom of the screen. The application resizes the main screen by approximately ⅓. |
| Command Count Label | Label | Displays the number of scripted commands contained within the selected data sheet row. |
| Warnings | panel | This panel contains a button that resets editor warnings. |
| Reset All | Button | Resets all warnings to default. When editing the Nominal Value or Tolerance cells, a warning is display to indicate the ramifications of manually editing these cells. The user can choose to ignore the warning, have the system stop issuing the warning, or cancel the operation. If one or more of these warning was directed to stop issuing the warning, this option directs the system to re-assert the issuance of all warnings. |
| Special Ops | panel | This panel contains buttons that invoke special editor operations. |
| "Same" | Button | Copies the word "Same" into all "As Left" data cells that presently have no content. |
| Insert Header | Button | Inserts a header line into the Data Sheet before the currently selected cell. The header line is a duplicate of the first row of the data sheet. |
| Add Page Break | Button | Inserts a page break into the Data Sheet. A page break is a mechanism that directs the system to restart row numbering on the next line of the data sheet. When the data sheet is printed, the first row following a page break is the first row of a new page. |
| Copy symbol to clipboard | panel | This panel contains buttons that copy a symbol onto the Ms Windows clipboard. |
| ± | Button | Copies the ± symbol to the clipboard. |
| ° | Button | Copies the ° symbol to the clipboard. |
| μ | Button | Copies the μ symbol to the clipboard. |
| 1 | Button | Copies the $^1$ symbol to the clipboard. |
| 2 | Button | Copies the $^2$ symbol to the clipboard. |
| 3 | Button | Copies the $^3$ symbol to the clipboard. |
| Units | Button | Opens the Units of Measure Selection form. |
| Row Level Remark Flags | panel | This panel contains a drop down list that manages row level remarks. |
| Level Remark | Drop Down Box | This inserts a notation into the Tolerance column of the selected row. The notations listed in the drop down box are: [None], *, **, ***, ****, *****, *^, *^^, and *^^^. These symbols direct the data sheet printing system to print the remark, associated with the selected symbol, in the remarks section of the data sheet page that used the symbol. The symbols are automatically added to the end of the Tolerance cell's content. When a data sheet row is selected, the drop down box indicates the current symbol assignment. |

TABLE 1

| Name | Type | Description |
|---|---|---|
| Accept | Button | Accepts all changes and closes the page. |
| Cancel | Button | Cancels all changes and closes the page. |
| Server Name | Field | The name of the computer running the SQL Server. |
| Database name | Field | This is the name of the Database on the Server computer. |

TABLE 2

| Name | Type | Description |
|---|---|---|
| Accept | Button | Accepts all changes and closes the page. |
| Cancel | Button | Cancels all changes and closes the page. |
| Configuration Group | Drop Down Selection | This drop down box contains the following selection options: |
| All | Selection | This selection contains all of the configuration options listed in the specific sections below. |
| General | Selection | This selection contains following general information options: Company Name |

TABLE 2-continued

| Name | Type | Description |
|---|---|---|
| Files | Selection | This selection contains the following options for default file search path locations:<br>Master Data Sheet Path<br>Master Calibration File Path |
| Field Labels | Selection | This selection contains the following fields that the system administrator can change the display label for:<br>Asset Number<br>Test Number<br>Cal Procedure |
| Hints | Selection | This selection contains the following fields that the system administrator can change the "fly over" hint label for:<br>Set As Left Data to "Same"<br>View Boilerplate |
| Pressure Wizard | Selection | This selection contains the following fields that the system administrator can use to configure the Pressure Gauge Data Sheet Generator wizard's maximum vacuum values:<br>Psia in Hg |
| Datasheet | Selection | This selection option contains the following data sheet configuration options:<br>Tolerance: Include TAR<br>Tolerance: Include Uncertainty<br>Datasheet Title<br>Custom Datasheet title<br>Document Page Nums<br>Datasheet Page Nums<br>Datasheet. Use Attachment<br>Def Headers: Step Num<br>Def Headers: Func. Tested<br>Def Headers: Nominal Val<br>Def Headers: As Found<br>Def Headers: As Left<br>Def Headers: Out of Tol<br>Def Headers: Tolerance |
| Configurations List | Grid | Lists all of the available configuration options. Filtered by the Configuration Group drop down list selection. |
| . . . (Set Directory) | Button | This button is located in the Value cell of the Configurations List grid when a file path type of configuration option is visible in the row with the button. This button will open the standard Windows open file window. |
| Set Value | Button | Sets the value in the change value field in the permissions group section. |
| Default Item | Button | Sets the selected permission to the default value. |

TABLE 2-continued

| Name | Type | Description |
|---|---|---|
| Default All | Buttons | Sets all permissions to the default value. Filtered by the Configuration Group drop down list selection. |
| Change Value | Field | This field is used to input the values for the Configurations. The value ranges are listed in the configuration List grid in the Range column. |
| Information | Field | This field will display a short explanation of the configuration item selected in the Configurations List grid. |

TABLE 3

| Name | Type | Description |
|---|---|---|
| OK | Button | Attempts the login. |
| Cancel | Button | Cancels the login attempt and closes the page. |
| Login ID | Field | Sets the login ID for the login attempt. |
| Password | Field | Sets the password for the login attempt. |

TABLE 4

| Name | Type | Description |
|---|---|---|
| Exit | Button | Closes the User Manager Page. |
| User List | Grid | Displays the following fields: |
| Name | Field | Displays full name of the user. |
| Login ID | Field | Displays the login ID of the user. |
| Can Login | Field | Indicates if the user's account has been disabled. |
| Sys Admin | Field | Indicates if the user has System Administrator privileges. |
| Custom ID | Field | Displays the custom ID of the user, if there is one. This field is to allow the system administrator to enter an employee ID from another application. The purpose is to permit "joins", on employee ID, between the application's data. |
| New user | Button | Opens the Create a New User page |
| Properties | Button | Opens the Edit User Login page |
| Permissions | Button | Opens the User Permissions page |
| Change Password | Button | Opens the Change Your Password page |
| Set Default Login Rules | Button | Opens the User Login Rules page. |

TABLE 5

| Name | Type | Description |
|---|---|---|
| Password Expires | Check Box | This check box will set the password to automatically expire, and force the user to create a new password. |
| User Can Not Reuse Password | Check Box | This check box will set the application to not allow passwords to be reused. |
| Logout After Idle Time Period | Check Box | This check box sets the application to automatically logoff the user after a period of idle time. A user will be required log back in or terminate the application. |
| Terminate Application | Check Box | This check box sets the application to terminate after a set number of failed login attempts. |
| Suspend Account on Termination | Check Box | This check box sets the application to suspend the account of the user who has surpassed the number of failed login attempts. |
| Log Login | Check Box | This check box sets the application to track logins via the audit report. |
| Log Logout | Check Box | This check box sets the application to track logouts via the audit report. |
| Log Each Failed Attempt | Check Box | This check box sets the application to track failed login attempts via the audit report. |
| Log Password | Check | This check box sets the application to track password |

TABLE 5-continued

| Name | Type | Description |
| --- | --- | --- |
| Change | Box | changes via the audit report. |
| After "x" Days | Numeric Field | Sets the number of days prior to requiring the user to change their password. |
| Max Idle "x" Min | Numeric Field | Sets the number of minutes until the system auto logs off the user. |
| After "x" Login Attempts | Numeric Field | Sets the number of failed logon attempts prior to terminating the application. |

TABLE 6

| Name | Type | Description |
| --- | --- | --- |
| Accept | Button | Accepts all changes and closes the page. |
| Cancel | Button | Cancels all changes and closes the page. |
| Employee ID | Field | Displays the unique ID number the system gives each user. This number is viewable only in the User properties page. The field is not user editable. |
| Login ID | Field | The login name the user is to be assigned. |
| Custom User ID | Field | This field is to allow the system administrator to enter an employee ID from another application. The purpose is to permit "joins", on employee ID, between the applications' data. |
| First Name | Field | The first name of the user. |
| Middle Initial | Field | The middle initial of the user. |
| Last Name | Field | The last name of the user. |
| Composite Name | Field | This will display the user's full name: "Last Name, First Name MI". This field is not user editable. |
| Password | Field | This field will display the entries as *. The password will have to be re-entered. |
| Re-enter Password | Field | This field also displays entries a *. If the two password entries do not match, an error message will be displayed. The user cannot be saved until the passwords match. |
| System Administrator | Check Box | This check box will grant system administrator access. If the check box is checked, the user will have system admin access. |
| Account Disabled | Check Box | This check box will disable the users account. If the box is checked the user will not be able to log into the application. |

TABLE 7

| Name | Type | Description |
| --- | --- | --- |
| Accept | Button | Accepts all changes and closes the page. |
| Cancel | Button | Cancels all changes and closes the page. |
| Permissions Group | Drop Down Selection | This drop down box contains the following selection options: |
| All | Selection | This selection option displays all of the permission described in the sections below: |
| Calibrations | Selection | This selection option contains the following options: Can Sign |
| Data Sheet | Selection | This selection option contains the following options: Can Approve |
| DS Design | Selection | This selection option contains the following options: Can Edit |
| Engineering | Selection | This selection option contains the following options: Edit MU Wizard |
| Change Value | Field | This field is used to input the values for the Permissions. The value ranges are listed in the Permissions Group section under the Range column. |
| Set Value | Button | Sets the value in the change value field to the value field in the permissions group section. |
| Default Item | Button | Sets the selected permission to the default value. |
| Default All | Buttons | Sets all permissions to the default value. |

TABLE 8

| Name | Type | Description |
| --- | --- | --- |
| Date Range | Drop Down Box | This has the following information:<br>This Month    Last Month<br>This Week     Last Week<br>This Quarter   Last Quarter<br>This Year      Last Year<br>Today          Yesterday |
| From | Drop Down Box | This drop down box opens the windows calendar box. |
| To | Drop Down Box | This drop down box opens the windows calendar box. |
| Sort 1 | Drop Down Box | The Sort boxes designate the sorting order of the report. The Sort 1 drop down box contains the following options:<br>[None]      File Name<br>Login ID    Application Name<br>Trans Type |
| Sort 2 | Drop Down Box | The Sort boxes designate the sorting order of the report. The Sort 2 drop down box contains the following options:<br>[None]      File Name<br>Login ID    Application Name<br>Trans Type |
| Sort 3 | Drop Down Box | The Sort boxes designate the sorting order of the report. The Sort 3 drop down box contains the following options:<br>[None]      File Name<br>Login ID    Application Name<br>Trans Type |
| Sort 4 | Drop Down Box | The Sort boxes designate the sorting order of the report. The Sort 4 drop down box contains the following options:<br>[None]      File Name<br>Login ID    Application Name<br>Trans Type |
| Show Preview | Check Box | This option allows the user to preview the report prior to printing. |
| Print Transaction ID | Check Box | This option allows the user to print the transaction ID's on the reports. |
| Selection Fields | Drop Down Box | This drop down box contains the interface features in Table.<br>Application   File Name<br>Login ID      Trans Type |
| Application | Selection | This selection option contains a dynamically generated list of applications, for filtering the reports. |
| Login IDs | Selection | This selection option a dynamically generated list of login IDs, for filtering the reports. |
| Files | Selection | This selection option contains a dynamically generated list of files, for filtering the reports. |
| Trans Type | Selection | This selection option contains a dynamically generated list of transaction types, for filtering the reports. |
| Clear Selections | Button | This button clears all filter selections. |
| Retrieve Settings | Button | This button allows the user to load pre-saved settings. |
| Save Settings | Button | This button allows the user to save setting to be loaded at a later date. |
| Print | Button | This button prints the report or displays the print preview. |
| Exit | Button | This button clears all changes and closes the page. |

TABLE 9

| Name | Type | Description |
| --- | --- | --- |
| Copy "A/L" Fields | Button | Copies the "As found" data to the "As left" field for all rows of all channels. |
| Print Cal Files | Button | Opens the Data Sheet Print Shop page to print all channels. |
| Save Cal Files | Button | Saves calibration data for all active channels |
| Set UUT Boilerplate | Button | Opens the UUT Boilerplate Setup page. |

TABLE 9-continued

| Name | Type | Description |
| --- | --- | --- |
| As Found | Radio Button | Sets the system to the collect "As found" data navigation mode. This option sets up navigation and data collection behaviors in the Calibration Process Manger that will automatically direct measurement data to the "As found" field of a data sheet row. This automatic navigation removes a lot of the tedium from data collection and automation scripting. |
| As Left | Radio Button | Sets the system to the collect "As left" data navigation mode. This option sets up navigation and data collection behaviors in the Calibration Process Manger that will automatically direct measurement data to the "As left" field of a data sheet row. This automatic navigation removes a lot of the tedium from data collection and automation scripting. |
| Active | Check Box | Opens the Channel display window. |
| Show Tolerance | Check Box | Displays the tolerance values in the data sheet tolerance column. |
| Show % of Tolerance | Check Box | Displays the percentage of tolerance consumed value in the data sheet tolerance column. |
| Timer | Indicator | The timer displays a count down for a wait period specified by a script command. |
| OLE | Indicator | Indicates when an OLE communication is occurring. |
| GPIB | Indicator | Indicates when a GPIB communication is occurring. |
| RS-232 | Indicator | Indicates when a RS-232 communication is occurring. |

TABLE 10

| Name | Type | Description |
| --- | --- | --- |
| Data Collection | Selection | This displays the main screen for calibration data collection. This is the primary mode used in the execution of calibrations and development of automation scripts for data sheets. |
| Data Sheet Designer | Selection | This mode is used to create, edit, and manage data sheets. It is also used to view and export historical calibration records |
| Statistics | Selection | This opens the Statistics page. This mode is used to view and analyze historical data collected with the Calibration Process Manager. |

TABLE 11

| Name | Type | Description |
| --- | --- | --- |
| Active | Check Box | Activates or deactivates the channel. If selected on an empty channel the UUT Boilerplate Setup page opens. |
| Unit Text Field | A/N | Identifies the Unit being tested on that particular channel. |
| As Found Text Field | A/N | Displays the values found during testing. |
| As Left Text Field | A/N | Displays the values left after testing. |
| Set UUT Boilerplate | Button | Opens the UUT Boilerplate Setup page. |
| Copy "A/L" Fields | Button | Copies the "As found" vales to the "As left" field. |
| Print Cal Files | Button | Opens the Data sheet Print Shop page. |
| Save Cal Files | Button | Saves the calibration. |
| Release the Channel | Button | This clears all information within the channel and closes |

TABLE 12

| Name | Type | Description |
| --- | --- | --- |
| Accept | Button | This button accepts the current criteria, and returns to the main page of the Calibration Process Manager. |
| Cancel | Button | This option cancels any changes made, or aborts opening of a new channel. Returns to the main page of the Calibration Process Manager. |
| Doc History | Button | This selection accesses the Document History page. (Button not present in Pro Remote or Standard versions.) |
| New Cal | Button | This clears the calibration information for the UUT. |
| Release Channel | Button | This clears all information within the channel and closes it. |
| Reset Boilerplate | Button | Resets Boilerplate information to the Data Sheet default. |
| Open Cal | Button | Opens the Calibration History Catalog page to load a previously saved calibration. Optionally, displays the standard MS Windows file open dialog to load a previously saved calibration |
| Save Cal | Button | This option opens the Sign Calibration Password window to save the calibration to the system database. Optionally, this option opens the discipline directory selection page to save the calibration as a file |
| Import Cal | Button | This option opens the Search page. |

TABLE 12-continued

| Name | Type | Description |
| --- | --- | --- |
| Export Cal | Button | This option allows the user to export the current calibration to a file. |
| Find Other Test Reports | Button | Opens the Calibration History Catalog page to view a listing of previously saved calibrations with the same Test Number. Optionally, opens the Calibration file search page to view a listing of previously saved calibrations with the same Test Number. |
| Asset No. | Field | This field is alphanumeric and allows the user to set a unique identifier for the UUT. |
| Test No. | Field | This field is numeric and allows the user to set the test number for the UUT. |
| Model: | Field | This field is alphanumeric and allows the user to set a unique model identifier for the UUT. |
| Manufacturer | Field | This field is alphanumeric and allows the user to set a unique manufacturer identifier for the UUT. |
| Description | Field | This field is alphanumeric and allows the user to set a unique description for the UUT. |
| Part | Field | This field is numeric. The user can use this field to denote which part of a multipart test report the channel is to be used for. |

TABLE 13

| Name | Type | Description |
| --- | --- | --- |
| Date Range | Group | This group consists of the following items: |
| Start Date | Field | This field allows the user to input the starting date for test point history retrieval. |
| End Date | Field | This field allows the user to input the ending date for test point history retrieval. |
| Test Point History | Group | This group contains the following items: |
| Load | Button | Loads the test point history for the asset or data sheet. |
| Analyze Drift | Button | This button opens the Drift Analyzer Interface page. |
| Do Report | Button | Creates a report showing a selected test point's Specification Tracking Instrument range usage as a "standard" in other calibrations. The report's primary purpose is to assist the "standards failure analysis" process. |
| This Asset | Radial Button | This option will allow the application to load only the test point history for the selected asset. |
| This Data Sheet | Radial Button | This option will allow the application to load the test point history for all calibrations that utilized the data sheet. |

TABLE 14

| Name | Type | Description |
| --- | --- | --- |
| Go | Button | Accepts parameters, and creates file. |
| Cancel | Button | Aborts the file creation, and closes page. |
| File Path | Field | Shows the file path to the directory, where the file will be created. |
| File Name | Field | This alphanumeric field allows the users to input a desired file name. |

TABLE 15

| Name | Type | Description |
| --- | --- | --- |
| OK | Button | Closes the page and loads the selected data sheet. |
| Cancel | Button | Closes the page. |
| Inactivate selected | | Data Sheet Approval privileges required. Inactivates the currently selected version of the data sheet. This is often used when a data sheet was created in error. Inactivating the last active version of a data sheet will prevent the data sheet from appearing in the data sheet catalog. A system or database administrator will be required to reactivate the data sheet. |
| Delete selected | | System Administrator privileges required. Delete the selected version of the data sheet. This is often used when a data sheet was approved in error. Deleting the last active version of a data sheet will prevent the data sheet from appearing in the data sheet catalog. A system database administrator will be required to reactivate the data sheet. |
| Search for | Field | Searches the database using the criteria entered and the search index selected. |
| Search Criteria | Drop Down List | Lists the available search criteria (Index). The selected item dictates the search type. |
| Data Sheet List | Grid | Lists data sheets and data sheet groups that match the search criteria |
| Group | Button | Enabled when a data sheet group is selected in the Data |

TABLE 15-continued

| Name | Type | Description |
| --- | --- | --- |
| Members | | Sheet List grid. Displays the Data Sheet Group Selector page to enable the user to select one of the member data sheets. |
| Specification Reference | Field | Displays the specification reference |
| Catalog Notes | Field | Displays the catalog notes |
| Cal Proc. | Field | Displays the calibration procedure |
| Att # | Field | Displays the calibration procedure attachment number |
| Author | Field | Displays the name of the author |
| Revision Editor | Field | Displays the name of the revision editor |
| Approved by | Field | Displays the name of the approver |
| Approved Date | Field | Displays the date approved |
| Model | Field | Displays the model number |
| Manufacturer | Field | Displays the manufacturer |
| Description | Field | Displays the equipment description |
| Permanent Unique Identifier (PUI) | Field | Displays the data sheet's Permanent Unique ID. This is a Guaranteed Unique ID (GUID). It is assigned to all versions of a document. |
| Dynamic Unique Identifier (DUI) | Field | Displays the data sheet's Dynamic Unique ID. This is a Guaranteed Unique ID (GUID). It identifies a specific version of a document. |
| Custom Spec | Check Box | Read only. Indicates if the data sheet is based on custom specifications (other than the manufactures specifications). |

TABLE 16

| Name | Type | Description |
| --- | --- | --- |
| Close | Button | Closes the page. |
| Approve as revision | Button | Data sheet approval privileges required. Approves the data sheet and saves it to the database as a revision of the active data sheet. All previous versions of the data sheet are marked inactive. |
| Approve as new data sheet | Button | Data sheet approval privileges required. Approves the data sheet and saves it to the database as a new data sheet. Use this option when an existing data sheet has been used as a template for another data sheet, importing a data sheet file, or no previous version exists. |
| Revision History | Grid | Displays all of the previous versions of the data sheet. |
| Specification Reference | Field | |
| Catalog Notes | Field | Displays the catalog notes |
| procedure | Field | Displays the calibration procedure |
| Att # | Field | Displays the calibration procedure attachment number |
| Author | Field | Displays the name of the author |
| Revision Editor | Field | Displays the name of the revision editor |
| Reactivate Selected | Button | System Administrator privileges required. Reactivate the selected version of the data sheet. Will cause all other versions to be inactivated. |
| Inactivate all | | System Administrator privileges required. Inactivate all versions of the data sheet. This is often used when a data sheet is removed from service. Inactivating the last active version of a data sheet will prevent the data sheet from appearing in the data sheet catalog. A database administrator will be required to reactivate the data sheet. |
| Delete selected | | System Administrator privileges required. Delete the selected version of the data sheet. This is often used when a data sheet was approved in error. The System Administrator must take great care not to delete a data sheet once used. Deleting the last active version of a data sheet will prevent the data sheet from appearing in the data sheet catalog. A database administrator will be required to reactivate the data sheet. |

TABLE 17

| Name | Type | Description |
|---|---|---|
| OK | Button | Use the selected data sheet and closes the page. |
| Cancel | Button | Cancels data sheet selection and closes the page. |
| Group Header | Section | |
| Author | Field | Author of the New Group. |
| Manufacturer | Field | The Equipment manufacturer |
| Revision Editor | Field | User Revising Existing Group. |
| Model Number | Field | Model of the UUT. |
| Description | Field | Description of the Group. |
| Procedure | Field | Calibration procedure associated with the group. |
| Cal Interval | Field | The calibration for the unit. |
| Spec Reference | Field | The specifications reference for the unit. |
| Catalog Notes | Field | Notes to assist the user in identifying the particular group or data sheet. |
| Group Members | Section | Applies to the selected member and displays information from the member data sheet's header. |
| Member List | Grid | Lists the data sheet members of the group |
| Cal Interval | Field | Displays the calibration interval |
| Specifications Reference | Field | Displays the Specification Reference |
| Catalog Notes | Field | Notes to assist the user in identifying the particular group or data sheet in the data sheet catalog. |
| Procedure | Field | Calibration procedure. |
| Att # | Field | Calibration procedure attachment number. |
| Author | Field | Data sheet author. |
| Revision Editor | Field | Data sheet reviser. |
| Approved by | Field | Approver. |
| Approved on | Field | Date approved. |
| Model | Field | Model number. |
| Manufacturer | Field | Equipment Manufacturer. |
| Description | Field | Equipment description. |
| Custom Specs | Check Box | Checked if Custom Specifications were used in the creation of the data sheet. |

TABLE 18

| Name | Type | Description |
|---|---|---|
| Approve Changes | Button | Accepts all changes and displays the Data Sheet Group Approval page. |
| Cancel | Button | Cancels all changes and closes the page. |
| Group Header | Section | |
| Author | Field | Author of the New Group. |
| Manufacturer | Field | The Equipment manufacturer |
| Revision Editor | Field | User Revising Existing Group. |
| Model Number | Field | Model of the UUT. |
| Description | Field | Description of the Group. |
| Procedure | Field | Calibration procedure for the Group. |
| Cal Interval | Field | The calibration for the Group. |
| Spec Reference | Field | The specifications reference for the Group. |
| Catalog Notes | Field | Notes to assist the user in identifying the particular group or data sheet in the data sheet catalog. |
| Group Members | Section | Applies to the selected member and displays information from the member data sheet's header. |
| Member List | Grid | Lists the data sheet members of the group |
| Insert member Above Selected Row | Button | Inserts a new member into the member list. |
| Delete Selected member | Button | Deletes the selected member. |
| Move member Up | Button | Moves the selected member up in the member list. |
| Move member Down | Button | Moves the selected member down in the member list. |
| Cal Interval | Field | Displays the calibration interval |
| Specifications Reference | Field | Displays the Specification Reference |
| Catalog Notes | Field | Catalog notes. |
| Procedure | Field | Calibration procedure. |
| Att # | Field | Calibration procedure attachment number. |
| Author | Field | Data sheet author. |
| Revision Editor | Field | Data sheet reviser. |
| Approved by | Field | Approver. |
| Approved on | Field | Date approved. |
| Model | Field | Model number. |
| Manufacturer | Field | Equipment Manufacturer. |
| Description | Field | Equipment description. |
| Custom Specs | Check Box | Checked if Custom Specifications were used in the creation of the data sheet. |

TABLE 19

| Name | Type | Description |
|---|---|---|
| Close | Button | Closes the page. |
| Approve as revision | Button | Data sheet approval privileges required. Approves the data sheet group and saves it to the database as a revision of the active data sheet group. All previous versions of the data sheet group are marked inactive. |
| Approve as new data sheet | Button | Data sheet approval privileges required. Approves the data sheet group and saves it to the database as a new data sheet group. Use this option when an existing data sheet group has been used as a template for another data sheet group or no previous version exists. |
| Revision History | Grid | Displays all of the previous versions of the data sheet group. |
| Specification Reference | Field | Displays the specification reference for the data sheet group. |
| Catalog Notes | Field | Displays the catalog notes for the data sheet group. |
| procedure | Field | Displays the calibration procedure for the data sheet group. |
| Att # | Field | Displays the calibration procedure attachment number for the data sheet group. |
| Author | Field | Displays the name of the author of the data sheet group. |
| Revision Editor | Field | Displays the name of the revision editor of the data sheet group. |
| Reactivate Selected | Button | System Administrator privileges required. Reactivate the selected version of the data sheet group. Will cause all other versions to be inactivated. |

TABLE 19-continued

| Name | Type | Description |
| --- | --- | --- |
| Inactivate all | | System Administrator privileges required. Inactivate all versions of the data sheet group. This is often used when a data sheet group is removed from service. Inactivating the last active version of a data sheet group will prevent the data sheet group from appearing in the data sheet catalog. A database administrator will be required to reactivate the data sheet group. |
| Delete selected | | System Administrator privileges required. Delete the selected version of the data sheet group. This is often used when a data sheet group was approved in error. Deleting the last active version of a data sheet group will prevent the data sheet group from appearing in the data sheet catalog. A database administrator will be required to reactivate the data sheet group. |

TABLE 20

| Name | Type | Description |
| --- | --- | --- |
| OK | Button | Closes the page and loads the selected calibration. |
| Cancel | Button | Closes the page. |
| Inactivate selected | | Data Sheet Approval privileges required. Inactivates the currently selected version of the calibration. This is often used when a calibration was created in error. Inactivating the last active version of a calibration will prevent the calibration from appearing in the calibration history catalog. A system or database administrator will be required to reactivate the calibration. |
| Delete selected | | System Administrator privileges required. Delete the selected version of the calibration. This is often used when a calibration was approved in error. Deleting the last active version of a calibration will prevent the calibration from appearing in the calibration history catalog. A system database administrator will be required to reactivate the calibration. |
| Search for | Field | Searches the data base using the criteria entered and the search index selected. |
| Search Criteria | Drop Down List | Lists the available search criteria (Index). The selected item dictates the search type. |
| Specification Reference | Field | Displays the specification reference |
| Catalog Notes | Field | Displays the catalog notes |
| Cal Proc. | Field | Displays the calibration procedure |
| Att # | Field | Displays the calibration procedure attachment number |
| Author | Field | Displays the name of the author |
| Revision Editor | Field | Displays the name of the revision editor |
| Approved by | Field | Displays the name of the approver |
| Approved Date | Field | Displays the date approved |
| Model | Field | Displays the model number |
| Manufacturer | Field | Displays the manufacturer |
| Description | Field | Displays the equipment description |
| Permanent Unique Identifier (PUI) | Field | Displays the calibration's Permanent Unique ID. This is a Guaranteed Unique ID (GUID). It is assigned to all versions of a document. |

TABLE 20-continued

| Name | Type | Description |
|---|---|---|
| Dynamic Unique Identifier (DUI) | Field | Displays the calibration's Dynamic Unique ID. This is a Guaranteed Unique ID (GUID). It identifies a specific version of a document. |
| Custom Spec | Check Box | Read only. Indicates if the data sheet is based on custom specifications (other than the manufactures specifications). |

TABLE 21

| Name | Type | Description |
|---|---|---|
| Search | Button | This will search for the test number indicated in the Test Number Field. |
| Manual Search | Button | This will open the standard Windows Open File page. |
| Accept | Button | Accepts inputted values. |
| Cancel | Button | Clears and closes Enter the Following Values Page. |
| Test Number field | A/N | Allows the user to search for specific test numbers. |
| Select File Field | A/N | Displays the list of files found. |

TABLE 22

| Name | Type | Description |
|---|---|---|
| Close | Button | Closes the page. |
| OK | Button | Calibration signature privileges required. Signs the calibration, saves it to the database, and closes the page. |
| Cancel | Button | Cancels the operation and closes the page. |
| Enter your login ID | Field | Sets the user login. |
| Enter your password | Field | Sets the user password. |

TABLE 23

| Name | Type | Description |
|---|---|---|
| Print Now | Button | Prints the data sheet with the selected options. |
| Printer Options | Button | Opens the standard Windows Print Setup page. |
| Cancel | Button | Clears and closes the page. |
| Data Sheet | Check Box | If this box is not selected, no print options are available and the only active button is Cancel. |
| Specifications | Check Box | Includes the specifications in the data sheet printout. (not enabled in the current version of software). This feature will be available in a future version. |
| All Pages | Radio Button | Allows all pages to be printed. |
| Pages | Radio Button | Allows a user specified page range to be printed. This button activates the "Pages From" and the "Pages To" numeric fields. |
| Automatic | Radio Button | Adds pages to the start and end of the numbering sequence base on the Boiler Plate options. |
| Leave Blank | Radio Button | Leaves the page numbers off of the printouts. |
| Modify Now | Radio Button | Allows the user to over ride the Boiler Plate options. This button activates the "Add n Pages to Front", and the "Add n Pages to Back" numeric fields. |
| Pages From | Numeric | Determines the number to start printing at. This is only available when the Pages radio box is selected. |
| Pages To | Numeric | Determines the number to stop printing at. This is only available when the Pages radio box is selected. |
| Add n Pages to Front | Numeric | Adds the selected amount of pages at the beginning of the printout. This is only available when the Modify Now radio box is selected. |
| Add n Pages to Back | Numeric | Adds the selected amount of pages at the end of the printout. This is only available when the Modify Now radio box is selected. |
| Print n Copies | Numeric | Sets the number of copies to be printed. |

TABLE 24

| Name | Type | Description |
| --- | --- | --- |
| Close | Button | Closes the page. |
| Revision History | Grid | Displays all of the previous versions of the data sheet. |
| Specification Reference | Field | Displays the specification reference for the instrument. |
| Catalog Notes | Field | Displays the catalog notes |
| procedure | Field | Displays the calibration procedure |
| Att # | Field | Displays the calibration procedure attachment number |
| Author | Field | Displays the name of the author |
| Revision Editor | Field | Displays the name of the revision editor |

TABLE 25

| Name | Type | Description |
| --- | --- | --- |
| O.K. | Button | Accepts inputted values. |
| Cancel | Button | Clears and closes the page. |
| Search | Button | Opens the standard windows search dialogue. |
| Edit Remarks | Button | Opens the Remarks Editor. |
| Configure | Button | Allows for the selection of special data sheet operation commands (directives). |
| TAR | Check Box | This includes the TAR information in the Tolerance colunm. |
| Measurement Uncertainty | Check Box | This includes the Measurement Uncertainty information in the Tolerance column. |
| Custom Specifications | Check Box | Indicates that the specifications for the unit are non-standard specs. |
| Asset No. | A/N | The ID number for the unit under test. |
| Test Number | A/N | The test identification number |
| Manufacturer | A/N | The manufacturer of the unit under test. |
| Model Number | A/N | The model number of the unit under test. |
| Description | A/N | A brief description of the unit under test. |
| Attachment No. | A/N | The number of attachments to the data sheet. |
| Cal Proc | A/N | Name of calibration procedure. |
| Cal Interval | A/N | Displays the calibration interval for the unit under test. |
| Spec Reference | A/N | Displays a list of the specifications used. |
| Catalog Notes | A/N | Additional information to aid in the selection of an appropriate data sheet. |
| Add to Front | Numeric | Adds the number of pages to the front of the data sheet printout. |
| Add to Back | Numeric | Adds the number of pages to the end of the data sheet printout. |

TABLE 26

| Name | Type | Description |
| --- | --- | --- |
| Accept | Button | Accepts inputted values. |
| Cancel | Button | Clears and closes the page. |
| Global | Button | Setting a remark to Global will cause it to print on each page of the printed data sheet. If a remark is not global, it will only be printed if it's corresponding Remark Marker appears in the tolerance column of the printed page. |
| Remarks | A/N | This field is where the user inputs their comments. |
| Remark Marker | Symbol | The symbol next to the global button indicates the marker used to indicate the comment. (i.e. *, **, ***). This symbol is placed in tolerance column of a data sheet row. |

TABLE 27

| Name | Type | Description |
| --- | --- | --- |
| % of I.V. | Check Box | Sets specification to include % of I.V. |
| % of F.S. | Check Box | Sets specification to include % of F.S. |
| Floor (Fixed Value relative to the units of measure) | Check Box | Sets specifications to include a Floor value. |

TABLE 27-continued

| Name | Type | Description |
| --- | --- | --- |
| ± dB | Check Box | Sets specifications to ± dB. This check box excludes all other check boxes. |
| Custom | Check Box | Sets specifications to include a custom specification calculator. (Professional and Pro Remote versions only) |
| Nom Value | Numeric | Nominal value for specification. |
| Units of Measure | A/N | Units of measure and additional parameters. |
| Nominal Value Wizard | Button | Displays the Nominal Value Wizard to assist in the selection of appropriate units of measure and formatting. |
| x % of I.V. | Numeric | When the ppm check box is selected this becomes I.V. ppm. This is only available when the % of I.V. check box is selected. |
| F.S. Val | Numeric | This is only available when the % of F.S. check box is selected. |
| % of F.S. | Numeric | When the ppm check box is selected this becomes F.S. ppm. This is only available when the % of F.S. check box is selected. |
| Floor Val | Numeric | This is only available when the Floor (Fixed Value) check box is selected. |
| ± dB of I.V. | Numeric | This only available when the ± dB check box is selected. |
| Db Type | Drop Down Box | This only available when the ± dB check box is selected. Contains the following options: Volt/Amp: Log20 based calculation Power: Log10 based calculation |
| Open Calculation | Button | This allows the use of a custom calculator. The Custom Calculator List is displayed to allow the user to select a custom calculator. (Professional and Pro Remote versions only) |
| Custom Calculation | Field | Displays the name of the Custom Calculator in use. (Professional and Pro Remote versions only) |
| Asymmetrical Tol | Check Box | Limits the Selection Specification Types to: % of I.V., % of F.S., and Floor (Fixed Value). Also allows entry of separate specifications for the high and low tolerances. |
| Multiple Test Point | Check Box | Allows for the creation of a series of test points based on the currently entered specifications. It opens the Test Point List. |
| As % of | Numeric | This list is only available when the Multiple Test Point check box is selected. This value is the base value for percentages entered in the Test Point List. |
| Test Point List | Grid | This list is only available when the Multiple Test Point check box is selected. This list contains percentages of the base value entered in the "As % of" field. The result of each is the creation of a data sheet row for each value entered. The nominal test point value is the derived as the percentage of the "AS % of" field. |
| Lo to High | Radio Button | This sets the tolerance format to indicate low and high tolerance values. (No operand selection is available with this choice.) |
| n Units | Radio Button | This sets the tolerance format to indicate [operand] n [units of measure]. |
| n % | Radio Button | This sets the tolerance format to indicate [operand] n [%]. |
| n ppm | Radio Button | This sets the tolerance format to indicate [operand] n [ppm]. |
| Opperand | Drop Down Box | This drop down box contains the following symbols: ±, >, >=, <, <=, and =. |
| Decimals | Numeric | This numerical box only accepts entries of one to nine decimal digits. |
| Calculate | Button | This button will prompt the user for any required custom calculator values, calculate the tolerance, format numeric values, prompt the user for a "function tested" and "step number". Then insert a new data sheet row. Prior to the currently selected row. |
| Recalc | Button | This button will prompt the user for any required custom calculator values, calculate the tolerance, format numeric values, prompt the user for a "function tested" and "step number". Then update the currently selected data sheet row. This button is disabled when the Multiple Test Point check box is selected. |

TABLE 27-continued

| Name | Type | Description |
|---|---|---|
| Test Point Definitions | Drop Down Box | This is a drop down box contains a list of test point wizards. This list is created by selecting the menu option Tools, Wizards, Test Point Definitions, Load. Selecting one of these wizards will configure the calculator. |

TABLE 28

| Name | Type | Description |
|---|---|---|
| OK | Button | Accepts inputted values and closes the page. |
| Cancel | Button | Closes the page and aborts the new line creation. |
| Procedure Step No | Field | Sets the text to be displayed in the data sheet row's Step Num cell. |
| Function Tested | Field | Sets the text to be displayed in the data sheet row's Function Tested cell. |

TABLE 29

| Name | Type | Description |
|---|---|---|
| Accept | Button | Accepts edited values. |
| Cancel | Button | Cancels edits and closes the page. |
| Units by symbol | Button | Displays the Units of Measure by Symbol page to allow the user to select a unit using a symbol search. |
| Units Groups | Grid | Lists all available units of measure groups. |
| Units of measure | Grid | Lists all available units of measure for the group currently selected in the Units Groups grid. |
| Parameters | Grid | Lists parametric data used in the Nominal Value. The first item listed is considered the primary parameter and is the quantitative reference for the nominal value. Other parameters listed are used as additional selection criteria used to assign Specification Tracking instrument ranges. |
| Update from Unit | Button | Replace the unit of measure in the selected row of the Parameters grid with the unit from the selected row of the Units of Measure grid. |
| Add Param | Button | Appends a new parameter into the Parameters grid using the unit from the selected row of the Units of Measure grid. |
| Delete | Button | Deletes the selected parameter from the Parameters grid. |
| Set Nominal Value | Field | Sets the value of the currently selected parameter. |
| Source Nominal | A/N | Shows the original content of the data sheet row's nominal value cell. |
| Data Component | A/N | Shows the parametric data component of the nominal value text. |
| Trailing Text | Field | Sets the text that will be displayed at the end of the nominal value text. Trailing text is used for documentation purposes only. It is has no parametric role. |
| Composite Result | A/N | Shows the fully constructed content for the data sheet row's nominal value text. |

TABLE 30

| Name | Type | Description |
|---|---|---|
| Accept | Button | Accepts edited values. |
| Cancel | Button | Cancels edits and closes the page. |
| TAR | Section | Sets the status of Test Accuracy Ration (TAR) printing in the data sheet column and the value to be used. |
| TAR | Drop Down List | Sets the status of TAR printing in the data sheet column. Has the following options: Use Boiler Plate (Inclusion is determined by the TAR check box setting in the Master Boiler Plate.) Included (The TAR will be printed.) Not Included (The TAR will not be printed.) |
| Boilerplate | Field | Indicates the setting of the TAR check box in the Master Boiler Plate. |
| Auto . . . : 1 | Field | Indicates the automatically determined TAR. This field will be left blank if the application is unable to calculate a TAR. |
| User Declared | Field | Sets the TAR to be printed. While this value is stored with the data sheet, it is used for printing purposes only. The value will not be used by statistical analysis software. Only |

TABLE 30-continued

| Name | Type | Description |
| --- | --- | --- |
| | | the internally calculated value can occupy the requisite database field. |
| EMU | Section | Sets the status of Estimated Measurement Uncertainty (EMU) printing in the data sheet column and the value to be used. |
| EMU | Drop Down List | Sets the status of EMU printing in the data sheet column. Has the following options: Use Boiler Plate (Inclusion is determined by the EMU check box setting in the Master Boiler Plate). Included (The TAR will be printed). Not Included (The TAR will not be printed). |
| Boilerplate | Field | Indicates the setting of the EMU check box in the Master Boiler Plate. |
| Auto. . . % | Field | Indicates the automatically determined EMU as a percentage of the nominal value. This field will be left blank if the application is unable to calculate an EMU %. |
| Auto. . . U of M | Field | Indicates the automatically determined EMU in units of measure. This field will be left blank if the application is unable to calculate an EMU in units of measure. |
| User Declared | Field | Sets the EMU to be printed. When entering data into this field include any applicable symbols, such as "%", "mV", "m", etc. While this value is stored with the data sheet, it is used for printing purposes only. The value will not be used by statistical analysis software. Only the internally calculated value can occupy the requisite database field. |
| Remark Flag | Drop Down List | Select a symbol that corresponds to the desired remark from the Master Boiler Plate. |
| Tolerance Info | Field | Displays the actual tolerance component of the data sheet row's Tolerance cell. |
| Auto Data | Field | Displays the automatically generated component of the data sheet row's Tolerance cell. |
| Trailing Text | Field | Sets the user inserted text that will be displayed within the Tolerance cell text. Trailing text is used for documentation purposes only. It is has no systemic role. |
| Composite Result | Field | Shows the fully constructed content for the data sheet row's Tolerance cell text. |

TABLE 31

| Name | Type | Description |
| --- | --- | --- |
| Accept | Button | Places the selected symbol on the windows clipboard and close the form. |
| Cancel | Button | Closes the page. |
| Unit of measure list | Grid | Lists the available units of measure. |
| Find Symbol | Field | Searches the Unit of Measure list for symbol values entered. |

TABLE 32

| Name | Type | Description |
| --- | --- | --- |
| OK | Button | Accepts inputted values. |
| Cancel | Button | Clears and closes the page. |
| Fetch Wizards | Button | Displays the wizards contained in the listed files, from the selected folder. |
| Drive | Drop Down Box | Lists the drives and network drives available to the system. |
| Folder | A/N | Shows the folder tree for the selected folder. |
| Files | A/N | Shows the wizard files in the selected folder. |
| Select a Wizard to Load | Grid | Shows wizards in the selected directory's files. This grid is updated when the user clicks on the Fetch Wizard button. |

TABLE 33

| Name | Type | Description |
| --- | --- | --- |
| Create new macro list | Button | Creates a new list, clearing all unsaved data. This button will be followed by a confirmation page requiring the user to choose yes or no to continue. |
| Open Macro List | Button | This button opens the standard Windows open file dialogue box. |
| Save This Macro List | Button | This button opens the standard Windows save file dialogue box. |
| Boiler Plate | Button | This button opens the Calibration Process Manager Boiler Plate Data page. |
| Insert a Test Point Before This One | Button | Inserts a new test point into the list before the selected test point. |
| Add Test Point | Button | Adds a new test point to the end of the list. |

TABLE 33-continued

| Name | Type | Description |
| --- | --- | --- |
| To The End | | |
| Delete This Test Point | Button | Deletes the currently selected test point. |
| Clear All Test Points | Button | Clears all test points. |
| Accept Changes to This Test Point | Button | Accepts all inputted data. |
| Undo the Changes to the Test Point | Button | Clears all edits. |
| Exit | Button | Closes the page. |
| Lo to High | Radio Button | Sets the test point calculations to a "lo to high" value calculation. |
| +/− n Units | Radio Button | Sets the test point calculations +/− n units where n is the variable number. |
| +/− n % | Radio Button | Sets the test point calculations +/− n percentage where n is the variable number. |
| +/− n ppm | Radio Button | Sets the test point calculations +/− n parts per million where n is the variable number. |
| Multiple Test Points | Check Box | This opens the Test Point List frame. |
| ppm | Check Box | Sets the appropriate "% of" values to a ppm value. |
| ± (% IV) | Tab | This selection allows for data entry in the following fields: Nom. Val. Units of Measure % of I.V. |
| ± (% IV + % FS) | Tab | This selection allows for data entry in the following fields: Nom. Val Units of Measure % of I.V. FS Val. % of F.S. |
| ± (% IV + Floor) | Tab | This selection allows for data entry in the following fields: Nom. Val. Units of Measure % of I.V. Floor |
| ± (% IV + % FS + Floor)) | Tab | This selection allows for data entry in the following fields: Nom. Val. Units of Measure % of I.V. FS Val. % of F.S. Floor Val |
| ± (% FS) | Tab | This selection allows for data entry in the following fields: Nom. Val. Units of Measure FS Val. % of F.S. |
| ± (% FS + Floor) | Tab | This selection allows for data entry in the following fields: Nom. Val. Units of Measure FS Val. % of F.S. Floor |
| ± (Floor) | Tab | This selection allows for data entry in the following fields: Nom. Val. Units of Measure Floor |
| Wizard Title | A/N | Title of wizard as set by the user. |
| Created By | A/N | Name of user creating wizard. |
| Description | A/N | Description of wizard and function. |
| Test point Title | A/N | Definition of test point. |
| Step Num | A/N | Content for Step Number cell of test points created with the wizard. |
| Function Tested | A/N | Content for Function Tested cell of test points created with the wizard. |
| Nom. Val | Numeric | The nominal value for the test point. |
| Units of Measure | Numeric | The units of measure for the test point. |
| % of I.V. | Numeric | The acceptable percentage of the indicated value. |
| FS Val | Numeric | The full scale value. |
| % of F.S. | Numeric | The acceptable percentage range of the full scale value. |
| Floor Val | Numeric | The floor error value. |
| Fixed Decimal | Numeric | The number of decimal places. |
| As % of | A/N | Sets the variable for the multiple test points. |
| Test Point List | A/N | Shows a list of the multiple test points. |

TABLE 34

| Name | Type | Description |
| --- | --- | --- |
| O.K. create the data sheet | Button | Creates the data set specified and asks the user if another data set is to be added. If another data set is to |

TABLE 34-continued

| Name | Type | Description |
|---|---|---|
| | | be added, the user is returned to the module to specify the next data set. |
| No more data sets | Button | If at least one data set was created: Opens the Calibration Process Manager Boiler Plate Data page. If no data sets were created: Clears information and closes the page. |
| Gauge Type | Drop Down Box | This contains the following gauge selections: Simple Gauge, Compound Gauge, Vacuum Gauge, Atmospheric Ref. Gauge, and Barometer. |
| Analog | Button | Applies rules relative to analog gauges. Only one of the Analog or Digital buttons may be selected at one time. |
| Digital | Button | Applies rules relative to digital gauges. Only one of the Analog or Digital buttons may be selected at one time. |
| View Test Points | Button | Creates and displays the test point information in the text field to the right. |
| Top Scale Units | Drop Down Box | This drop down box contains units of measure options to the selected gauge type. In Professional and Pro Remote versions the units list is dynamically generated from the system's units of measure list. In Standard Version the units list is fixed and may contain any of the following units, as applicable: Psig, mmHg, kPa, psid, Mbar, psia, InH20, bar, mHga, InHg, Pa, inHga |
| Scale Bottom | Numeric | The lowest scale value. |
| Full Scale | Numeric | The highest scale value. |
| % Full Scale | Numeric | The percentage of full value. |
| % I.V. | Numeric | The percentage of input value. |
| Floor Value (unit) | Numeric | The unit in the parentheses reflects the chosen Top Scale Unit. |
| Ref Temp | Numeric | Only available when inH20, inHg, or mmHg units are selected. |
| Max Test Point Value | Numeric | Only available for vacuum gauge. |
| Use % Span | Check Box | This option sets the module to use a percentage of the gauges span (top and bottom scales combined) in place of the normal percentage of full scale for each scale. Applies when the Compound gauge option is selected. This option requires the module to cross reference the scales' units of measure in real time to perform span and scale calculations. Unfortunately, this makes the feature unavailable to the Standard version |
| Calculate Span | Button | Calculates the span of the gauge using the Full Scale value of each scale and their associated units of measure. The span is resolved to the top scale's units of measure. The button is only visible when the Use % Span option is Checked. (Unavailable in the Standard version) |
| Span | Field | The span of a compound gauge, resolved to the top scale's units of measure. The field is only visible when the Use % Span option is Checked. (Unavailable in the Standard version) |
| % of Span | Field | The percentage of span to be applied to the tolerance calculation, of each scale, of a compound gauge. Once the percentage of Span is calculated for the top scale units of measure, the value will be converted to each scale's units of measure. The field is only visible when the Use % Span option is Checked. (Unavailable in the Standard version) |
| No. of Decimals | Numeric | Displays the number of decimal places. |
| Calculator | Button | Calculates the number of points |
| Step No. | A/N | Displays the identification number of the step. |
| Increasing | Check Box | Creates increasing results values. |
| Decreasing | Check Box | Creates decreasing result values |
| Function tested | A/N | Identification for the tested function. |

TABLE 35

| Name | Type | Description |
|---|---|---|
| Accept | Button | Accepts edits to the uncertainty model and closes the page. |
| Cancel | Button | Ignores edits to the uncertainty model and closes the page. |

TABLE 35-continued

| Name | Type | Description |
|---|---|---|
| Use system Default | Check Box | When checked, the Calibration Process Manager will completely manage the uncertainty model. When unchecked, the user assumes responsibility for the uncertainty model. |
| Copy Wizard | Button | Places the contents of the measurement uncertainty model into a special measurement uncertainty model clipboard. The clipboard contents will persist until the button is pressed again. |
| Paste Wizard | Button | Replaces the contents of the measurement uncertainty model with the contents of the measurement uncertainty model clipboard. |
| Type A | Section | This section of the page displays and manages the type A uncertainty elements. |
| Uncertainty Elements | Grid | Displays the uncertainty elements in the model (all values are displayed in k = 1 terms. |
| Add | Button | Adds an uncertainty element and displays the Uncertainty Element Editor page. |
| Delete | Button | Deletes the currently selected uncertainty element. |
| Edit | Button | Displays the Uncertainty Element Editor page. |
| Up | Button | Moves the currently selected uncertainty element up one row in the Uncertainty Elements grid. |
| Down | Button | Moves the currently selected uncertainty element down one row in the Uncertainty Elements grid. |
| Type B | Section | This section of the page displays and manages the type B uncertainty elements. |
| Uncertainty Elements | Grid | Displays the uncertainty elements in the model (all values are displayed in k = 1 terms. Items automatically managed by Calibration Process Manager are displayed in blue. |
| Add | Button | Adds an uncertainty element and displays the Uncertainty Element Editor page. |
| Delete | Button | Deletes the currently selected uncertainty element. |
| Edit | Button | Displays the Uncertainty Element Editor page. |
| Up | Button | Moves the currently selected uncertainty element up one row in the Uncertainty Elements grid. |
| Down | Button | Moves the currently selected uncertainty element down one row in the Uncertainty Elements grid. |
| Auto Include Standards Uncertainty | Check Box | When checked, the Calibration Process Manager will automatically insert an element that represents each Specification Tracking instrument range assigned to the test point. As standards are substituted, added, or deleted, the entries will be updated automatically. If this option is turned off, the user must make sure that standards information is kept current. |
| Auto Include Resolution Uncertainty | Check Box | When Checked, the Calibration Process Manager will automatically insert an element that represents the resolution of the test point in terms of the unit of measure. |
| Value | A/N | Indicates the Calibration Process Manager's perception of the test point resolution. |
| Override | Check Box | The limitation of the automatic resolution detection system is that one count at the resolution indicated by the data sheet row's Nominal Value cell's primary parameter is assumed to be the resolution. If more than one count is applicable, the Override check box must be checked and the correct resolution must be entered into the Override Value text box. |
| Override Value | Field | This field is only visible when the Override Check Box is checked. Sets the actual resolution that should be used in the measurement uncertainty model. The override value will be used if the override check box is checked. |
| k = | Field | Sets the coverage factor for the measurement uncertainty calculation. |
| EMU = | A/N | Displays the calculated Estimated Measurement Uncertainty. |

TABLE 36

| Name | Type | Description |
| --- | --- | --- |
| Accept | Button | Accepts inputted values and closes the page. |
| Cancel | Button | Ignores edits and closes the page. |
| Fetch Wizard | Button | Imports all wizards from the selected folder. |
| Description | Field | Sets the display name of the uncertainty element. |
| Sense Coeff. | Field | Sets the sensitivity coefficient of the uncertainty element. |
| Value (k = 1) | Field | The uncertainty contribution of the element expressed in k = 1 terms relative to the unit of measure. |
| Include Element in TAR Calculations | Check Box | When Checked, the uncertainty element is included in TAR calculations. |

TABLE 37

| Mode | Application |
| --- | --- |
| "Myself" | UUT Self definition |
| "Def Stds" | Default standards determined during data sheet design |
| "Stds Used" | Standards used in an actual calibration |

TABLE 38

| Name | Type | Description |
| --- | --- | --- |
| Stds Used | Button | Switches the Specification Tracking Instruments Interface to the Standards used mode. |
| Def Std | Button | Switches the Specification Tracking Instruments Interface to the Default Standard mode. |
| Myself | Button | Switches the Specification Tracking Instruments Interface to the Myself mode. |
| This TP | Button | Instructs the Nominal Value decoder to reset the synch parameters for the selected test point. |
| All TP's | Button | Instructs the Nominal Value decoder to reset the synch parameters for all the test points. |
| Instruments | Section | All items in this section are data sheet in scope. |
| Instrument List | Grid | Displays all instruments assigned to the data sheet and loaded into memory |
| Add | Button | This button opens the Instrument Specifications Catalog. |
| Remove | Button | Removes the selected instrument from the list. |
| Replace with Selected | Button | Replaces the selected instrument with another instrument. The desired instrument must already be on the list. |
| Auto Assign | Button | Auto assigns instrument ranges to the data sheet's rows. |
| Instrument Ranges | Section | All items in this section are test point (data sheet row) in scope. The currently selected test point to be exact. |
| Instrument Range List | Grid | Displays all instrument ranges assigned to a test point. |
| Auto Assign to TP | Button | Auto assigns instrument ranges to the currently selected test point in the data sheet. |
| Manual Assign to TP | Button | Allows the user to manually assign instrument ranges to the selected test point. |
| Remove from TP | Button | Allows the user to remove assigned instrument ranges from the selected test point. |
| Instrument Synch Parameters | Grid | Displays the parametric criteria used to automatically select standards and determine if the Calibration Process Manger can perform calculations based on instrument ranges assigned. If a parametric match is not achieved with assigned instrument ranges, no calculations will be performed using the Specification Tracking instrument range specifications. |
| UUT Acc | Field | Displays the accuracy of the UUT. Available only when test point specifications are present. |
| Std Acc | Field | Displays the accuracy of the assigned instrument range/s. Available only when test point specifications are present, at least one instrument range is assigned to the test point, and parametric synchronization is achieved. |

TABLE 39

| Name | Type | Description |
| --- | --- | --- |
| Stds Used | Button | Switches the Specification Tracking Instruments Interface to the Standards used mode. |
| DefStd | Button | Switches the Specification Tracking Instruments Interface to the Default Standards mode. |
| Myself | Button | Switches the Specification Tracking Instruments Interface to the Myself mode. |
| This TP | Button | Resets the synch parameters for the selected test point. |
| All TP's | Button | Resets the synch parameters for all the test points. |
| Instruments | Section | All items in this section are data sheet in scope. |
| Instrument List | Grid | Displays all instruments assigned to the data sheet and loaded into memory |
| Add | Button | This button opens the Instrument Specifications Catalog. |
| Remove | Button | Removes the selected instrument from the list. |
| Replace with Selected | Button | Replaces the selected instrument with another instrument. The desired instrument must already be on the list. |
| Auto Assign | Button | Auto assigns instrument ranges to the data sheet's rows. |
| Set "Used" as "Default" | Button | Copies instrument and range assignments from the Standards Used configuration and duplicates them in the Default Standards configuration. |
| Instrument Ranges | Section | All items in this section are test point (data sheet row) in scope. The currently selected test point to be exact. |
| Instrument Range List | Grid | Displays all instrument ranges assigned to a test point. |
| Auto Assign to TP | Button | Auto assigns instrument ranges to all the currently selected test point in the data sheet. |
| Manual Assign to TP | Button | Allows the user to manually assign instrument ranges to the selected test point. |
| Remove from TP | Button | Allows the user to remove assigned instrument ranges from selected test point. |
| Instrument Synch Parameters | Grid | Displays the parametric criteria used to automatically select standards and determine if the Calibration Process Manger can perform calculations based on instrument ranges assigned. If a parametric match is not achieved with assigned instrument ranges, no calculations will be performed using the instrument ranges. |
| UUT Acc | Field | Displays the accuracy of the UUT. Available only when test point specifications are present. |
| Std Acc | Field | Displays the accuracy of the assigned instrument range/s. Available only when test point specifications are present, at least one instrument range is assigned to the test point, and parametric synchronization is achieved. |
| TAR | Field | Displays the Test Accuracy Ratio (TAR). TAR's may be calculated using the simple method of comparing the accuracy ratios or utilizing the measurement uncertainty in the calculation. This option is set in the master setup of the Calibration Process manger. Available only when test point specifications are present, at least one instrument range is assigned to the test point, and parametric synchronization is achieved. |
| EMU | Field | Displays the Estimated Measurement Uncertainty (EMU). Available only when test point specifications are present, at least one instrument range is assigned to the test point, and parametric synchronization is achieved. |

TABLE 40

| Name | Type | Description |
| --- | --- | --- |
| Stds Used | Button | Switches the Specification Tracking Instruments Interface to the Standards used mode. |
| Def Std | Button | Switches the Specification Tracking Instruments Interface to the Default Standards mode. |
| Myself | Button | Switches the Specification Tracking Instruments Interface to the Myself mode. |
| Asset ID's | Button | This button opens the Set Instrument Asset ID's page. |

TABLE 40-continued

| Name | Type | Description |
| --- | --- | --- |
| This TP | Button | Resets the synch parameters for the selected test point. |
| All TP's | Button | Resets the synch parameters for all the test points. |
| Instruments | Section | All items in this section are data sheet in scope. |
| Instrument List | Grid | Displays all instruments assigned to the data sheet and loaded into memory |
| Add | Button | This button opens the Instrument Specifications Catalog. |
| Remove | Button | Removes the selected instrument from the list. |
| Replace with Selected | Button | Replaces the selected instrument with another instrument. The desired instrument must already be on the list. |
| Auto Assign | Button | Auto assigns instrument ranges to the data sheet's rows. |
| Use "Default" Stds | Button | Copies instrument and range assignments from the Default Standards configuration and duplicates them in the Standards Used configuration. The user must still set the asset ID numbers for the actual standards used. |
| Instrument Ranges | Section | All items in this section are test point (data sheet row) in scope. The currently selected test point to be exact. |
| Instrument Range List | Grid | Displays all instrument ranges assigned to a test point. |
| Auto Assign to TP | Button | Auto assigns instrument ranges to all the currently selected test point in the data sheet. |
| Manual Assign to TP | Button | Allows the user to manually assign instrument ranges to the selected test point. |
| Remove from TP | Button | Allows the user to remove assigned instrument ranges from selected test point. |
| Instrument Synch Parameters | Grid | Displays the parametric criteria used to automatically select standards and determine if the Calibration Process Manger can perform calculations based on instrument ranges assigned. If a parametric match is not achieved with assigned instrument ranges, no calculations will be performed using the instrument ranges. |
| UUT Acc | Field | Displays the accuracy of the UUT. Available only when test point specifications are present. |
| Std Acc | Field | Displays the accuracy of the assigned instrument range/s. Available only when test point specifications are present, at least one instrument range is assigned to the test point, and parametric synchronization is achieved. |
| TAR | Field | Displays the Test Accuracy Ratio (TAR). TAR's may be calculated using the simple method of comparing the accuracy ratios or utilizing the measurement uncertainty in the calculation. This option is set in the master setup of the Calibration Process manger. Available only when test point specifications are present, at least one instrument range is assigned to the test point, and parametric synchronization is achieved. |
| EMU | Field | Displays the Estimated Measurement Uncertainty (EMU). Available only when test point specifications are present, at least one instrument range is assigned to the test point, and parametric synchronization is achieved. |

TABLE 41

| Mode | Indicator | Information conveyed |
| --- | --- | --- |
| "Myself" | None | Calibration Processor does not anticipate an instrument range assignment to this test point. This condition exists when no test point specifications are available or no Standards Synchronization parameters are available. |
| | (Silver square) | Calibration Processor anticipates an instrument range assignment to this test point, but has not received one. This |

TABLE 41-continued

| Mode | Indicator | Information conveyed |
|---|---|---|
| | (Green square) | condition exists when test point specifications are available and Standards Synchronization parameters are available. An instrument range is assigned and the test point and instrument range's calculated accuracies do agree within 0.1% of each other. |
| | (Red square) | An instrument range is assigned, but the test point and instrument range's calculated accuracies do not a ee within 0.1% of each other or Calibration Process Manger is unable to perform calculations using the data. |
| "Def Stds" and "Stds Used" | None | Calibration Processor does not anticipate an instrument range assignment to this test point. This condition exists when no test point specifications are available or no Standards Synchronization parameters are available. |
| | (Silver) | Calibration Processor anticipates an instrument range assignment to this test point, but has not received one. This condition exists when test point specifications are available and Standards Synchronization parameters are available. |
| | (Green) | An instrument range is assigned and the test resulting test accuracy ration is >=4:1. |
| | (Red) | An instrument range is assigned, but the test accuracy ratio is <4:1. |
| | (Fuchsia) | An instrument range was manually assigned to the test point that the Calibration Process Manager can not use, but will store with the data sheet, as directed by the user. This condition exists when test point specifications are not available, Standards Synchronization parameters are not available, or Standards Synchronization parameters do not directly match the instrument range selected. This condition will most often occur when an instrument range is manually selected and is not a direct parametric match with the test point. As of this version, the Calibration Processor is not able to divine accuracy information from a combination of standards that indirectly comprise a parametric match with the test point. i.e.: The test point is measuring Ohms and a voltage source and current shunt are selected as standards. The manual assignments should still be made to facilitate instrument range utilization reporting and statistics, but the user is on his own for TAR and EMU calculations. |

TABLE 42

| Name | Type | Description |
|---|---|---|
| OK | Button | Accepts all changes and closes the page. |
| Cancel | Button | Cancels all changes and closes the page. |
| Search For | Field | Allows the user to input specific search criteria. |
| Test No (Exact Match) | Radial Button | Searches the catalog by test number. |
| Asset No (Exact Match) | Radial Button | Searches the catalog by asset number. |
| Description (contains) | Radial Button | Searches the catalog by description. |
| Author (contains) | Radial Button | Searches the catalog by author. |
| Revision | Field | Displays the revision number of the file in the catalog. |
| Manufacturer | Field | Displays the manufacturer of the unit for the file in the catalog. |
| Model | Field | Displays the model number of the file in the catalog. |
| Description | Field | Displays the description of the unit for the file in the catalog. |
| Revision | Field | Displays the revision number. |
| Manufacturer | Field | Displays the equipment manufacturer. |
| Model | Field | This field displays model number. |
| Description | Field | This field displays the equipment description. |
| Specifications Reference | Field | Displays the specifications referenced in the selected item. |
| Author | Field | Displays the author. |
| Verified by | Field | Displays the user who verified the specifications. |
| Approved by | Field | Displays the name of the use who approved the instrument. |
| Data Approved | Field | Displays the date approved. |

TABLE 43

| Name | Type | Description |
|---|---|---|
| Accept | Button | Accepts all changes and closes the page. |
| Cancel | Button | Cancels all changes and closes the page. |
| Assign all applicable standards | Radio Button | This selection will allow the application to assign all standards that are applicable to the UUT to the data sheet. |
| Assign only the selected standards | Radio Button | This selection will allow the application to assign only the selected standards to the UUT to the data sheet. |

TABLE 44

| Name | Type | Description |
|---|---|---|
| + | Button | Adds an instrument to the list |
| − | Button | Removes an instrument from the list |
| Use Range | Button | Assigns the selected range to the test point. |
| Remove Range | Button | Removes selected range assignment from the test point. |
| Exit | Button | Closes the page. |
| Show Only Ranges That Match All Critical Criteria | Check Box | Filters the display to only show ranges that fit the instrument range search criteria, as determined by the data sheet's Nominal Value column contents. |
| Instruments | Field | Displays the available instruments |
| Functions | Field | Displays the functions of the selected instrument. |
| Ranges | Field | Displays the Ranges of the selected instrument function. |
| Range Detail | Field | Gives details of the selected range. |
| Composite Selection of Standards For This Test Point | Field | Displays each of the instrument ranges assigned to the test point. |
| Standards Search Criteria | Field | Displays the instrument range search criteria, as determined by the data sheet's Nominal Value column contents. |
| Function | Field | Displays the function of the chosen instrument. |
| Nominal | Field | Displays the test point's nominal value. |
| TP Accuracy | Field | Displays the UUT's test point accuracy. |
| Accuracy (RSS) | Field | Displays the composite accuracy of the assigned instruments relative to the test point's nominal value. This value is calculated using the Root Sum Squared (RSS) method. |

TABLE 45

| Name | Type | Description |
|---|---|---|
| Accept | Button | Removes the currently selected instrument's range assignments from all data sheet test point rows, assigns ranges from the instrument selected in the Substitutes grid, and closes the page. |
| Cancel | Button | Cancels the operation and closes the page. |
| Replace | Field | The instrument to be replaced. |
| With (Substitutes) | Grid | List of instruments available to act as a substitute for the instrument to be replaced. |

TABLE 46

| Name | Type | Description |
|---|---|---|
| Accept | Button | Accepts changes, and closes the screen. |
| Cancel | Button | Cancels all changes, and closes the screen. |
| Standards | Grid | List of standards currently assigned to the calibration. |
| Accept Asset No | Button | Accepts the inputted asset number. |
| Undo Asset No | Button | Undo the changed asset number. This cannot be undone once the Accept Asset No button is clicked. |
| Asset No | Field | This field allows the user to assign an asset number to each of the standards used in the calibration. |

TABLE 47

| Name | Type | Description |
|---|---|---|
| Execute Command | Button | Runs the selected command. |
| Append New Command to the End of the List | Button | Inserts a new command at the end of the command list. Opens the Automation Command Editor page. |
| Insert a New Command Before the Selected Row | Button | Inserts a new command before the specified row in the command list. Opens Automation Command Editor Page. |
| Delete Selected command/s | Button | Deletes the selected command/s. |
| Edit the Selected Command | Button | Opens the Automation Command Editor Page. |
| Move Command Up | Button | Moves the selected command up in the command list. |
| Move Command Down | Button | Moves the selected command down in the command list. |
| Copy Selected Commands | Button | Copies all selected commands to the clipboard. |
| Append Copied | Button | Pastes the copied commands to the end of the |

TABLE 47-continued

| Name | Type | Description |
|---|---|---|
| Commands to the End of the List | | command list. |
| Insert Copied Commands Before the Selected Command | Button | Pastes the copied commands before the selected command. |
| View Command Clipboard | Button | Loads the ATE Clipboard Viewer. |
| Command List | A/N | listing of commands assigned to the currently selected data sheet row. |

TABLE 48

| Name | Type | Description |
|---|---|---|
| Command | Drop Down Box | Lists all available commands and is used to select a command. |
| Group | Drop Down Box | Lists all of the available groups and is used to associate a group with the selected command. |
| Use Command Wizard | Button | Displays the wizard applicable to the selected command. The button is only enabled for commands that have a command wizard. |
| Command Group Editor | Button | Displays the Command Group Editor page. |
| Accept | Button | Accepts the current command configuration. |
| Cancel | Button | Clears and closes the page. |
| Copy Var Name | Button | Copies the selected variable's name onto the Windows clipboard for pasting into command parameters. |
| Move Variable Up | Button | Moves the selected variable up in the list. |
| Move Variable Down | Button | Moves the selected variable down in the list. |
| Add Variable | Button | Adds a new variable. |
| Delete Variable | Button | Deletes the selected variable. |
| User Defined Variable Editor | Button | Opens the User Defined Variable page. |

TABLE 48-continued

| Name | Type | Description |
|---|---|---|
| Name | A/N | Name of the Variable. |
| Value | A/N | Value of the Variable. |

TABLE 49

| Name | Type | Description |
|---|---|---|
| Accept | Button | Accepts the edits to the variable and closes the form. |
| Cancel | Button | Cancels the edits to the variable and closes the form. |
| Variable Name | Field | The Name given to the user defined variable. This name must be unique and is used to identify the variable in script commands, equations, etc. There is no restriction on the name of a variable. It is recommended that the variable name represent it's utilization to make the script easily readable. |
| Default Value | Field | The default value assigned to the variable. The value may be text or numeric. It is the responsibility of the script author to ensure that the content of a variable is applicable to its intended use. |

TABLE 50

| Name | Type | Description |
|---|---|---|
| Move Group Up | Button | Moves the selected group up in the group list. |
| Move Group Down | Button | Moves the selected group down in the group list. |
| Insert a New Group | Button | Inserts a new group into the command list. |
| Delete the Selected Group | Button | Deletes the selected group. |
| Edit Group Name | Button | This button opens the Group Editor Panel. |
| Add the Group to My List | Button | Adds the currently selected command group to the data sheet group list. |
| Accept | Button | Accepts all changes to the command group. This button is only available when the Edit Group button is selected. |
| Clear | Button | Clears all changes to the command group. This button is only available when the Edit Group button is selected. |
| Close | Button | Closes the Command Group Editor page. |
| Menu Key | Numeric | Displays the command menu key that executes the command group. |
| Group Name | Text | Displays the name of the command group. |
| Keypad Exec (0-9) | Field | This field allows the user to change or set the command menu key for the selected command group. This field is only available when the Edit Group button is selected. |

TABLE 50-continued

| Name | Type | Description |
|---|---|---|
| Command Groups | Selections | Lists the available command groups in the System Group List: |
| Configure | Group | This item is an Interface Group template (Not a system Directive.) |
| Energize | Group | This item is an Interface Group template (Not a system Directive.) |
| De-Energize | Group | This item is an Interface Group template (Not a system Directive.) |
| Execute Step | Group | This item is an Interface Group template (Not a system Directive.) |
| Measure | Group | This item is an Interface Group template (Not a system Directive.) |
| Join all Groups | Group | This item is a System Group: Directs the script system to execute command members regardless of which command group was selected from the command menu. |

TABLE 51

| Name | Type | Description |
|---|---|---|
| Cancel | Button | Cancels command selection and closes the page. |
| Command Names [multiple] | Field | Lists the name of the Command to execute. The command name is the name of Interface Group it represents. |
| Command Key [multiple] | Button | Clicking on this button or pressing the key displayed on the button will execute the associated group of commands. |

TABLE 52

| Name | Type | Description |
|---|---|---|
| Instruction | Drop Down List | The name of the currently selected calibration instruction. Any of the data sheet's calibration instructions can be selected from the list. |
| Figure No. [1-5] | Field | The figure number to be displayed on the Graphical Instruction Viewer's tabs. |
| Image [1-5] | Drop Down List | The name of the image selected or blank if not in use. Any of the data sheet's binary resource images can be selected from the list. |
| Show Image [1-5] | Button | Clicking on one of these buttons will cause the image to be displayed in the Image Viewer box. |
| Image Viewer | Image Box | Clicking on one of the Show Image buttons will cause the image to be displayed. |
| Edit Instructions | Button | Opens the Calibration Instruction Editor page. |
| Edit Binary List | Button | Opens the Binary Resources List page. |
| Accept | Button | Accepts edits, and closes the page. |
| Cancel | Button | Clears edits, and closes the page. |

TABLE 53

| Name | Type | Description |
|---|---|---|
| Resource Name | Grid | A list of the data sheet's binary resource files. The size of the resource's memory utilization is also shown. |
| Image Viewer | Image Box | Clicking on an image in the Resource Name grid will cause the image to be displayed. |
| Add New Resource | Button | Opens the Binary Resource Editor page. |
| Remove Resource | Button | Removes the selected resource file from the list. |
| Edit Resource | Button | Opens the Binary Resource Editor page. |
| Combined Resource Size | Field | Shows the combined memory utilization of all binary resources |
| Close | Button | Closes the page. |

TABLE 54

| Name | Type | Description |
|---|---|---|
| Name | Field | Edit the name of the binary resource. This name is used to reference this specific resource on the list. There is no restriction on the name, but it should be unique within the binary resource list. |
| Item Type | Field | Indicates the Calibration Process Manager's perception of the resource. As of this version, only items of type "Image" can be added to the resource list. |

TABLE 54-continued

| Name | Type | Description |
| --- | --- | --- |
| Source File | Field | The name of the file that the resource was created from. This name will be included in the file name when the resource is exported to a file, via data sheet export: [data sheet file name] + "_(" + [source file name] + ")." + [source file extension] |
| File Date | Field | The file date of the file that the resource was created from. |
| Size | Field | Displays the memory utilization of the resource item. |
| Load Image | Button | Displays the windows image dialog to select an image file that will be the source of the binary resource. |
| Accept | Button | Accepts edits, and closes the page. |
| Cancel | Button | Clears edits, and closes the page. |

TABLE 55

| Name | Type | Description |
| --- | --- | --- |
| Accept | Button | Accepts inputted values and closes the page. |
| Cancel | Button | Ignores edits and closes the page. |
| Caption [1-10] | A/N | Required field (when the row is in use). This is where the user sets the caption title for the variable. |
| Default Value [1-10] | A/N | Displays the value of the variable. |
| Tail [1-10] | A/N | A short caption displayed to the right of the default value i.e. (%, ppm, mv, etc.). |
| Target Variable [1-10] | Drop Down Box | Required Field (when the row is in use). Lists the options of all user defined variables. |

TABLE 56

| Name | Type | Description |
| --- | --- | --- |
| Accept these command parameters | Button | Accepts edits to the command parameters, Closes the form, and returns to the Command Editor form. |
| Cancel | Button | Ignores edits to the command parameters, Closes the form, and returns to the Command Editor form. |
| GPIB Reset | Button | Clears the GPIB interface. |
| Send Command | Button | Sends a test command to the GPIB interface. |
| Fetch Command | Button | Sends a test command from the GPIB interface and reads the response. |
| >Direct Response< | A/N | Indicates the response received from the fetch operation. |
| Cut Left | Numeric | The number of characters to remove from the response string. An entry of −1 indicates no characters are removed. |
| Keep Left | Numeric | The number of characters to retain after the "cut left". An entry of −1 indicates all characters are retained. |
| Decimals | Numeric | This option forces the numeric format to use the listed number of decimal places. |
| GPIB Address | A/N | 1-31 |
| Rcv Buffer Size | Numeric | Max number of characters to Receive. When in doubt set this to 100. |
| Exponent | Drop Down Box | Selects the desired exponential format of the result. |
| Formatted Results String | Numeric | The results from the entered data. |
| Resulting Numeric Value | Numeric | The results from the entered data. |
| Continuous Run | Check Box | When this check box is selected the machine will continually run the fetch command option. |

TABLE 57

| Name | Type | Description |
| --- | --- | --- |
| Accept these command parameters | Button | Accepts edits to the command parameters, Closes the form, and returns to the Command Editor form. |
| Cancel | Button | Ignores edits to the command parameters, Closes the form, and returns to the Command Editor form. |
| Send Command | Button | Sends a command. |
| Fetch Command | Button | Sends a command and displays the returned value. |
| Configure Port | Button | Opens the Com Port Setup page. |
| >Direct Response< | A/N | Indicates the response received from the fetch operation. |
| Cut Left | Numeric | The number of characters to remove from the response string. An entry of −1 indicates no characters are removed. |
| Keep Left | Numeric | The number of characters to retain after the "cut left". An entry of −1 indicates all characters are retained. |

TABLE 57-continued

| Name | Type | Description |
|---|---|---|
| Decimals | Numeric | This option forces the numeric format to use the listed number of decimal places. |
| Exponent | Drop Down Box | Selects the desired exponential format of the result. |
| Formatted Results String | Numeric | The results from the entered data. |
| Resulting Numeric Value | Numeric | The results from the entered data. |
| Continuous Run | Check Box | When this check box is selected the machine will continually run the fetch command option until halted by the user. |

TABLE 58

| Name | Type | Description |
|---|---|---|
| View the Instructions | Button | Displays the text of a calibration instruction. |
| Exit Calibration Instructions | Button | Closes the ATE Clipboard Viewer. |
| Calibration Instructions | List | Displays the title of the calibration instructions used by the copied commands. |
| User Defined Variable List | Grid | This group contains the following fields: |
| Name | Field | Lists the name of the individual user defined variable. |
| Value | Field | Displays the value currently stored in the user defined variable. |
| Command Groups | Grid | This group has the following fields: |
| Key | Field | Displays the key pad selector key for the group. |
| Group Name | Field | Displays the group name. |
| Commands | List | Lists the commands currently copied to the clipboard. |

TABLE 59

| Name | Type | Description |
|---|---|---|
| Open Equation | Button | This button allows the user to open a saved equation file. |
| Save Equation | Button | This button allows the user to save an equation. |
| Copy Function to Clipboard | Button | Copies the selected function to the clipboard. |
| Copy Variable to Clipboard | Button | Copies the selected variable to the clipboard. |
| Variables | Grid | A list of available variables. |
| Variable Up | Button | Moves the variable up in the list. |
| Variable Down | Button | Moves the variable down in the list. |
| Add Variable | Button | Adds a new variable to the list. |
| Remove Variable | Button | Deletes the variable from the list. |
| Edit Variable | Button | Opens the equation variable editor page. |
| Execute Equation | Button | Runs the current variable. |
| OK | Button | Accepts changes and closes the page. |
| Equation File | Field | Displays the path to the file. |
| Prototype | Field | Displays the parametric requirements of the selected function. |
| Description | Field | Describes the selected function. |
| Set Value | Field | This field allows the user to set the numeric values for the variables. |
| Equation | Field | Displays the equation. |
| Result | Field | Displays the result of the executed equation. |
| Auto insert functions and variables into equation on "dbl click" | Check Box | This check box allows the user to insert selected variables and functions simply by double clicking the mouse on them. |
| Include prototype on auto insert. | Check Box | This check box allows the application to include all prototype data on auto inserts. |
| Functions | Selection Field | This field has a plurality of mathematical functions. |

TABLE 60

| Name | Type | Description |
|---|---|---|
| Load Calculator | Button | Loads a previously saved Custom Calculator. |
| Save Calculator | Button | Saves a Custom Calculator. |
| "user prompt" Up | Button | Moves the selected "user prompt" up in the command list. |
| "user prompt" Down | Button | Moves the selected "user prompt" down in the command list. |
| Edit the user query list | Button | Opens the Enter the User Query Setup page. |
| Variable Up | Button | Moves the selected variable up in the variable list. |
| Variable Down | Button | Moves the selected variable down in the variable list. |
| Add Variable | Button | Opens the Equation Variable Editor page. |
| Delete Variable | Button | Deletes the selected variable |
| Edit Variable | Button | Opens the Equation Variable Editor page.. |
| Use as Equation Target | Button | Sets equation variable as the target variable. |
| Equation Up | Button | Moves the selected equation up in the equation list. |
| Equation Down | Button | Moves the selected equation down in the equation list. |
| Add Equation | Button | Opens the Equation Editor page. |
| Delete Equation | Button | Deletes the selected equation. |
| Edit Equation | Button | Opens the Equation Editor page. |
| Exec All | Button | Executes a test of the custom calculators function. |
| Use as Equation Target | Button | Sets the currently selected Variable to be the target variable for the custom equation. Note: the "Sys_Result" system variable is always the target of the last equation executed. This is the return value of the custom calculator. |
| Exit | Button | Clears and closes the Custom Calculator Workshop page. Only available when running from the "tools" menu. |
| Calculator Name | A/N | The name given to the custom calculator by the creating user. |
| Author | A/N | The name of the user who creates the custom calculator. |
| Version | A/N | The version of the custom calculator as determined by the user. |
| Calculator User Queries | A/N | Displays user query prompts that will take place during calculation execution. |
| System Variables | A/N | Displays the fixed (System) variables. These variables can be used in equations, but are read only. They include: Sys_Result: Return value of the Custom Calculator. Sys_Nominal: The Absolute value of the Nominal Value Sys_NominalSign: 1 if the nominal value was positive and −1 if the nominal value was negative. Note: The Calibration Process Manager's tolerance calculator uses all absolute values to calculate tolerances. The original sign of the nominal value is restored when calculations are completed. The Sys_Nominal variable value is also made absolute in custom calculators to make them easier to design for use with the tolerance calculator. If sign is relevant to your custom calculation, use: (Sys_Nominal * Sys_NominalSign) to restore sign to the nominal value. |
| Variables | A/N | Displays the variables as set in the Equation Editor. |
| Equations | A/N | Displays the equations as set in the Equation Editor. |
| Nominal Value | Numeric | This number is used to test the custom calculators function. |
| Results | Numeric | Displays the result of the custom calculator test. Note: The result of a custom calculator must be relative to the nominal value's unit of measure when used with the Calibration Process Manger's integrated tolerance calculator. The value must also be absolute. |
| Accept | Button | Accepts edits to the calculator and closes the workshop. Only available when editing one of the custom calculators assigned to the data sheet. |
| Cancel | Button | Cancels edits to the calculator and closes the workshop. Only available when editing one of the custom calculators assigned to the data sheet. |

TABLE 61

| Name | Type | Description |
|---|---|---|
| Accept | Button | Accepts inputted values. |
| Cancel | Button | Clears and closes Enter the Following Values page. |
| Caption | A/N | Required field. This is where the user sets the caption title for the variable. |
| Default Value | A/N | Displays the value of the variable. |
| Tail | A/N | A short caption displayed to the right of the default value i.e. (%, ppm, mv, etc.). |
| Target Variable | Drop Down Box | Lists the options of all system and user defined variables. This is a required field. |

TABLE 62

| Name | Type | Description |
|---|---|---|
| GPIB Reset | Button | Clears the GPIB interface. |
| Send Command | Button | Sends a test command to the GPIB interface. |
| Fetch Command | Button | Sends a test command from the GPIB interface and reads the response. |
| >Direct Response< | A/N | Indicates the response received from the fetch operation. |
| Cut Left | Numeric | The number of characters to remove from the response string. An entry of −1 indicates no characters are removed. |
| Keep Left | Numeric | The number of characters to retain after the "cut left". An entry of −1 indicates all characters are retained. |
| Decimals | Numeric | This option forces the numeric format to use the listed number of decimal places. |
| GPIB Address | A/N | 1-31 |
| Rcv Buffer Size | Numeric | Max number of characters to Receive. When in doubt use 100. |
| Exponents | Drop Down Box | Selects the desired exponential format of the result. |
| Formatted Results String | Numeric | The results from the entered data. |
| Resulting Numeric Value | Numeric | The results from the entered data. |
| Continuous Run | Check Box | When this check box is selected the machine will continually run the fetch command option. |

TABLE 63

| Name | Type | Description |
|---|---|---|
| Send Command | Button | Sends a command. |
| Fetch Command | Button | Sends a command and displays the returned value. |
| Configure Port | Button | Opens the Com Port Setup page. |
| >Direct Response< | A/N | Indicates the response received from the fetch operation. |
| Cut Left | Numeric | The number of characters to remove from the response string. An entry of −1 indicates no characters are removed. |
| Keep Left | Numeric | The number of characters to retain after the "cut left". An entry of −1 indicates all characters are retained. |
| Decimals | Numeric | This option forces the numeric format to use the listed number of decimal places. |
| Exponents | Drop Down Box | Selects the desired exponential format of the result. for a list of valid values. |
| Formatted Results String | Numeric | The results from the entered data. |
| Resulting Numeric Value | Numeric | The results from the entered data. |
| Continuous Run | Check Box | When this check box is selected the machine will continually run the fetch command option until halted by the user. |

TABLE 64

| | | |
|---|---|---|
| μVDC Range | VAC Range | mA DC Range |
| mVDC Range | μOhm Range | A DC Range |
| VDC Range | mOhm Range | μA AC Range |
| VDC Linearity | kOhm Range | mA AC Range |
| mVAC Range | MOhm Range | |
| mVAC Range | μA DC Range | |

What is claimed is:

1. A system for calibration process management of one or more than one unit under test (UUT), each UUT being an instance of a UUT equipment type, comprising:

a first computer readable medium for storing one or more first data objects representing calibration data from the one or more than one UUT;

a second computer readable medium for storing a first globally unique identifier in an association relationship to one of the one or more first data objects;

a third computer readable medium for storing one or more second data objects representing a reference standard for the UUT equipment class;

a fourth computer readable medium for storing a second globally unique identifier in an association relationship to one of the one or more second data objects;

a calibration management control program embodied on a fifth computer-readable medium for calibration of the one or more than one UUT, the calibration management control program in communication with the first data objects, second data objects, first globally unique identifier and second globally unique identifier, wherein the calibration management control program permits contemporaneous calibration of more than one UUT; and an application program interface embodied on a sixth computer-readable medium for execution on a computer in conjunction with the calibration management control program, wherein the application program interface program is configured for contemporaneous calibration of more than one UUT.

2. The system of claim 1 wherein the application program interface comprises a user interface and each UUT is an instance of the same UUT equipment type.

3. A system for calibration process management of one or more than one unit under test (UUT), each UUT being an instance of a UUT equipment type, comprising:

a first computer readable medium for storing one or more first data objects representing calibration data from the one or more than one UUT;

a second computer readable medium for storing a first globally unique identifier in an association relationship to one of the one or more first data objects;

a third computer readable medium for storing one or more second data objects representing a reference standard for the UUT equipment class;

a fourth computer readable medium for storing a second globally unique identifier in an association relationship to one of the one or more second data objects;

a calibration management control program embodied on a fifth computer-readable medium for calibration of the one or more than one UUT, the calibration management control program in communication with the first data objects, second data objects, first globally unique identifier and second globally unique identifier; and an application program interface embodied on a sixth computer-readable medium for execution on a computer in conjunction with the calibration management control program, wherein the application program interface is configured to receive identification of the UUT equipment type, and a value as found for a specific calibration function, and display tolerance limits for the UUT based upon the UUT equipment type.

4. The system of claim 3, where the application program interface comprises a user interface.

5. The system of claim 4, further comprising means for displaying a test accuracy ratio and an estimated measurement uncertainty.

6. The system of claim 3, wherein the interface is further configured to receive an asset number for the UUT, and a value as left for the specific calibration function.

7. The system of claim 6, further comprising means for indicating whether the value as found or the value as left is within the tolerance limits.

* * * * *